US008432438B2

(12) United States Patent
Ryan et al.

(10) Patent No.: US 8,432,438 B2
(45) Date of Patent: Apr. 30, 2013

(54) DEVICE FOR DIMMING A BEACON LIGHT SOURCE USED IN A LIGHT BASED POSITIONING SYSTEM

(75) Inventors: Daniel Ryan, North Andover, MA (US); Aaron Ganick, Medford, MA (US)

(73) Assignee: ByteLight, Inc., Boston, MA (US)

( * ) Notice: Subject to any disclaimer, the term of this patent is extended or adjusted under 35 U.S.C. 154(b) by 0 days.

(21) Appl. No.: 13/526,812

(22) Filed: Jun. 19, 2012

(65) Prior Publication Data

US 2013/0026942 A1 Jan. 31, 2013

Related U.S. Application Data

(63) Continuation-in-part of application No. 13/446,520, filed on Apr. 13, 2012, which is a continuation of application No. 13/369,147, filed on Feb. 8, 2012, and a continuation of application No. 13/369,144, filed on Feb. 8, 2012, and a continuation of application No. 13/422,580, filed on Mar. 16, 2012, now Pat. No. 8, 248,467, and a continuation of application No. 13/422, 591, filed on Mar. 16, 2012, and a continuation of application No. 13/435,448, filed on Mar. 30, 2012, and a continuation of application No. 13/445,019, filed on Apr. 12, 2012, and a continuation-in-part of application No. 13/446,506, filed on Apr. 13, 2012.

(60) Provisional application No. 61/635,413, filed on Apr. 19, 2012, provisional application No. 61/639,428, filed on Apr. 27, 2012, provisional application No. 61/567,484, filed on Dec. 6, 2011, provisional application No. 61/511,589, filed on Jul. 26, 2011.

(51) Int. Cl.
*H04N 7/18* (2006.01)
*H03K 7/08* (2006.01)

(52) U.S. Cl.
USPC ............................................ 348/61; 332/109

(58) Field of Classification Search .................... 348/61, 348/116, 308, 113; 340/331, 13.24, 332, 340/310.01, 310.03, 338; 315/324, 362, 315/294, 302, 317, 312, 315, 360; 332/109
See application file for complete search history.

(56) References Cited

U.S. PATENT DOCUMENTS

| | | | |
|---|---|---|---|
| 6,198,230 | B1 | 3/2001 | Leeb et al. |
| 6,400,482 | B1 | 6/2002 | Lupton et al. |

(Continued)

FOREIGN PATENT DOCUMENTS

| | | | |
|---|---|---|---|
| JP | 2008224536 | A | 9/2008 |
| KR | 20080022298 | A | 3/2008 |
| WO | WO-2011064332 | A1 | 6/2011 |

OTHER PUBLICATIONS

[Video] Davis, C. "VLC D-Light LED Networking Takes on Wifi and GPS," <http://www.slashgear.com/vlc-d-light-led-networking-takes-on-wifi-and-gps-video-08170160/>.

(Continued)

*Primary Examiner* — Behrooz Senfi
(74) *Attorney, Agent, or Firm* — Wilmer Cutler Pickering Hale & Dorr LLP.

(57) ABSTRACT

In one aspect, the present disclosure relates to a dimmable beacon light source for a light based positioning system. In some embodiments, the light source includes a dimmer control switch configured to generate a dimmer signal having a desired light output level, a dimmable driver for controlling the light output of the light source, and a modulator for receiving the dimmer signal from the dimmer control switch, generating a digital pulse recognition signal by controlling the frequency of the dimmer signal to a desired frequency value, and transmitting the digital pulse recognition signal to the dimmable driver to drive the light output of the light source. In some embodiments, the digital pulse recognition signal is a pulse width modulated signal. In some embodiments, the digital pulse recognition signal has a duty cycle based on the dimmer signal.

22 Claims, 43 Drawing Sheets

U.S. PATENT DOCUMENTS

| | | | |
|---|---|---|---|
| 6,426,599 | B1 | 7/2002 | Leeb |
| 6,504,633 | B1 | 1/2003 | Hovorka et al. |
| 6,548,967 | B1 | 4/2003 | Dowling et al. |
| 6,590,687 | B1 | 7/2003 | Olsen |
| 6,614,126 | B1 | 9/2003 | Mitchell |
| 6,701,092 | B2 | 3/2004 | Doucet et al. |
| 6,794,831 | B2 | 9/2004 | Leeb et al. |
| 6,865,347 | B2 | 3/2005 | Perkins et al. |
| 6,954,591 | B2 | 10/2005 | Lupton et al. |
| 6,985,744 | B2 | 1/2006 | Katagishi et al. |
| 7,016,115 | B1 | 3/2006 | Leeb et al. |
| 7,309,965 | B2 | 12/2007 | Dowling et al. |
| 7,352,972 | B2 | 4/2008 | Franklin |
| 7,415,212 | B2 | 8/2008 | Matsushita et al. |
| 7,583,901 | B2 | 9/2009 | Nakagawa et al. |
| 7,683,954 | B2 | 3/2010 | Ichikawa et al. |
| 7,724,301 | B2 | 5/2010 | Alakarhu |
| 7,738,884 | B2 | 6/2010 | Cheung et al. |
| 7,796,780 | B2 | 9/2010 | Lipton et al. |
| 7,969,297 | B2 | 6/2011 | Haartsen et al. |
| 7,970,537 | B2 | 6/2011 | Ann et al. |
| 7,973,819 | B2 | 7/2011 | Shimada |
| 8,107,825 | B2 | 1/2012 | Rajagopal et al. |
| 2004/0204848 | A1 | 10/2004 | Matsuo et al. |
| 2005/0177423 | A1 | 8/2005 | Swanson |
| 2005/0232642 | A1 | 10/2005 | Egner et al. |
| 2006/0045311 | A1 | 3/2006 | Shibuya |
| 2006/0119287 | A1 * | 6/2006 | Campbell et al. ............. 315/291 |
| 2007/0254694 | A1 | 11/2007 | Nakagawa et al. |
| 2007/0275750 | A1 | 11/2007 | Nakagawa |
| 2008/0028013 | A1 | 1/2008 | Kamegawa et al. |
| 2008/0077326 | A1 | 3/2008 | Funk et al. |
| 2008/0205477 | A1 | 8/2008 | Hama et al. |
| 2009/0026978 | A1 | 1/2009 | Robinson |
| 2009/0045955 | A1 | 2/2009 | Ulrich |
| 2009/0085500 | A1 | 4/2009 | Zampini, II et al. |
| 2009/0157309 | A1 | 6/2009 | Won et al. |
| 2009/0171571 | A1 | 7/2009 | Son et al. |
| 2009/0269073 | A1 | 10/2009 | Kitaji |
| 2009/0284366 | A1 | 11/2009 | Haartsen et al. |
| 2009/0310971 | A1 | 12/2009 | Kim et al. |
| 2010/0151903 | A1 | 6/2010 | Yamamoto |
| 2010/0159943 | A1 | 6/2010 | Salmon |
| 2010/0208236 | A1 | 8/2010 | Damink et al. |
| 2011/0026918 | A1 | 2/2011 | Kim et al. |
| 2011/0069951 | A1 | 3/2011 | Son et al. |
| 2011/0105134 | A1 | 5/2011 | Kim et al. |
| 2011/0135317 | A1 | 6/2011 | Chaplin |
| 2011/0153201 | A1 | 6/2011 | Park et al. |
| 2011/0176803 | A1 | 7/2011 | Song et al. |
| 2011/0266959 | A1 * | 11/2011 | Taipale et al. ................. 315/182 |
| 2011/0298886 | A1 | 12/2011 | Price et al. |
| 2012/0080944 | A1 * | 4/2012 | Recker et al. ................... 307/25 |
| 2012/0126909 | A1 * | 5/2012 | McCune, Jr. .................. 332/109 |

OTHER PUBLICATIONS

Gursoy, et al., "On-Off Frequency-Shift Keying for Wideband Fading Channels", EURASIP Journal on Wireless Communications and Networking, Article 98564, pp. 1-15 (2006).

Haruyama, S., "Visible Light Communications: Recent Activities in Japan," Smart Spaces: A Smart Lighting ERC Industry—Academia Day at BU Photonics Center, Boston University (Feb. 8, 2011) (49 pages).

Khan, T.A., "Visible Light Communications Using Wavelength Division Multiplexing," Thesis for Univ. of Engineering and Technology Lahore, Dept. of Elec. Engineering, (82 pages) (2006).

Liu, H.S. and Pang, G. "Positioning Beacon System Using Digital Cameria and LEDs," IEEE Trans. Vehic. Tech., vol. 52(2): 406-419 (Mar. 2003).

Osborne, D., "New LED Ceiling Lights transmit data using visible light," http://www.geek.com/articles/chips/new-led-ceiling-lights-transmit-data-using-visible-light-20110117/ (Jan. 17, 2011).

Pohlmann, "Visible Light Communication", Seminar Kommunikationsstandards in Medizintechnik, Jun. 29, 2010 (14 pages).

Tjan, B.S., et al., "Digital sign system for indoor wayfinding for the visually impaired" *Proceedings of the 2005 IEEE Computer Society Conference on Computer Vision and Pattern Recognition* (*CVPR*)—Workshops. 3, 30A. San Diego, CA. (8 pages).

Visible Light Communication (Vlc) Systems; <http://bemri.org/visible-light-communication.html> (Retrieved Mar. 10, 2012) (7 pages).

* cited by examiner

2801

3901

4001

DEVICE FOR DIMMING A BEACON LIGHT SOURCE USED IN A LIGHT BASED POSITIONING SYSTEM

CROSS-REFERENCE TO RELATED APPLICATIONS

This application claims priority under 35 U.S.C. §119(e) to U.S. Provisional Application No. 61/639,428, filed Apr. 27, 2012 and entitled "Method For Measuring Modulation Frequency Of A Light Source," the entire contents of which are incorporated herein by reference.

This application claims priority under 35 U.S.C. §119(e) to U.S. Provisional Application No. 61/635,413, filed Apr. 19, 2012 and entitled "Digital Pulse Recognition Demodulation Techniques For Light Based Positioning," the entire contents of which are incorporated herein by reference.

This application claims priority under 35 U.S.C. §119(e) to U.S. Provisional Application No. 61/567,484, filed Dec. 6, 2011 and entitled "Systems And Methods For Light Based Location," the entire contents of which are incorporated herein by reference.

This application claims priority under 35 U.S.C. §119(e) to U.S. Provisional Application No. 61/511,589, filed Jul. 26, 2011 and entitled "System Using Optical Energy For Wireless Data Transfer," the entire contents of which are incorporated herein by reference.

This application is a continuation-in-part of and claims benefit under 35 U.S.C. §120 to U.S. Utility application Ser. No. 13/446,520, entitled "Method And System For Tracking And Analyzing Data Obtained Using A Light Based Positioning System," filed Apr. 13, 2012, which is a continuation of and claims benefit under 35 U.S.C. §120 to U.S. Utility application Ser. No. 13/445,019, entitled "Single Wavelength Light Source for Use in Light Based Positioning System," filed Apr. 12, 2012; U.S. Utility application Ser. No. 13/435,448, entitled "A Method and System for Calibrating a Light Based Positioning System," filed Mar. 30, 2012; U.S. Utility application Ser. No. 13/422,591, entitled "Self Identifying Modulated Light Source," filed Mar. 16, 2012; U.S. Utility application Ser. No. 13/422,580, entitled "Light Positioning System Using Digital Pulse Recognition," filed Mar. 16, 2012; U.S. Utility application Ser. No. 13/369,147, entitled "Content Delivery Based on a Light Positioning System," filed Feb. 8, 2012; and U.S. Utility application Ser. No. 13/369,144, entitled "Independent Beacon Based Light Positioning System," filed Feb. 8, 2012.

This application is also a continuation-in-part of and claims benefit under 35 U.S.C. §120 to U.S. Utility application Ser. No. 13/446,506, entitled "Method And System For Determining the Position Of A Device In A Light Based Positioning System Using Locally Stored Maps," filed Apr. 13, 2012, which is a continuation of and claims benefit under 35 U.S.C. §120 to U.S. Utility application Ser. No. 13/445,019, entitled "Single Wavelength Light Source for Use in Light Based Positioning System," filed Apr. 12, 2012; U.S. Utility application Ser. No. 13/435,448, entitled "A Method and System for Calibrating a Light Based Positioning System," filed Mar. 30, 2012; U.S. Utility application Ser. No. 13/422591, entitled "Self Identifying Modulated Light Source," filed Mar. 16, 2012; U.S. Utility application Ser. No. 13/422580, entitled "Light Positioning System Using Digital Pulse Recognition," filed Mar. 16, 2012; U.S. Utility application Ser. No. 13/369,147, entitled "Content Delivery Based on a Light Positioning System," filed Feb. 8, 2012; and U.S. Utility application Ser. No. 13/369144, entitled "Independent Beacon Based Light Positioning System," filed Feb. 8, 2012.

This application is also related to the following applications, filed concurrently herewith, the entire contents of which are incorporated herein by reference: U.S. patent application Ser. No. 13/526,781, filed on Jun. 19, 2012, entitled "Method And System For Modifying A Beacon Light Source For Use In A Light Based Positioning System;" U.S. patent application Ser. No. 13/526,808, filed on Jun. 19, 2012, entitled "Method And System For Modulating A Light Source In A Light Based Positioning System Using A DC Bias;" U.S. patent application Ser. No. 13/526,788, filed on Jun. 19, 2012, entitled "Method And System For Modulating A Beacon Light Source In A Light Based Positioning System;" U.S. patent application Ser. No. 13/526,773, filed on Jun. 19, 2012, entitled "Method And System For Digital Pulse Recognition Demodulation;" U.S. patent application Ser. No. 13/526,656, filed on Jun. 19, 2012, entitled "Method And System For Configuring An Imaging Device For The Reception Of Digital Pulse Recognition Information;" U.S. patent application Ser. No. 13,526,814, filed on Jun. 19, 2012, entitled "Method And System For Video Processing To Determine Digital Pulse Recognition Tones;" and U.S. patent application Ser. No. 13,526,779, filed on Jun. 19, 2012, entitled "Method And System For Demodulating A Digital Pulse Recognition Signal In A Light Based Positioning System Using A Fourier Transform."

The above referenced applications are hereby incorporated by reference in their entirety.

FIELD OF THE DISCLOSURE

This disclosure relates generally to a dimmable beacon light source for a light based positioning system.

BACKGROUND

Indoor positioning services refers to methods where networks of devices and algorithms are used to locate mobile devices within buildings. Indoor positioning is regarded as a key component of location-aware mobile computing and is a critical element in providing augmented reality (AR) services. Location-aware computing refers to applications that utilize a user's location to provide content relevant to that location. Additionally, AR is a technology that overlays a virtual space onto a real (physical) space. To successfully enable AR and location-aware computing, accurate indoor positioning is a key requirement.

Global Positioning Systems (GPS) loses significant power when passing through construction materials, and suffers from multi-path propagation effects that make it unsuitable for indoor environments. Techniques based on received signal strength indication (RSSI) from WiFi and Bluetooth wireless access points have also been explored. However, complex indoor environments cause radio waves to propagate in dynamic and unpredictable ways, limiting the accuracy of positioning systems based on RSSI. Ultrasonic techniques (US), which transmit acoustic waves to microphones, are another method which can be used to approximate indoor position. They operate at lower frequencies than systems based on WiFi and attenuate significantly when passing through walls. This potentially makes US techniques more accurate than WiFi or Bluetooth techniques.

Optical indoor positioning techniques use optical signals, either visible or infrared, and can be used to accurately locate mobile devices indoors. These are more accurate than the approaches mentioned previously, since optical signals are highly directional and cannot penetrate solid objects. However this directionality limits the potential reliability of optical signals, since difficulty in aligning the receiver and transmitter can occur.

SUMMARY

In one aspect, the present disclosure relates to a dimmable beacon light source for a light based positioning system. In some embodiments, the light source includes a dimmer control switch configured to generate a dimmer signal having a desired light output level, a dimmable driver for controlling the light output of the light source, and a modulator for receiving the dimmer signal from the dimmer control switch, generating a digital pulse recognition signal by controlling the frequency of the dimmer signal to a desired frequency value, and transmitting the digital pulse recognition signal to the dimmable driver to drive the light output of the light source. In some embodiments, the digital pulse recognition signal is a pulse width modulated signal. In some embodiments, the digital pulse recognition signal has a duty cycle based on the dimmer signal. In some embodiments, the modulator includes a digital pulse recognition tone generator for receiving binary data from an information source and converting the binary data into one or more digital pulse recognition tones representing the desired frequency value and a waveform generator for using the one or more digital pulse recognition tones and the dimmer signal to generate the digital pulse recognition signal. In some embodiments, the frequency of the digital pulse recognition signal is based on the one or more digital pulse recognition tones. In some embodiments, the one or more digital pulse recognition tones are chosen from a set of possible digital pulse recognition tones and the set of possible digital pulse recognition tones includes a minimum frequency, a maximum frequency, and are separated by a minimum frequency step interval. In some embodiments, the minimum frequency, the maximum frequency, and the minimum frequency step interval are chosen based on the frequency response of the light source and the sampling time of a target imaging sensor. In some embodiments, the digital pulse recognition tone generator includes an encoder for mapping the binary data to one or more digital pulse recognition tones. In some embodiments, the one or more digital pulse recognition tones are chosen based on pre-computed mappings between the binary data and the digital pulse recognition tones. In some embodiments, the one or more digital pulse recognition tones are computed based on the binary data after receipt of the binary data from the information source. In some embodiments, the waveform generator combines the one or more digital pulse recognition tones with a periodic symbol created by a symbol creator to generate the digital pulse recognition signal. In some embodiments, the symbol created by the symbol creator is selected from a set of symbols by a symbol selector. In some embodiments, the set of symbols includes a saw tooth wave, a sine wave, a square wave, and a square wave with a DC offset. In some embodiments, the digital pulse recognition signal has an average output determined by the dimmer signal. In some embodiments, the digital pulse recognition signal has a hard-coded average output. In some embodiments, the dimmable driver includes the modulator. In some embodiments, the dimmable driver converts the digital pulse recognition signal to a pulse width modulated signal to control the output of the light source. In some embodiments, the digital pulse recognition signal has a pulse width causing the light output to be substantially the same as the desired light output of the dimmer signal. In some embodiments, the dimmer signal is generated by a triac dimmer. In some embodiments, the binary data is an arbitrary identifier for the light source. In some embodiments, the modulator sends the digital pulse recognition signal to the dimmable driver using an override input of the dimmable driver. In some embodiments, the dimmable driver receives and ignores the dimmer signal based on receiving the digital pulse recognition signal using the override input of the dimmable driver. In some embodiments, the light output of the light source is emitted by a light-emitting diode (LED).

DESCRIPTION OF EXAMPLE EMBODIMENTS

Systems and methods are provided that disclose providing a positioning service for devices based on light received from one or more light sources. This light-based positioning service uses light information transmitted by each light source to determine the position of the device. The device captures the one or more light sources and is then able to detect the information transmitted by each of the light sources. The light information can include an identification code that is used to identify the position of the light source. By capturing more than one light source on the device the accuracy of the device's position can be improved. The position information can then be used to provide relevant content information to the user. The light sources are each independent beacons that transmit individual identification information through light.

In some embodiments light sources are used to provide an indoor positioning service to mobile devices. Each light source is given an identification code, corresponding to an associated database, which contains information that ties the light source to specific location data. The identification codes are broadcasted through visible light by modulating the LED light source. The modulation occurs at speeds that are undetectable by the human eye, yet appropriate to be received by a camera equipped mobile device. The mobile device receives the identification information, and uses it to lookup its indoor position in the form of location data. Since the identification information is transmitted through visible light, which is highly directional, the mobile device is known to be within the line of sight of the LED light source. Since the indoor position of the LED light source is known from building floor plans and lighting plans, the corresponding indoor position of the mobile device can be determined.

Another embodiment describes a scenario where a mobile device is in view of three or more LED light sources. Each source emits unique identification information and, with knowledge of the relative positions of each LED light source, one can calculate the device's relative position in three dimensions. This process utilizes photogrammetric image processing techniques to identify and calculate coordinates for the positions of the light sources in order to relatively locate the mobile device.

Yet another embodiment describes a system by which a mobile device 103 can receive content based upon identification information received from either one or more LED light sources. The identification information is used to access a database that correlates LED lights and content. An example of such a use case would be a mobile device user in a museum, who receives identification information from a light source illuminating an exhibit, and then uses the received identification information to obtain additional content about the exhibit.

Figure 1:
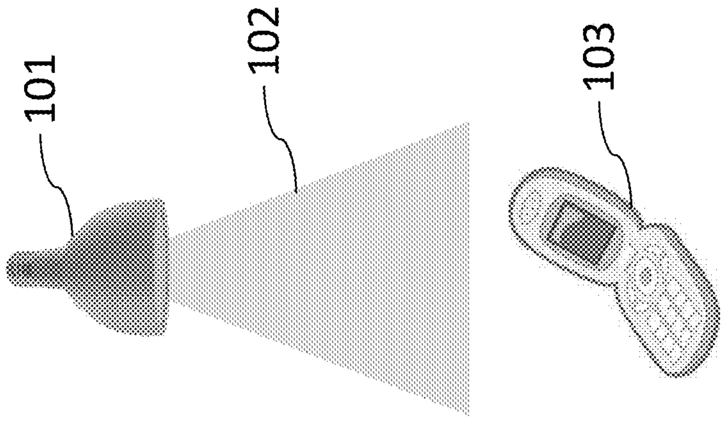
FIG. 1 is a representation of a mobile device receiving light from a LED light source.

FIG. 1 represents a mobile device 103 receiving light 102 from a LED light source 101. The LED light source 101 can be any lighting source used for general purpose, spot illumination, or backlighting. The LED light source can come in several form factors but is not limited to: Edison screw in, tube style, large and small object backlighting, or accent lighting spots and strips. For the purposes of this disclosure, we consider any form of LED light as a potential source capable of transmitting information.

Light 102 is a modulated LED light source 101, and is part of the visible electromagnetic wireless spectrum. LEDs are considered digital devices which can be rapidly switched on and off, to send signals above the rate which the human eye can see. This allows them to be exploited to send digital data through the visible light itself By modulating the LEDs, turning them on and off rapidly, one can send digital information that is unperceivable to the human eye, but is perceivable by applicable sensors, including but not limited to image sensors and other types of photosensors.

There are many modulation techniques used to send information through light 102. One technique, "On Off Keying" (OOK), is a scheme to transmit digital data by rapidly switching a signal source on and off. OOK is the simplest form of amplitude-shift keying (ASK) which is a modulation technique that represents digital data through either the presence or absence of a carrier wave. When communicating with visible light, the carrier wave takes the form of the transmitted light signal. Therefore at a rudimentary level, when the light signal is turned "on" a digital "one" is perceived, and when the light signal is turned "off" a "zero" is perceived. Furthermore the rate at which the light signal is turned on and off represents the modulation frequency. Note that regardless of changing the modulation frequency, the "carrier wave" remains unchanged as this is an inherent property of the light itself. For example the carrier wave corresponding to a blue light signal is uniquely different than the carrier wave corresponding to a red light signal. While these two signals differ only in the wavelength specific to their perceived color, they can be perceived as two discrete signals.

In addition to OOK, another possible technique is defined as "Digital Pulse Recognition" (DPR). This modulation technique exploits the rolling shutter mechanism of a complementary metal-oxide-semiconductor (CMOS) image sensor. Due to their superior energy efficiency, CMOS sensors are preferred to charged-coupled device (CCD) sensors on mobile devices. When a CMOS image sensor with a rolling shutter takes an image, it does not expose the entire image simultaneously. Instead, the rolling shutter partially exposes different portions of the frame at different points in time. Typically, this causes various unwanted effects: skew, wobble, and partial exposure. In the presence of an LED light driven by a pulse width modulated signal, images received from a CMOS sensor exhibit "residual banding" in the form of visible distortions. The image appears to have alternating dark/white stripes. The stripes are a direct result of the rolling shutter mechanism, and their width is proportional to the frequency of the pulse width modulated (PWM) signal. Higher frequencies correspond to narrower stripes, and lower frequencies result in wider stripes. Practical frequency ranges for use with this technique are between 60 Hz and 5000 Hz. This technique allows one to exploit the rolling shutter mechanism to recover digital data from an optically encoded signal.

DPR has the potential for much higher data rates than both OOK and frequency shift keying (FSK). In FSK and OOK, the camera's frame rate limits the data rate. The highest possible data rate is half of the frame rate, since each symbol spans over two frames. In DPR modulation, a single frame is sufficient for capturing the transmitted symbol. Furthermore, symbols are not "binary"—there are can be as many as 30 different possibilities for a symbol.

In the DPR modulation scheme, image processing is used to measure the stripe width of the recorded image. By successively changing the LED driver frequency for each frame, information is essentially transmitted through recognition of the band widths. In the current design, 10 separate frequencies are used. For a 30 frames per second (FPS) camera, this corresponded to an effective data transfer rate of ~100 bits per second (bps).

Both of these techniques are interesting because they can allow the transmission of information through single color light sources, instead of having to create lighting sources which contain multiple color lights. In the world of LED lighting products, white light is majorly achieved by layering a phosphorous coating on top of blue LEDs. The coating creates the visible perception of "white" light, instead of blue. The alternative to this can be achieved through combining red, green, and blue LED lights; however this approach is expensive and power inefficient as the lumens per watt properties differ between different colored LEDs. Blue LEDs are generally more energy efficient than their red and green counterparts, which is why they are used in most commercial LED lighting products. It is because of this reason that it makes the most sense to use a data modulation technique that uses a single wavelength of light, rather than multiple, because this complies with LED lighting products.

In addition to LED light sources, other types of light sources are also capable of transmitting information through modulation. Alternative incandescent and fluorescent technologies can also be exploited to achieve data transmission, however the circuitry is more complex because the turn on and turn off times of incandescent and fluorescent lights are subject to additional factors.

The modulation frequency of the light source is highly dependent on the receiving circuitry. While incandescent and fluorescent technologies generally do not "flicker" on and off during the course of normal operation, LED lighting sources are sometimes designed to flicker above the rate which the eye can see in order to increase their longevity, and consume less power. Most humans cannot see flicker above 60 Hz, but in rare instances can perceive flicker at 100 Hz to 110 Hz. To combat this, lighting manufacturers design flicker above 200 Hz into their lighting products.

Mobile device 103 can be a smart mobile device and is most commonly found in the form of mobile phones, tablets, and portable laptop computers. In order for a mobile device 103 to receive information 102 from the LED light source 101 it has an embedded or attached sensor which is used to receive the incoming light 102 signals. One such sensor is a camera, which has a typical frame refresh rate between fifteen and sixty frames per second (fps). The fps is directly related to the speed at which optical signals can be transmitted and received by the camera. The sensor can capture a number of successive image frames that can later be analyzed to determine if a light source is providing information through light.

Mobile device 103 can include a processor, module, memory, and sensor in order to capture and analyze light received from light sources. The mobile device can analyze the successive image frames captured by the sensor by using the module. The module can be logic implemented in any combination of hardware and software. The logic can be stored in memory and run by processor to modify the successive images and analyze the successive images to determine information encoded in the light of one or more light sources. The module can be built in to the mobile device to provide the capabilities or it can be downloaded and installed. The module can be an application that runs on the mobile device when selected by a user. The module can also be used to receive content and other information related to the position of the mobile device and to provide this content to other modules or to the mobile device.

The reception of optically transmitted information is particularly interesting when used as an indoor positioning system. In a light-based positioning system, the physical locations of light sources can be used to approximate the relative position of a mobile device 103 within line of sight. On the mobile side, in addition to a receiving module, the mobile device 103 can use information to determine position of the mobile device. The mobile device can access a data source containing information about where the lights are physically located to determine position. This data source can be stored locally, or in the case where the mobile device 103 has a network connection, the data source could be stored on an external server 703.

For scenarios where a network connection is not available, before entering an indoor space the mobile device 103 could optionally download a "map pack" containing the information used to locate itself indoors, instead of relying on an external server 703. In order to automate this process, the mobile device 103 would first use an alternative existing technique for resolving its position and would use the gained location information to download the appropriate map pack. The techniques for receiving geo-location information include, for example, GPS, GSM, WiFi, user input, accelerometer, gyroscope, digital compass, barometer, Bluetooth, and cellular tower identification information. These techniques can also be used to fill gaps between when a position of the mobile device is determined using the light-based technique. For example, a mobile device can be placed at times so its camera does not capture light sources. Between these times these alternative existing techniques can be used for filling in position and location information that can be helpful to the user. The map pack would contain a map 902 of the indoor space the user is entering, locations of the lights from some sort of existing or third-party lighting plan 1103, and any location-dependent content 903 for the mobile device 103 to consume. Any requests for location information would simply access data stored locally on the mobile device 103, and would not need to access a remote server via a network 601.

In terms of the experience when using a light-based positioning system, the indoor location reception and calculation can happen with little to no user input. The process operates as a background service, and reads from the receiving module without actually writing them to the display screen of the mobile device. This is analogous to the way WiFi positioning operates, signals are read in a background service without requiring user interaction. The results of the received information can be displayed in a number of ways, depending on the desired application. In the case of an indoor navigation application, the user would see an identifying marker overlaid on a map of the indoor space they are moving around in. In the case of content delivery, the user might see a mobile media, images, text, videos, or recorded audio, about the objects they are standing in front of.

Figure 2:
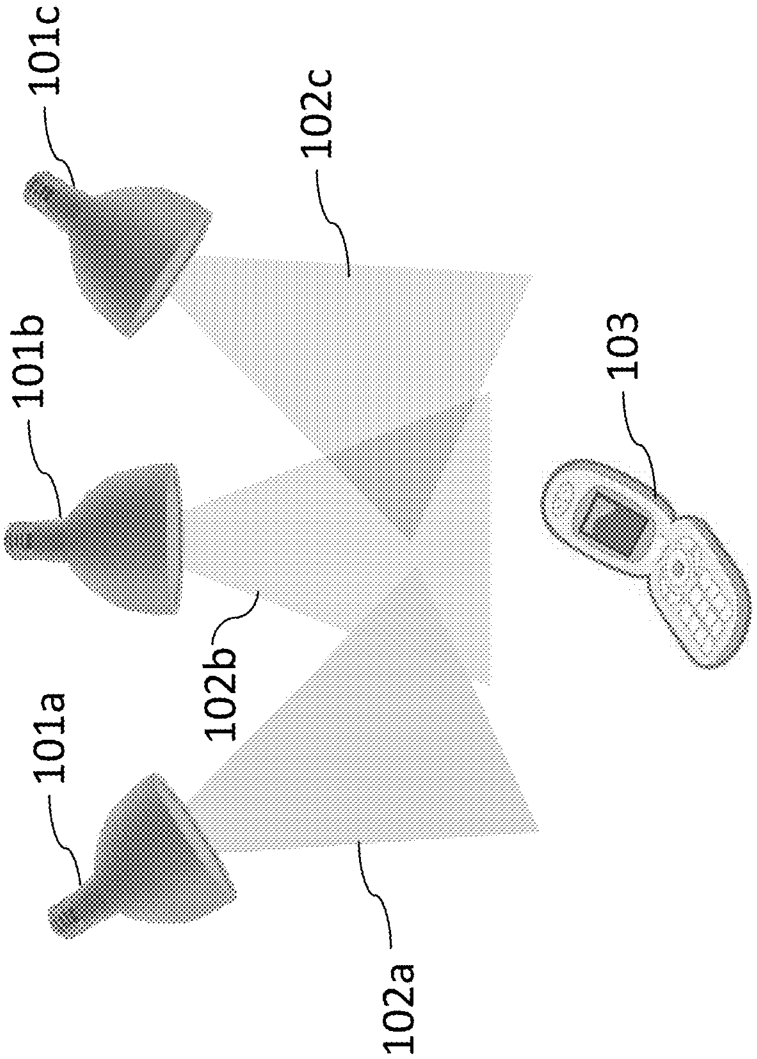
FIG. 2 is a representation of a mobile device receiving multiple sources of light simultaneously from multiple LED light sources.

In scenarios where the mobile device 103 is in view of several light sources, it can receive multiple signals at once. FIG. 2 is a representation of a mobile device 103 receiving identification information 102*a*-102*c* from multiple LED light sources 101*a*-101*c*. Each light source is transmitting its own unique piece of information. In order to identify its position or receive location-based content, the mobile device 103 can then use the received information to access a database 802 containing information about the relative positions of the LED light sources 101*a*-101*c* and any additional content 903. When three or more sources of light are in view, relative indoor position can be determined in three dimensions. The position accuracy decreases with less than three sources of light, yet remains constant with three or more sources. With the relative positions of lights 101*a*-101*c* known, the mobile device 103 can use photogrammetry to calculate its position, relative to the light sources.

Photogrammetry is a technique used to determine the geometric properties of objects found in photographic images. In the context of locating mobile devices using light sources, photogrammetry refers to utilizing the corresponding positions of LED light sources, and their positions in 3-D space, to determine the relative position of a camera equipped mobile device. When three unique sources of light are seen by the camera on a mobile device, three unique coordinates can be created from the various unique combinations of 101*a*-101*c* and their relative positions in space can be determined.

For a mobile device 103 equipped with an image sensor we can consider the following scenario. When multiple LED light sources appear in the image sensors field of view, the sources appear brighter relative to the other pixels on the image. Thresholds can then be applied to the image to isolate the light sources. For example, pixel regions above the threshold are set to the highest possible pixel value, and the pixel regions below the threshold are set to the minimum possible pixel value. This allows for additional image processing to be performed on the isolated light sources. The end result is a binary image containing white continuous "blobs" where LED light sources are detected, and dark elsewhere where the sources are not detected.

A blob detection algorithm can then be used to find separate LED light sources. A minimum of three separate LED blobs are used to resolve the 3-D position of a mobile device 103. Each LED blob represents a "region of interest" for the information reception, and is simultaneously transmitting a unique piece of information via the modulated visible signal from the light source. For the purposes of reception, each region of interest is processed independently of other regions of interest and is considered to be uniquely identifiable. A center of mass calculation for each region can be performed to determine the pixel coordinates of the center of each LED light source. This center of mass calculation is performed for each frame to track the regions of interest as they move around the image.

Once the regions of interest are established, a detection algorithm captures multiple image frames for each region of interest in order to receive the visible light signal contained in each blob. For each frame in a detected region of interest, a threshold algorithm determines whether the frame contains a "1" (in the case of an aggregate pixel value above the threshold), or a "0" (in the case of an aggregate pixel value lower than the threshold). The threshold algorithm is used since the communication is asynchronous, so the camera receiver period may overlap between the transmission of a "1" and a "0" from the LED light source.

The result of converting successive image frames in a region of interest to binary values is in essence a down-sampled digital version of the signal received from the LED light source. Next demodulation of the down-sampled digital signal is used to recover the transmitted bits. This down sampling is used due to the fact that the signal modulation frequency should be above the rate at which the human eye can see, and the image sensor frame rate is typically limited to 15-30 fps.

At a lower level, the mobile device 103 processes data on a frame-by-frame basis. Each frame is split into separate regions of interest, based on the detection of light sources. For each region of interest, a thresholding algorithm is used to determine whether a given region is "on" or "off". This is done by taking the average pixel value for the region and comparing it to the threshold value. If the region is "on", the demodulator assumes the light source has just transmitted a "1". If the region is "off", the demodulator assumes the light source has sent a "0". The result of this is the equivalent of a 1-bit analog-to-digital conversion (ADC), at a sampling rate which is equal to the frame rate of the camera.

After a frame is processed, the results of the ADC conversation are stored in a circular buffer. A sliding correlator is applied to the buffer to look for the presence of start bits 402. If start bits 402 are found, the demodulation algorithm assumes it is reading a valid packet of information 401 and proceeds to capture the rest of the transmission. Two samples are used for each bit, so the algorithm creates a linear buffer that is twice the size of the remaining packet. Each subsequent ADC is written sequentially to the linear buffer. When the linear buffer is filled, the demodulation algorithm performs a Fast Fourier Transform (FFT) on the buffer to recover the transmitted signal.

Figure 3:
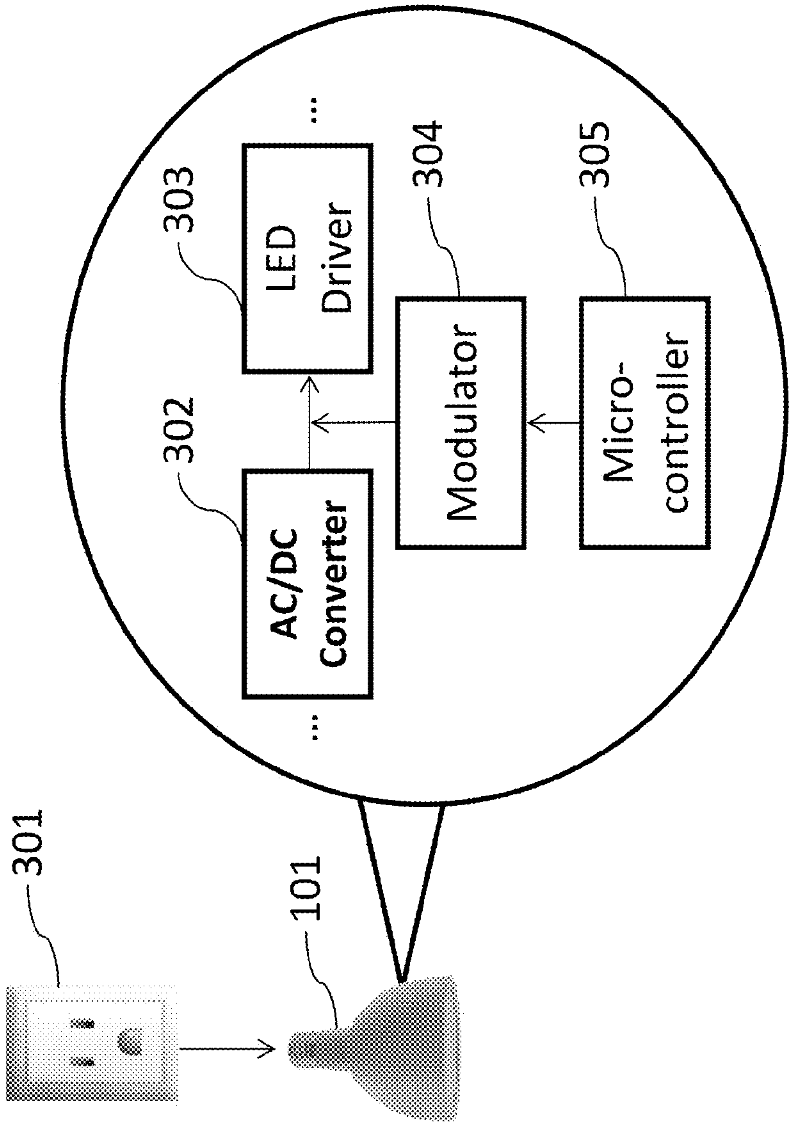
FIG. 3 is a representation of the internal components commonly found in a LED light source that is capable of being modulated to send digital data.

FIG. 3 describes internal components commonly found in LED light source 101 with the addition components to allow for the transmission of optical signals. The LED light source 101 contains an alternating current (AC) electrical connection 301 where it connects to an external power source, an alternating current to direct current (AC/DC) converter 302 which converts the AC signal from the power source into an appropriate DC signal, a modulator 304 which interrupts power to the LEDs in order to turn them on and off, a microcontroller 305 which controls the rate at which the LEDs are modulated, and a LED driver circuit 303 which provides the appropriate amount of voltage and current to the LEDs.

Electrical connection 301 is an electrical source that is used to supply power to the LED light source 101. This most commonly comes in the form of a 120 Volt 60 Hz signal in the United States, and 230 Volt 50 Hz in Europe. While depicted in FIG. 3 as a three pronged outlet, it can also take the form of a two terminal Edison socket which the bulb is screwed into, or a bundle of wires containing a live, neutral, and/or ground. When considering other forms of lighting such as backlighting and accent lighting, the electrical connection can also come in the form of a DC source instead of an AC source.

Most LED light sources contain an AC/DC converter 302 which converts the alternating current from the power source 301 to a direct current source used internally by the components found inside the bulb or light source. The converter takes the alternating current source commonly found in existing lighting wiring and converts it to a direct current source. LED light sources generally use direct current, therefore an AC/DC converter is found in most lighting products regardless of form factor.

LED driver 303 provides the correct amount of current and voltage to the LEDs contained inside the lighting source. This component is commonly available and can have either a constant current or constant voltage output. The LEDs found inside most lighting sources are current controlled devices, which require a specific amount of current in order to operate as designed. This is important for commercial lighting products because LEDs change color and luminosity in regards to different currents. In order to compensate for this, the LED driver circuitry is designed to emit a constant amount of current while varying the voltage to appropriately compensate for the voltage drops across each LED. Alternatively, there are some high voltage LEDs which require a constant voltage to maintain their color and luminosity. For these cases the LED driver circuitry provides a constant voltage while varying the current.

Modulator 304 serves the function of modulating the LED light source 101 on and off to optically send light 102 signals. The circuits comprising the modulator can simply consist of solid state transistors controlled by a digital input. In essence the modulator 304 turns the LEDs on and off by allowing or preventing current flow. When current flows through the modulator with the switches closed the LEDs turn on, and when the switches are open in the modulator no current can flow and the LEDs turn off. When the modulator is controlled by an additional logic component, it has the ability to send repeating patterns of on/off signals in order to transmit digital data through the visible light 102. The modulator interfaces directly in between the AC/DC converter 302 and the LED driver 303, and is controlled by a microcontroller 305.

The microcontroller 305 provides the digital input signal to the modulator unit 304. This function can also be achieved using a field programmable gate array (FPGA), but typically consumes more power with added complexity. The microcontroller's 305 task is to send a pre-determined sequence of signals to the modulator 304 which then interfaces with the LED driver 303 to modulate the outgoing visible light from the LED source 101. The microcontroller contains a nonvolatile memory storage area, which stores the identification code of the light signal. Examples of possible nonvolatile memory sources include programmable read only memory (PROM), electrically erasable programmable read only memory (EEPROM), or Flash.

In regards to the microcontroller pins, the microcontroller 305 contains a digital output pin, which is used to modulate the light output. To generate the output signal waveforms, timer modules within the microcontroller 305 are used. Typical logic levels for the digital output are 3.3V and 5V. This digital output feeds into the modulator 304 which interrupts the driver circuit 303 for the LED light source 101. Alternatively, if the LED light source requires lower power, such as backlighting or individual LED diodes, the output of the microcontroller 305 could also be used to drive the light sources directly.

Figure 4:
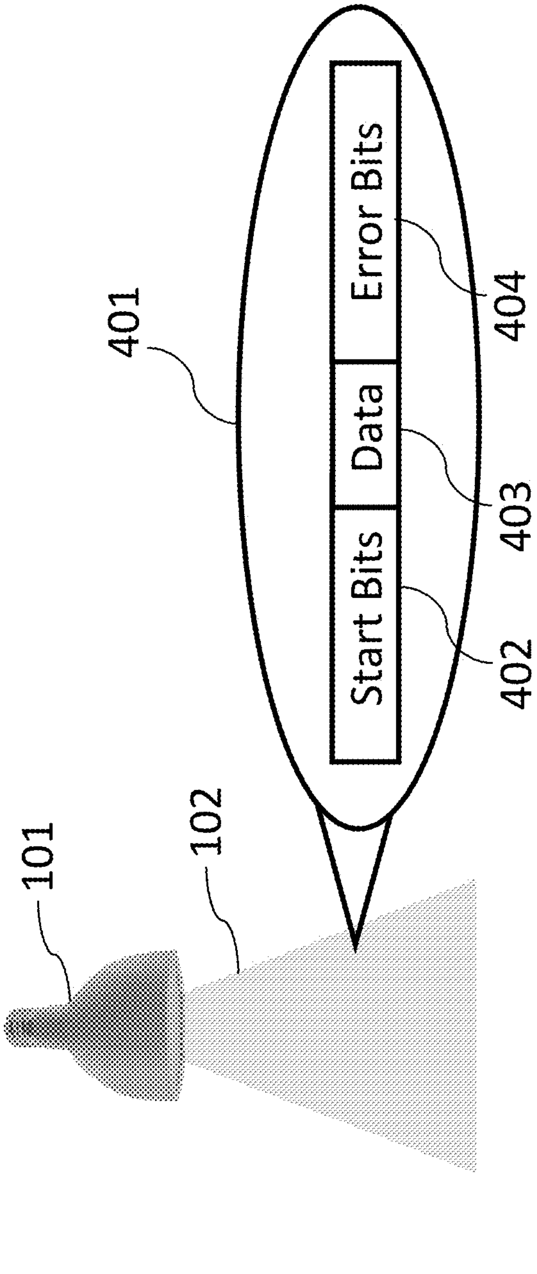
FIG. 4 illustrates information which can be optically transmitted from an LED light source.

The sequence of signals sent from the microcontroller 305 determines the information which is transmitted from the LED light source 101. FIG. 4 describes the information 401 format of the optically transmitted information from the light 102. At the highest level, each packet of information contains some sort of starting bit sequence, which indicates the beginning of a packet, followed by data 403, and some sort of error detection identifier. The size and position of each portion of information is dependent on the application and is also constrained by requirements of the receiving device.

Each packet of information 401 transmitted from the LED light source 101 contains a sequence of starting bits 402, followed by data 403, and then terminated with an error detection code 404. Since the LED light sources 101 are continually broadcasting information 401, erroneous packets are simply discarded while the receiver listens for the starting bits 402, indicating the beginning of the next packet. In cases where multiple sources of light are observed by a mobile device 103, multiple pieces of information 401 are received simultaneously.

Information 401 describes the encoded information that is transmitted by the LED light source 101. The information 401 is contained in a packet structure with multiple bits which correspond to numeric integer values. The data 403 portion of the information packet can include unique ID codes 701. Currently the data 403 size is set to 10 bits, but can be of varying length. Each bit represents a binary "1" or "0", with 10 bits of data 103 corresponding to 1024 possible values. This corresponds to 1024 unique possibilities of ID codes 701 before there is a duplicate. The ID code can include location information in the ID code that provides a general indication of geographical location of the light. This geographical location information can be used to more quickly locate light source information that is used in determining indoor positioning on the mobile device. For example, the geographical information can point to a database to begin searching to find relevant information for positioning. The geographical information can include existing location identifiers such as area code, zip code, census tract, or any other customized information.

The ID code 701 is static and is assigned during the calibration phase of the LED light source 101 during the manufacturing process. One method to assign the ID code 701 is to place instructions to generate a random code in the nonvolatile memory. Once the LED light source 101 is powered on the microcontroller reads the ID code 701 from the nonvolatile memory storage area, and then uses this code for broadcasting each and every time it is subsequently powered on. Since the ID code 701 is static, once it is assigned it will be forever associated locally to the specific LED light source 101 which contains the microcontroller 305.

Figure 5:
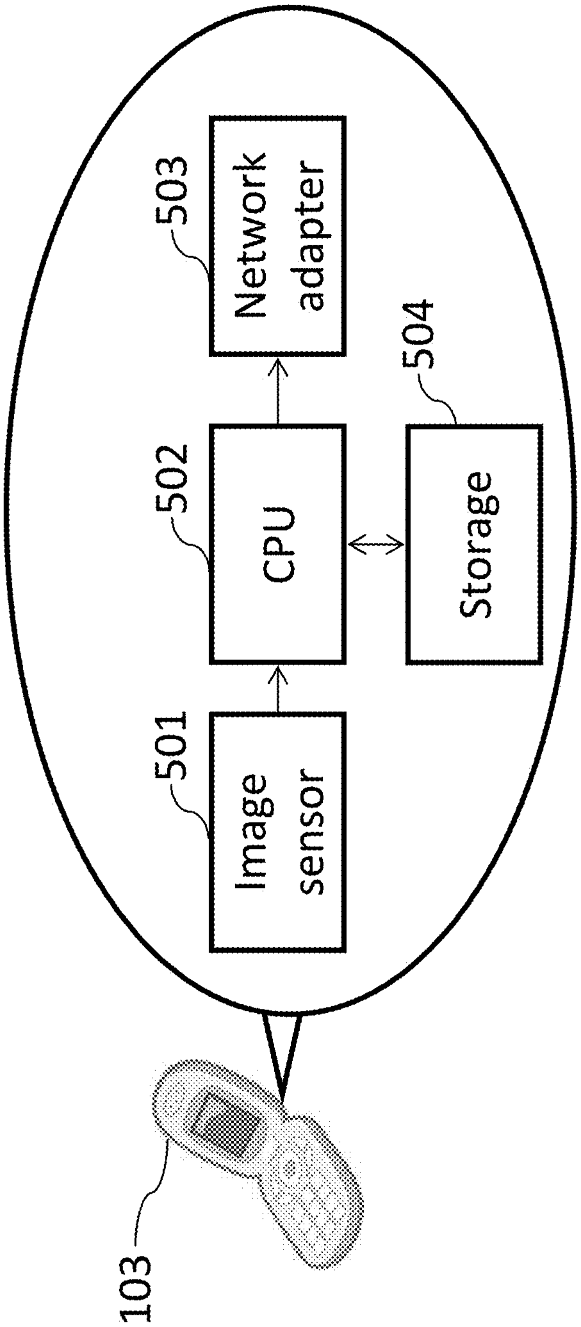
FIG. 5 is a representation of the components which are commonly found in mobile devices which enable them to receive optical signals from LED sources.

FIG. 5 describes the components found in mobile devices 103 that are capable of receiving optical information. At the highest level the mobile device contains an image sensor 501 to capture optically transmitted information, a central processing unit 502 to decipher and manage received information, and a network adapter 503 to send and receive information.

Photosensors are devices which receive incoming electromagnetic signals, such as light 102, and convert them to electrical signals. In a similar fashion, image sensors are arrays of photosensors which convert optical images into electronic signals. The ability to receive signals from multiple sources is an important benefit when using image sensors for receiving multiple optical signals.

Image sensor 501 is a typical sensor which is found in most smart devices. The image sensor converts the incoming optical signal into an electronic signal. Many devices contain complementary metal-oxide-semiconductor (CMOS) image sensors, however some still use charge-coupled devices (CCD). CMOS image sensors are the more popular choice for mobile devices due to lower manufacturing costs and lower power consumption. There are several tradeoffs to consider when choosing an image sensor to perform photogrammetry on multiple LED light sources 101. One tradeoff is between the camera resolution and the accuracy of the photogrammetric process when triangulating between multiple light sources—increasing the number of pixels will increase the accuracy. There is also another tradeoff between the data rate of the transmission and the sampling rate (in frames per second) of the camera. The data rate (in bits/second) is half the frame rate of the camera (e.g., a 30 fps camera will receive 15 bps). And finally when determining the length of the information 401 packet, the larger the size the longer the reception period, as more bits generally requires longer sampling periods to capture the full message.

CPU 502 is a generic CPU block found in most smart devices. The CPU 502 is in charge of processing received information and sending relevant information to the network adapter 503. Additionally the CPU has the ability to read and write information to embedded storage 504 within the mobile device 103. The CPU 502 can use any standard computer architecture. Common architectures for microcontroller devices include ARM and x86.

The network adapter 503 is the networking interface that allows the mobile device 103 to connect to cellular and WiFi networks. The network connection is used in order for the mobile device 103 to access a data source containing light ID codes 701 with their corresponding location data 702. This can be accomplished without a data connection by storing location data 702 locally to the mobile device's 103 internal storage 504, but the presence of a network adapter 503 allows for greater flexibility and decreases the resources needed. Furthermore, the network adapter 503 is also used to deliver location dependent content to the mobile device when it is connected to a larger network 601.

Figure 6:
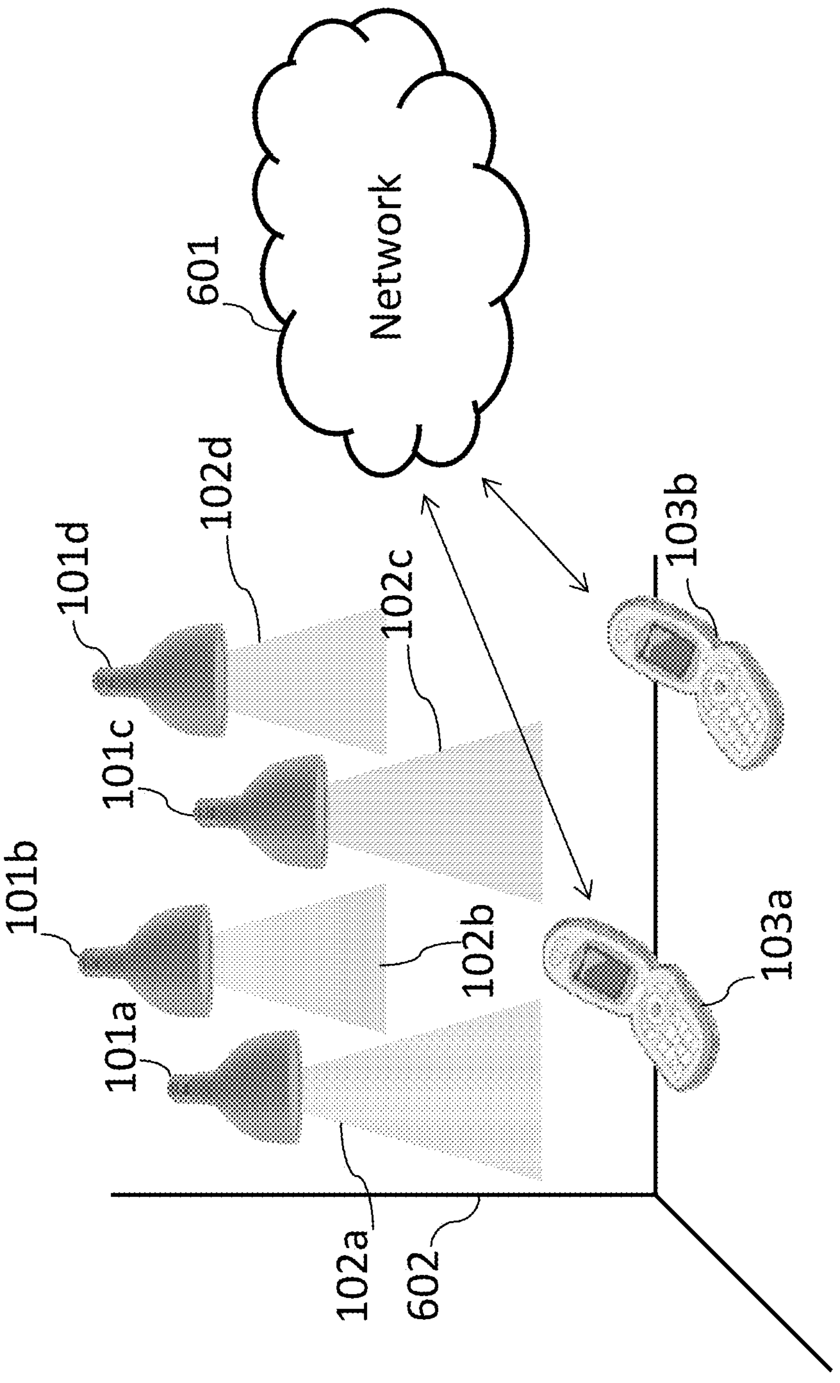
FIG. 6 is a representation of multiple LED light sources sending unique information to multiple mobile devices.

FIG. 6 is a representation of multiple LED sources sending light 102*a-d* containing identification information 102 to multiple mobile devices 103*a*-103*b*. In this instance the light sources are acting as non-networked broadcast beacons; there are no networking modules or physical data wires connecting them. This property is desirable when looking towards a commercial installation of numerous LED light sources 103*a*-103*b*, as additional wiring and networking will not be required. However, in order to receive relevant information the mobile devices have the ability to send and receive additional information from a local source or a network 601. Once the mobile device 103 receives identification information 401 from the light sources, it then asks a local or remote source for additional information.

Enclosed area 602 is a spatial representation of an enclosed room containing four LED sources 101*a*-101*d* and two mobile devices 103*a*-103*b*, meaning that they can operate next to each other without interference. As a rule of thumb if the received image feed from the mobile device sees one or more distinct bright sources of light, it has the ability to differentiate and receive the unique information without interference. Because the light capture is based on line of sight, interference is mitigated. In this line of sight environment, interference can arise when the light capture mechanism of the mobile device is blocked from the line of sight view of the light source.

Network 601 represents a data network which can be accessed by mobile devices 103*a*-103*b* via their embedded network adapters 503. The network can consist of a wired or wireless local area network (LAN), with a method to access a larger wide area network (WAN), or a cellular data network (Edge, 3G, 4G, LTS, etc). The network connection provides the ability for the mobile devices 103*a*-103*b* to send and receive information from additional sources, whether locally or remotely.

Figure 7:
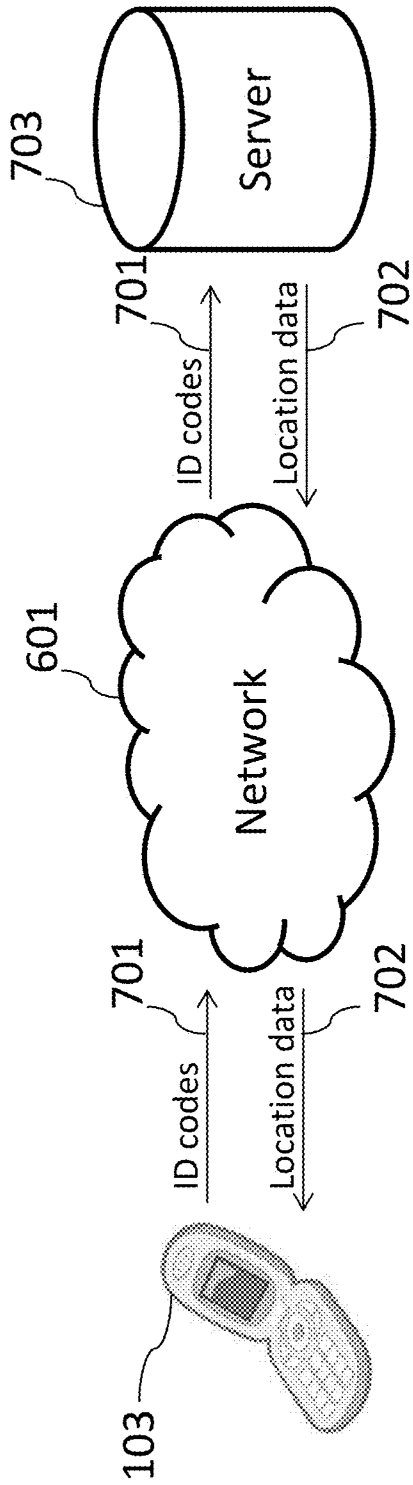
FIG. 7 illustrates the process of a mobile device sending identification information and receiving location information via a network to a server.

FIG. 7 describes how the mobile device 103 receives location data 702. In essence, the mobile device 103 sends decoded ID codes 701 through a network 601 to a server 703, which sends back location information 702. The decoded ID codes 701 are found in the information 401, which is contained in the optically transmitted signal. After receiving this signal containing a unique ID code 701 the mobile device 103 sends a request for location data 702 to the server 703, which sends back the appropriate responses. Additionally the request could include other sensor data such as but not limited to GPS coordinates and accelerometer/gyroscope data, for choosing between different types of location data 702 and any additional information.

Location data 702 is the indoor location information which matches the received information 401. The location data 702 corresponds to indoor coordinates which match the ID code 701, similar to how outdoor GPS tags known locations of interest with corresponding information. The location data 702 could also contain generic data associated with the light identification information 401. This could include multimedia content, examples of which include recorded audio, videos, and images. The location data 702 can also vary depending, for example, on other criteria such as temporal criteria, historical criteria, or user-specified criteria.

The temporal criteria can include the time of day. The historical criteria can include user location history (e.g., locations visited frequently), Internet browsing history, retail purchases, or any other recorded information about a mobile device user. The user-specified criteria can include policies or rules setup by a user to specify the type of content they wish to receive or actions the mobile device should take based on location information. For example, the user-specified criteria can include how the mobile device behaves when the user is close to an item that is on sale. The user may specify that a coupon is presented to the user, or information about the item is presented on the mobile device. The information about the item can include videos, pictures, text, audio, and/or a combination of these that describe or relate to the item. The item can be something that is for sale, a display, a museum piece, or any other physical object.

Server 703 handles incoming ID codes 701, and appropriately returns indoor location data 702 to the mobile devices 103. The handling can including receiving incoming ID codes, searching databases to determine matches, calculating position coordinates based on the ID codes, and communicating indoor location data 702. Since the LED light sources 101 are acting as "dumb" one way communication beacons, it is up to other devices to determine how to use the ID codes to calculate position information and deliver related content. In some embodiments, the server 703 can include the information used to link ID codes 701 to physical spaces and to deliver location-specific content. The server is designed to handle the incoming requests in a scaleable manner, and return results to the mobile devices in real-time.

The server can include one or more interfaces to the network that are configured to send and receive messages and information in a number of protocols such as Internet Protocol (IP) and Transmission Control Protocol (TCP). The protocols can be arranged in a stack that is used to communicate over network 601 to mobile device 103. The server can also include memory that is configured to store databases and information used in providing position coordinates and related location based content. The server can include one or more modules that can be implemented in software or other logic. These modules can perform calculations and perform operations to implement functionality on the server. The server can use one or more processors to run the modules to perform logical operations.

Figure 8:
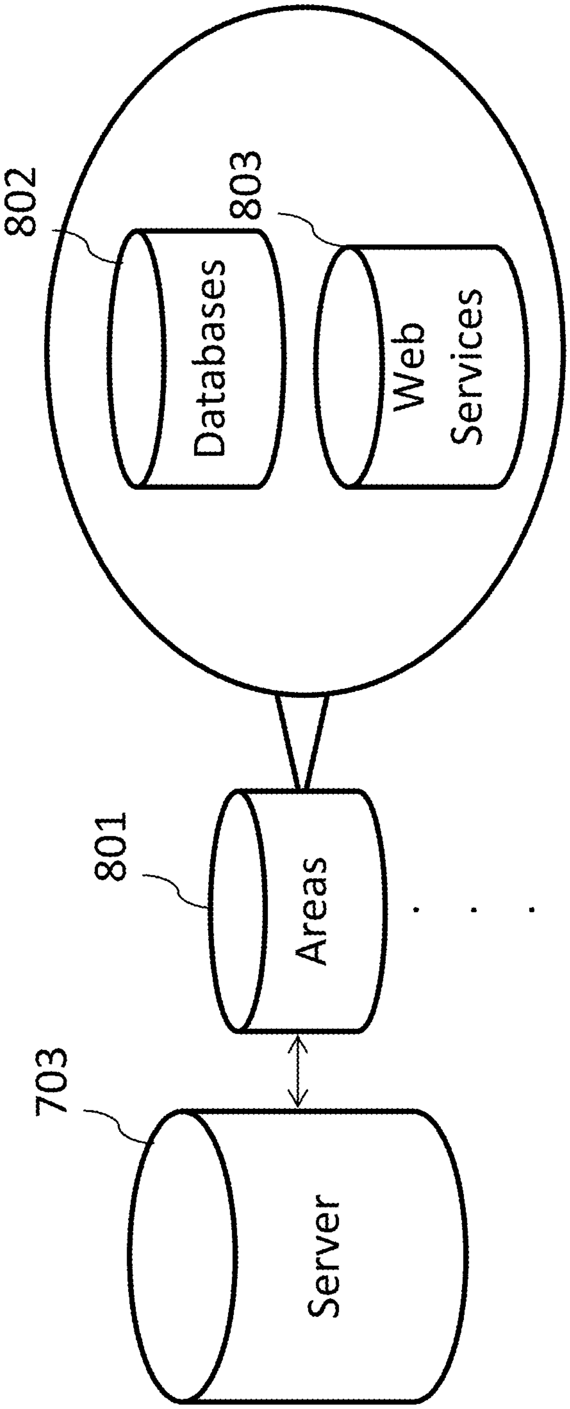
FIG. 8 illustrates the high level contents of the server which includes databases and web services for individual areas enabled with light positioning systems.

To describe the server interaction in more detail, FIG. 8 delves into location-specific areas 801 containing databases 802 and web services 803. The areas 801 represent a subset of databases 802 and web services 803 for individual locations where there are installed LED light sources 101. The server 703 directly communicates with these installations, which have their own separate sets of information. At a high level, databases 802 represent the stored information pertaining to a specific area 801, while the web services 803 represent services which allow users, customers, administrators, and developers access to the ID codes, indoor locations, and other information.

In order to send relevant information, after each received ID code 701, the server 703 requests information pertaining to the specific area 801. Contained in each area 801, are databases which contain information corresponding to the specific ID code 701. This information can take multiple formats, and has the ability to be content specific to a variety of static and dynamic parameters.

In order to optimize response time, the server 703 can constrain its search space by using existing positioning technologies available to the mobile device 103 or from information in the light source ID code depending on the embodiment. In essence the server looks for the light IDs 901 within a specific radius of the current approximate position of the mobile device 103, and ignores those that are geographically irrelevant. This practice is known as "geo-fencing", and dramatically reduces the request/response time of the server 703. As final verification, if the database 802 contains one or more of the same IDs within the current search space that match the ID codes received by the mobile device 103 within a specific time frame, then a successful transaction can be assumed.

Figure 9:
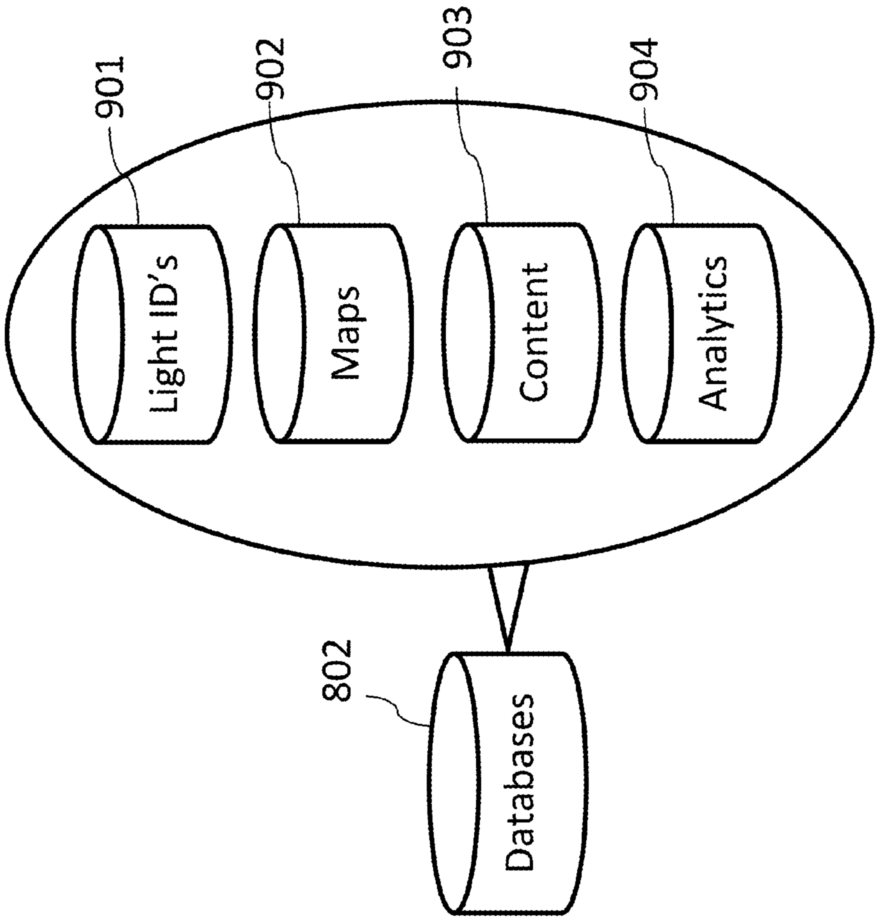
FIG. 9 illustrates the components inside the databases.

As seen in FIG. 9, each database 802 contains numerous sub-categories which store specific types of information. The categories are labeled light IDs 901, maps 902, content 903, and analytics 904.

Light IDs 901 is a category which contains records of the individual light ID codes 701 which are contained in an area 801. In a typical light positioning enabled installation, there will be tens to hundreds of unique LED light sources 101 broadcasting unique ID codes 701. The purpose of the light IDs 901 database is to maintain and keep a record of where the ID codes 701 are physically located in the area 801. These records can come in the form of but are not limited to GPS (latitude, longitude, and altitude) coordinates which are directly mapped into an indoor space. For instance, most indoor facilities have information about the number of installed lights, how far apart they are spaced, and how high the ceilings are. You can then match this information with building floor plans or satellite imagery to create a digital mapping of where each light is positioned.

To expand upon the Light IDs 901 category, additional information can come in the form of location-specific maps 902. These maps can take on many physical and digital forms, either directly from the management of the location, or a third-party vendor or outside source. In addition to mapping information, location-specific content 903 and analytics 904 are also contained inside the databases 802.

Figure 10:
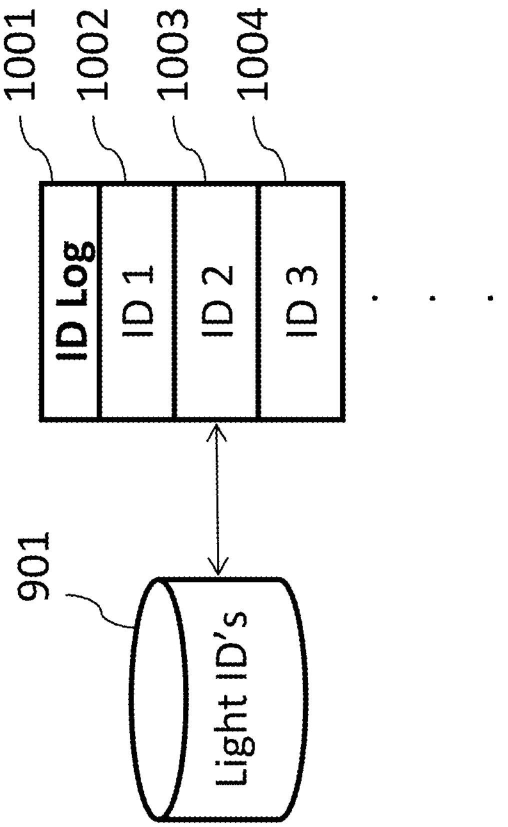
FIG. 10 illustrates the information contained in the Light IDs database.

FIG. 10 is a description of the ID log 1001 information contained in the Light IDs database 901. It is a representation of the file structure that contains individual records corresponding to individual light ID codes 701 found within different areas 801. In a typical area 801 there is a possibility of having duplicate ID codes 701 since there are a finite number of available codes. The size of the ID code 701 is proportional to the length of the data 403 field contained in the optical information 401.

To deal with duplicate ID codes 701, additional distinguishing information can be contained inside of the individual log records; ID 1 1001, ID 2 1003, and ID 3 1004. This information can contain additional records about neighboring ID codes 701 which are in physical proximity of the LED light source 101, or additional sensor data including but not limited to: accelerometer or gyroscope data, WiFi triangulation or fingerprinting data, GSM signature data, infrared or Bluetooth data, and ultrasonic audio data. Each additional sensor is an input into a Bayesian model that maintains an estimation of the current smartphone position and the uncertainty associated with the current estimation. Bayesian inference is a statistical method used to calculate degrees of probability due to changes in sensory input. In general, greater numbers of sensory inputs correlate with lower uncertainty.

In order to calibrate the light-based positioning system, a user equipped with a specific mobile application will need to walk around the specific area 801. The mobile application contains map 902 information of the indoor space, with the positions of the LED light sources 101 overlaid on the map. As the user walks around, they will receive ID codes 701 from the lights. When the user receives an ID code 701, they will use the map on the mobile app to select which LED light source 101 they are under. After the user confirms the selection of the light, the mobile application sends a request to the server 703 to update the light location contained in the lighting plan 1103 with the ID code 701. Additional user-provided 1104 metadata including but not limited to current WiFi access points, RSSI, and cellular tower information can also be included with the server request to update additional databases.

In addition to manual calibration, calibration of LED light source 101 locations can also be achieved via crowd-sourcing. In this algorithm, as mobile application users move around an indoor space receiving ID codes 701, they will send requests to the server 703 containing the light ID code 701 received, the current approximate position (based on other positioning techniques such as WiFi, GPS, GSM, and inertial sensors) and the error of the current approximation. Given enough users, machine learning algorithms on the server 703 can be used to infer the relative position of each LED light source 101. The accuracy of this calibration method depends heavily on the number of mobile application users.

Figure 11:
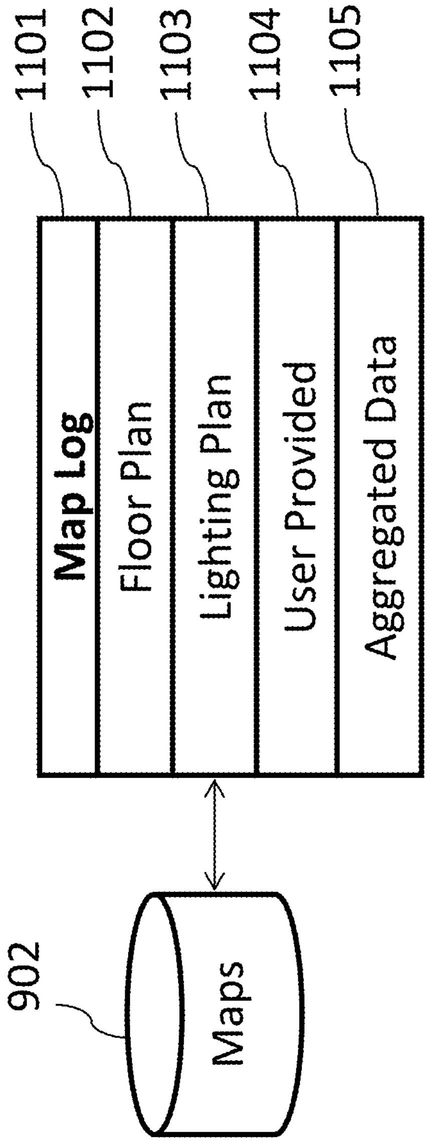
FIG. 11 illustrates the information contained in the Maps database.

FIG. 11 is a description of the maps database 902 and map log 1101 information containing floor plans 1102, lighting plans 1103, user-provided information 1104, and aggregated data 1105. Map log 1101 is a representation of the file structure that contains the information found inside the maps database 902. Information can come in the form of but is not limited to computer-aided drafting files, user-provided computerized or hand drawn images, or portable document formats. The information residing in the maps 902 database can be used both to calibrate systems of multiple LED light sources 101, and to augment the location data 702 that is sent to mobile devices 103.

Floor plan 1102 contains information about the floor plan for specific areas 801. The contained information can be in the form of computer-aided drafting files, scanned images, and legacy documents pertaining to old floor plans. The information is used to build a model corresponding to the most recent building structure and layout. These models are subject to changes and updates through methods including but not limited to crowd sourcing models where users update inaccuracies, third-party mapping software updates, and additional input from private vendors.

Lighting plan 1103 contains information about the physical lighting fixture layout, electrical wiring, and any additional information regarding the lighting systems in the area 801. This information can also come in a variety of physical and digital forms such as the floor plan 1102 information. The lighting plan 1103 information is used in the calibration process of assigning light ID codes 701 to physical coordinates within an area 801. In essence, a location with multiple LED light sources 101 acts as a large mesh network except, in this case, each node (light ID 701) is a non-networked beacon of information that does not know about its surrounding neighbors. To help make sense of multiple light ID codes 701, the lighting plan 1103 information is used as one of many ways to tell the backend server 703 where LED light sources 101 are located.

User-provided information 1104 contains additional data that the user manually uploads in regards to building changes, updates, or new information that is acquired. The user in this case is most likely the facility manager or staff member, but could also originate from an end user of the system who contributes via a crowd sourcing or machine learning mechanism. For instance, if an end user was using a light based positioning system in a museum and was unable to find a particular exhibit or noticed inaccurate information in regards to location or classification of the exhibit, they could red flag the occurrence using their mobile device 103. When coupled with data from additional users, sometimes known as a crowd sourcing method, this user-provided information 1104 can be used to update and repair inaccuracies in the maps 902 database.

Aggregated data 1105 contains information that is gathered by the system that can be used to augment the current information that is known about the mapping environment. This can occur during normal operation of the system where multiple mobile devices 103 are constantly sending and receiving location data 702 from the server 703. Over time the aggregation of this data can be used to better approximate how light ID codes 701 correspond to the physical locations of the LED light sources 101. For instance, if multiple mobile devices 103 consistently receive a new ID code 701, in a repeatable pattern with respect to additional known ID codes 701 and other sources of location information, then this information can be recorded and stored in the aggregated data 1105 database. This information can additionally be used to recalibrate and in essence "self-heal" a light-based positioning system.

Figure 12:
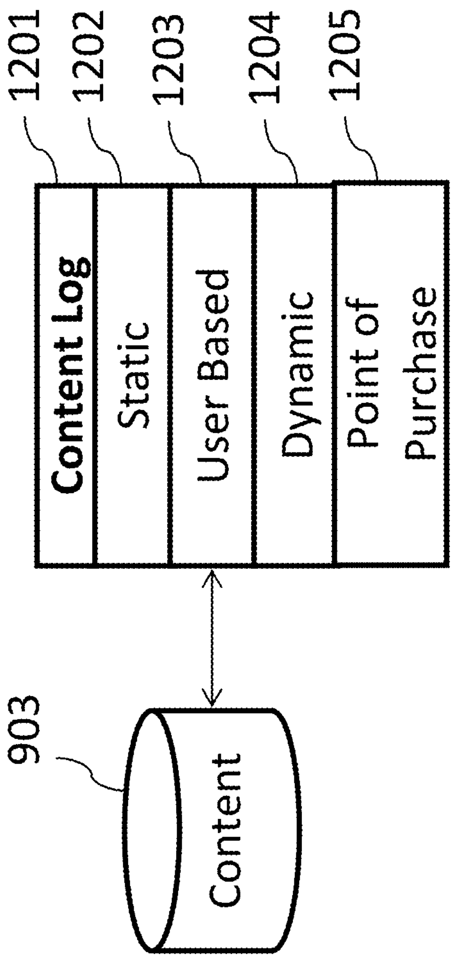
FIG. 12 illustrates the information contained in the Content database.

FIG. 12 is a description of the content database 903 and content log 1201 information containing static content 1202, user-based content 1203, and dynamic content 1204. Content log 1201 is a representation of the file structure that contains the information found inside the content database 903. Static content 1202 refers to unchanging information that is associated with the specific area 801. This can refer to the previous example where a facility manger loads specific content into the content 903 database before a user enters the specific area 801. This type of information can take the form of but is not limited to audio recordings, streaming or stored video files, images, or links to local or remote websites.

User-based content 1203 refers to content that is dependent on user criteria. The content can depend on but is not limited to user age, sex, preference, habits, etc. For instance, a male user might receive different advertisements and promotions than a female would. Additionally, age and past purchase habits could also be used to distinguish which is the correct piece of content to be presented to the user.

Dynamic content 1204 refers to content which changes with varying frequency. The content can change dependent on a temporal bases, daily, weekly, monthly, etc. For instance, seasonal marketing and content could be automatically presented to the user dependent on the month of the year, or content in the form of morning, evening, or nightly specials could be presented numerous times throughout the individual day.

In addition to content, point of purchase 1205 information can be delivered as well. This could be implemented by using the received ID code 701 to a secure connection which establishes and completes a transaction linked to a user's selected payment method. Additionally, a standalone point of purchase feature could be implemented by simply linking ID codes 701 directly to merchandise or services.

Figure 13:
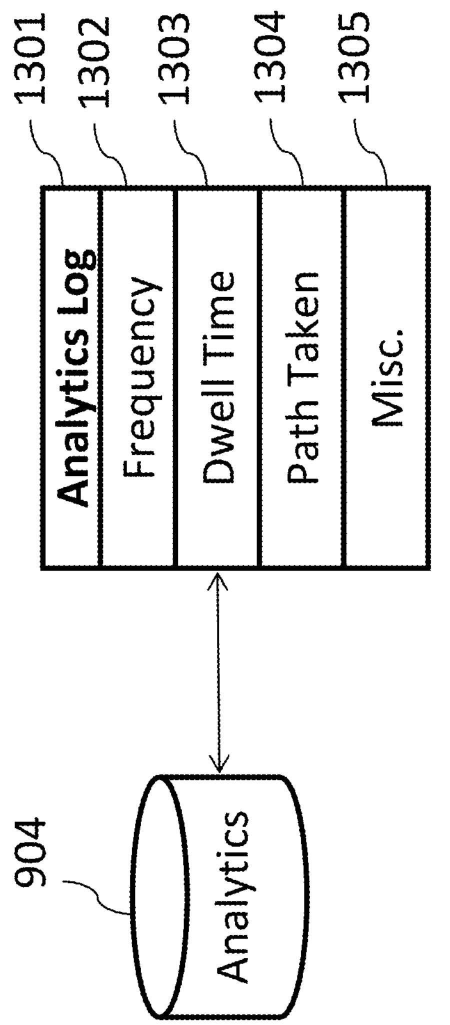
FIG. 13 illustrates the information contained in the Analytics database.

FIG. 13 is a description of the analytics database 904 and analytics log 1301 information containing frequency 1302, dwell time 1303, path taken 1304, and miscellaneous 1305. Analytics log 1101 is the file structure that contains the information found inside the analytics database 904. Frequency 1302 refers to the number of times each end user visits a particular location inside of a specific area 801. Separate records are maintained for individual users, and the frequency is aggregated and sorted in the frequency files database 904.

Dwell time 1303 refers to the time spent in each particular location inside a specific area 801. Separate records are maintained for individual users, and the dwell times are aggregated and sorted in the dwell time file. Path taken 1304 refers to the physical path taken by a user in each specific area 801.

Figure 15:
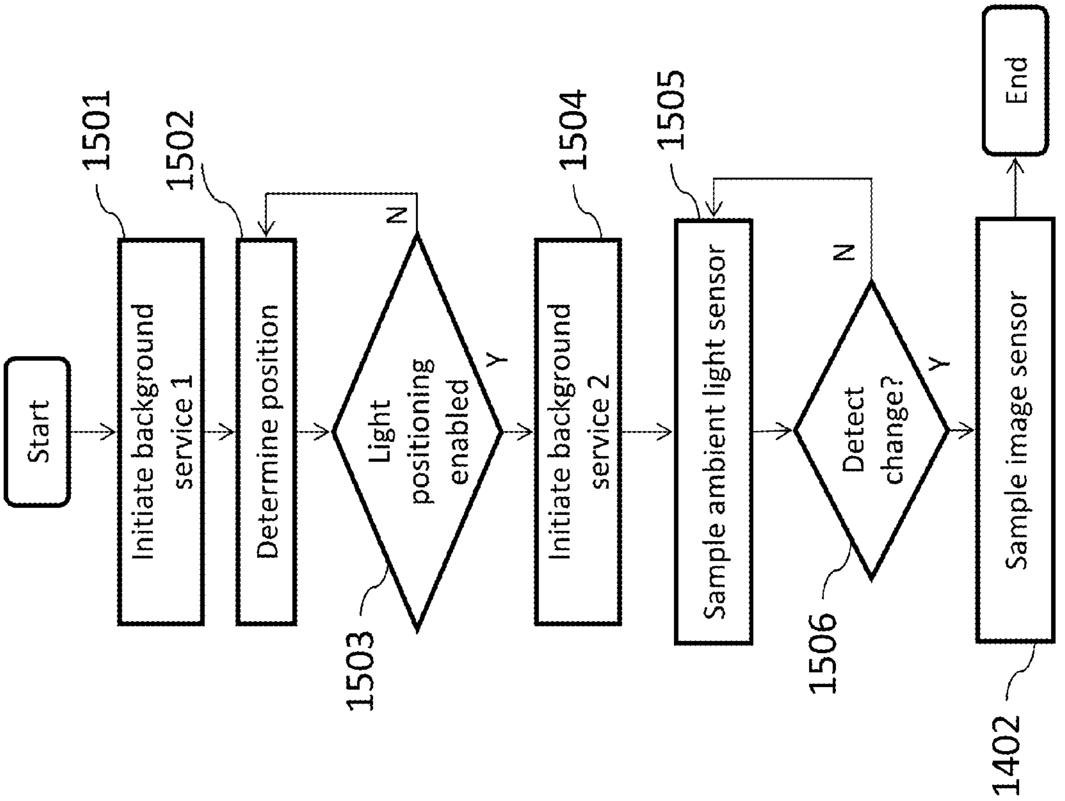
FIG. 15 is a process illustrating the background services and how they activate various sensors contained inside the mobile device.

Consider an example that combines many of the above descriptions, involving a store owner that installed a light-based indoor positioning system and a customer walking around the store using a mobile device 103 capable of receiving optically transmitted information. The customer drives to the parking lot of the store, parks, and walks in. Using the background sensors and location services available to her phone as modeled in FIG. 16, the customer's mobile device 103 already knows that she has approached, and most likely entered a store outfitted with a light-based positioning system. Once this information is known, the application running on the customer's mobile device 103 initiates several background services and begins to start looking for optical signals as depicted in FIG. 15.

Prior to the customer entering the store, the store owner has already calibrated and preloaded the database 802 with the unique LED light sources 101, map 902 information pertaining to the store floor plan 1102, user-provided 1104 product locations, and content 903 in the form of multimedia and local deals in the form of promotions that can only be activated by visiting that particular section of the store.

In the meantime, the customer is walking around the store looking to find particular items on her shopping list which she has already digitally loaded onto her mobile device 103. Next, the customer is prompted by her mobile device 103 that one of the items on her list has moved locations and an image of the store layout is displayed with a flashing icon indicating where her desired product has moved. The mobile phone can guide her to the new product. Then as soon as she gets close to the product, an informational video is prompted on her screen detailing the most popular recipe incorporating that product and how it is prepared. Finally, in addition to finding her desired product, the customer receives a discount promotion for taking the time to seek out the new location of the product.

In addition to the services offered by this system to the customer, the store owner now gains value from learning about the shopping experiences of the customer. This comes in the form of aggregated data that is captured and stored in the analytics 904 section of his store's database 802. This example is one of many applications that can be enabled with an accurate indoor light-based positioning system.

Figure 14:
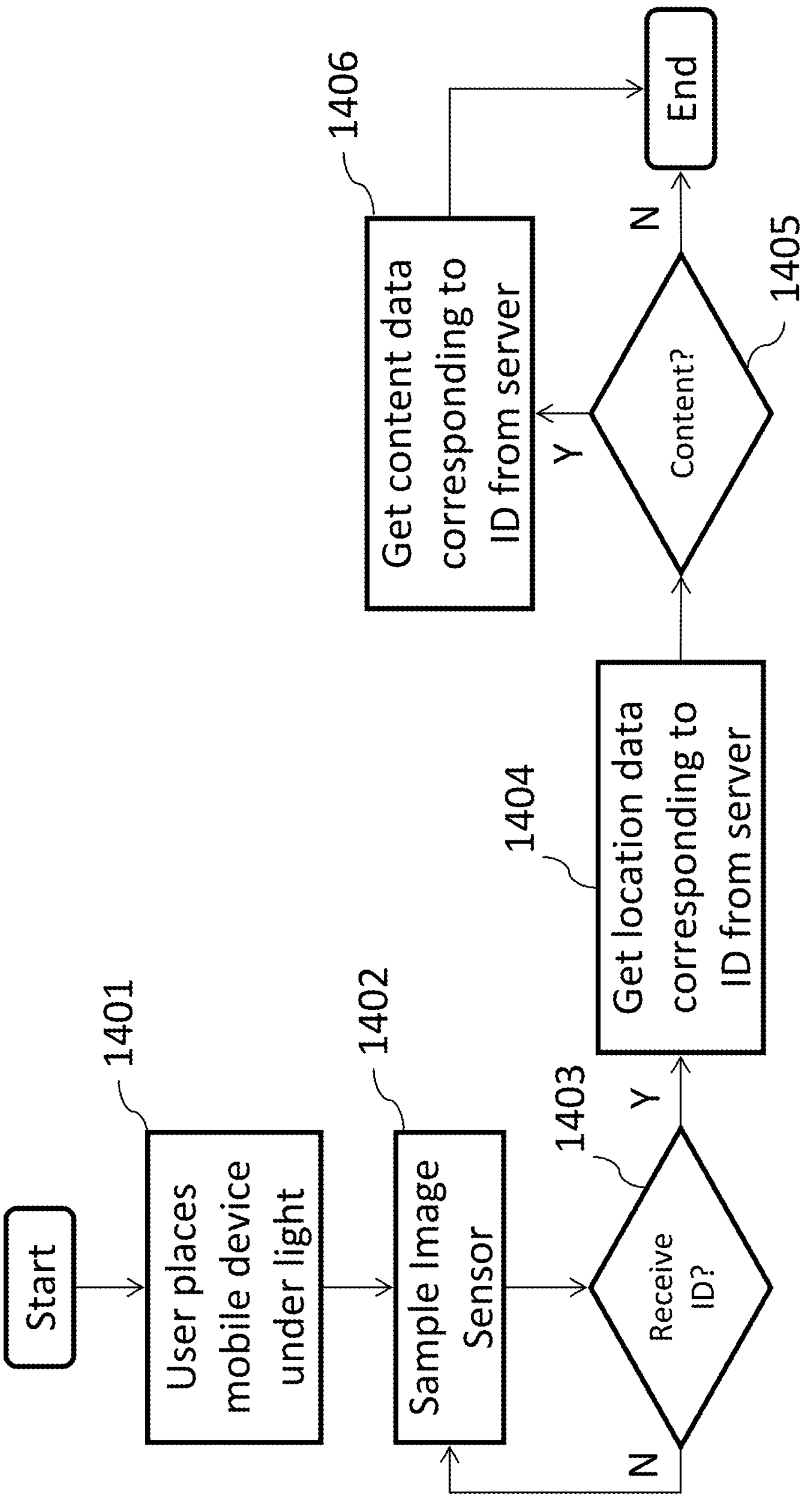
FIG. 14 illustrates the process of a mobile device receiving location and content information via a light-based positioning system.

FIG. 14 is a process describing the act of receiving location and content information through visible light. User places mobile device under light 1401 corresponds to the act of physically placing a camera equipped mobile device 103 underneath an enabled LED light source 101. The user stands approximately underneath or adjacent the LED light source 101, and the mobile device has the LED light source 101 in view of the camera lens.

The next block, sample image sensor 1402, refers to the act of turning on and reading data from the embedded image sensor in the mobile device 103. Receive ID? 1403 is a decision block which either moves forward if a location ID is received, or returns to sample the image sensor 1402. Get location data corresponding to ID from server 1404 occurs once a location ID has been received. The mobile device queries the server asking for location data 702 relevant to the ID code. This describes the process of a user obtaining an ID code 701 from a non-networked LED light source 101, and using the unique identifier to look up additional information from either the server 703 or a locally stored source.

Finally, content? 1405 is another decision block which determines if there is location-based content associated with the received ID code. If content is available the process continues on to the last block 1406 where the content is queried; if not, the process ends. As described above, the get content data corresponding to ID from server 1405 refers to the act of retrieving content data associated with a known location from either a server 703 or local source.

FIG. 15 is a process describing the act of turning on the application background services and determining when to sample the image sensor. Initiate background service 1 1501 is the primary background running service on the mobile device. This service is tasked with initiating a function that can communicate wirelessly to determine if the mobile device is close to an enabled area. The wireless communication includes radio frequency communication techniques such as global position system (GPS), cellular communication (e.g., LTE, CDMA, UMTS, GSM), or WiFi communications. Determine position 1502 is the function that periodically samples the wireless communication signal and based on distance parameters decides whether or not the mobile device is close enough to an area to move forward to the next service.

Light positioning enabled? 1503 is a decision block that moves forward if the mobile device is close to an enabled location, or repeats the previous function if not. Initiate background service 2 1504 is activated once the mobile device enters an enabled area. The service is tasked with initiating the functions that receive location information via the modulated light.

Sample ambient light sensor 1505 is the first function of the previous service which samples the ambient light sensor data as soon as the sensor detects a change. The function of this task is to determine if the sensor has gone from dark to light, if the user takes the device out of a pocket or enclosure, or from light to dark, the user has placed the device inside of a pocket or enclosure. As an alternative to sampling the light sensor, the algorithm could also look for a change in the accelerometer reading. This would correspond to the user taking the phone out of their pocket. Detect change? 1506 is the decision block that moves forward if the ambient light sensor has gone from dark to light, meaning that the mobile device is potentially in view of surrounding modulated light.

Figure 16:
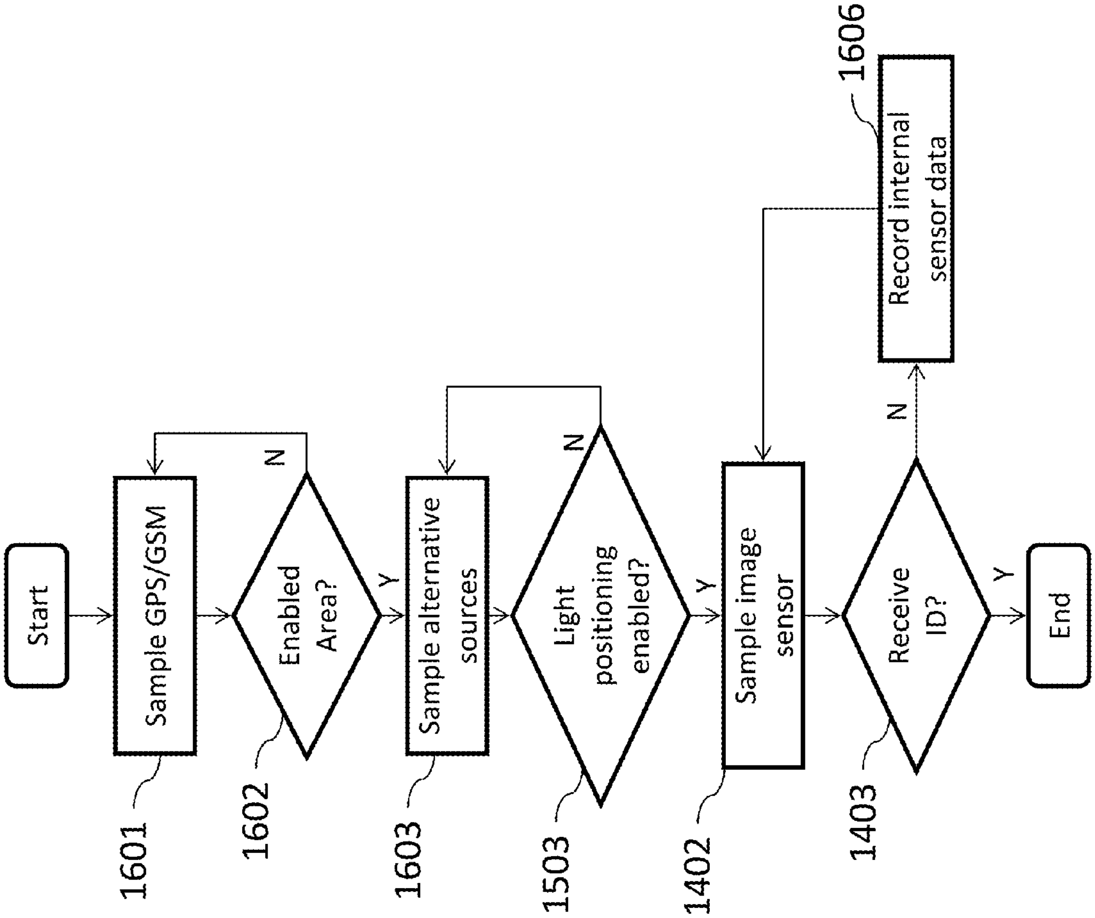
FIG. 16 illustrates the process of combining multiple information sources with a light-based positioning service.

FIG. 16 is a process describing the act of determining a mobile device's position using a variety of information sources. Sample GPS/GSM 1601 refers to the act of determining if the mobile device is close to an enabled area. Enabled area? 1602 is a decision block which moves forward if the mobile device is close to a enabled area, or returns to the previous block if not.

Sample alternative sources 1603 refers to the act of leveraging existing alternative positioning technologies such as WiFi, Bluetooth, ultrasound, inertial navigation, or employing an existing service using one or more of any available services. Record internal sensor data 1606 is a task which records the current accelerometer data for a period of time before returning to the Sample image sensor 1402 block. This task is performed so that location information is constantly being collected even when modulated light is not being detected. This allows the mobile device and/or server to keep track of the mobile device's position.

Figure 17:
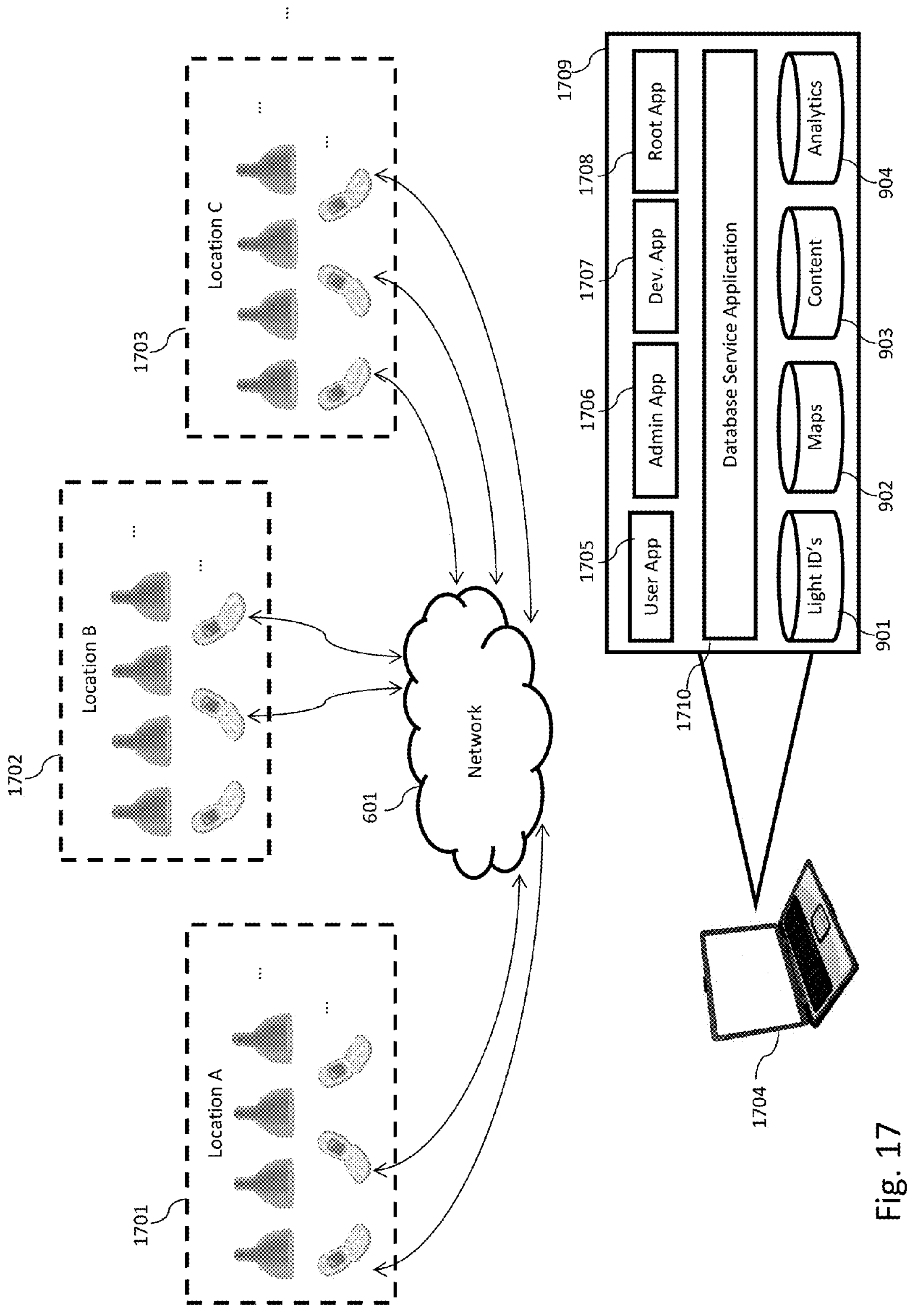
FIG. 17 illustrates how a client accesses multiple light positioning enabled locations with multiple mobile devices.

FIG. 17 is a system diagram describing how a client device 1704 interacts with a light-based positioning system 1709. Network 601 is a generic local or remote network used to connect mobile devices 103 contained in locations A 1701, B 1702, and C 1703 with the light-based positioning service 1709.

Each location contains multiple LED light sources 101, each of which broadcast unique identification codes 701. In order to interact with the system from an operator's perspective, a mobile device can use the database service application 1710 which contains multiple privilege levels for different levels of access. The client privilege level determines read/write permissions to each of these databases. These levels include users 1705 which refer to general front end system users, administrators 1706 which are usually IT or operations management level within an installation, developers 1707 which have access to the application programming interfaces of the system for use in custom application development, and root 1708 level which contains master control over the users and access to everything contained in the system and databases.

Mobile devices in each location 1701, 1702, and 1703 receive identification codes 701 from lights in their respective locations. They then send the received identification codes 701 through the network 601 which connects to database service application 1710, through user application 1705, and has read access to maps 902 and content, and write access to analytics 904. A generic client, 1704, connects to database service application 1710 through network connection 601.

The client uses a password authorized login screen to access the respective permission status. Clients with administrator permissions have read/write access to light IDs 901, read access to maps 902, read/write access to content 903, and read access to analytics 904. Clients with developer permissions 1707 have read access to light IDs, read access to maps 902, read/write access to content 903, and read access to analytics 904. A client with root permissions 1708 has read/write access to databases 901-904.

As an overview, FIG. 17 describes the top down approach to our current implementation of a light-based positioning system. At the highest level, known locations of installed non-network standalone LED light sources 101 are used to accurately identify the relative position of mobile devices 103. In order to obtain identification information from the lights, the background processes running on the mobile device 103 have been described in FIGS. 14, 15, 16. Once the mobile device has acquired a unique or semi-unique ID code 701 from the light or combination of lights, it uses this information to query a database 802 for additional information. This information can come in many forms, and is used to create a more personalized experience for the user. As initially mentioned, this local experience is used for location aware mobile computing, and augmented reality applications. In addition to local personalized information, location based analytics applications can be enabled from the aggregated data and traffic running through the server 703.

The use of light-based positioning capabilities provide a number of benefits. For example, the positioning information obtained by using light sources is highly precise compared to alternative techniques for positioning information. The accuracy of a light-based positioning system can be down to a few centimeters in three dimensions in some embodiments. This positioning ability enables a number of useful services to be provided. In certain embodiments, additional mobile device information can be used in combination with the positioning information. For example, accelerometer position information can be used in conjunction with light source based position to offer augmented reality or location aware content that relevant to the device's position. The relevant content can be displayed to augment what is being displayed on the mobile device or the display can provide relevant information. Applications on the mobile device can also be launched when the mobile device enters certain areas or based on a combination of criteria and position information. The applications can be used to provide additional information to the user of the mobile device.

The light-based positioning systems and methods can also be used to manage and run a business. For example, the light-based positioning can help keep track of inventory and to make changes to related databases of information. In a warehouse, for example, the light-positioning system can direct a person to where a particular item is located by giving directions and visual aids. The light positioning can even provide positioning information to direct the person to the correct shelf the item is currently residing on. If the person removes the item, the mobile device can update the inventory databases to reflect the change. The same function can be implemented in a store environment as merchandise locations are changed or updated. This information can then be used in providing content to a user. For example, if a shopper wants more information about an item, the updated location can be used to locate the item or direct the shopper to an online website to purchase an out-of-stock item. In some embodiments, the mobile device using the light-based positioning technique in conjunction with a wireless connection and other information can be used to provide non-intrusive data collection on customers. The data collection of how customers move through a store and where they spend time can be used to improve layout of stores and displays of merchandise.

The light-based positioning systems are also easy and low cost to setup compared to other location positioning systems. Since each light source operates autonomously, a building owner only needs to swap out existing light sources for those that provide light-based information to a camera enabled device. The light sources are non-networked independent beacons that broadcast identification codes configured when manufactured. This allows the light sources to be manufactured at a lower cost compared to networked light sources. Further, the non-networked independent beacon light sources in the light-based positioning system can be easier for building owners to install.

The light-based positioning system can also include optimizations in some embodiments. For example, location information obtained from either the identification code or from alternative techniques can be used to reduce latency in determining position information. This optimization can work through geo-fencing by constraining the search area to find information regarding the captured light sources more quickly. This can reduce the overall delay experienced by a user from the time the mobile device captures the light sources to when relevant position information is provide to the mobile device and/or relevant content is provided to the mobile device.

Efficient Light Bulbs for DPR Schemes

One of the biggest challenges facing beacon based light positioning systems is managing the additional power consumption of communication-enabled lighting devices in comparison to that of non-communicating devices. Lighting sources 101 in general, regardless of form factor or technology, are differentiated in part by their power consumption; generally, the less the better. Accordingly, higher energy efficiency is one of the core economic forces driving adoption of Light-Emitting-Diodes (LEDs). However, when using light sources 101 as a means for communication devices, the power requirements tend to increase depending on the modulation scheme since energy must be divided between the carrier wave and the modulation wave. There are many different techniques for transmitting data through light, as discussed in Prior Art such as U.S. Ser. No. 12/412,515 and U.S. Ser. No. 11/998,286, and U.S. Ser. No. 11/591,677. However, these techniques have majorly been pursued without considering their impact on light source 101 parameters, including efficacy, lifetime, and brightness. Since light sources 101 are first and foremost illumination devices, and not communication devices, the communication function takes a secondary role.

The present disclosure utilizes Digital Pulse Recognition (DPR) modulation as a technique for transmitting data while minimizing the impact on illumination devices.

Figure 18A:
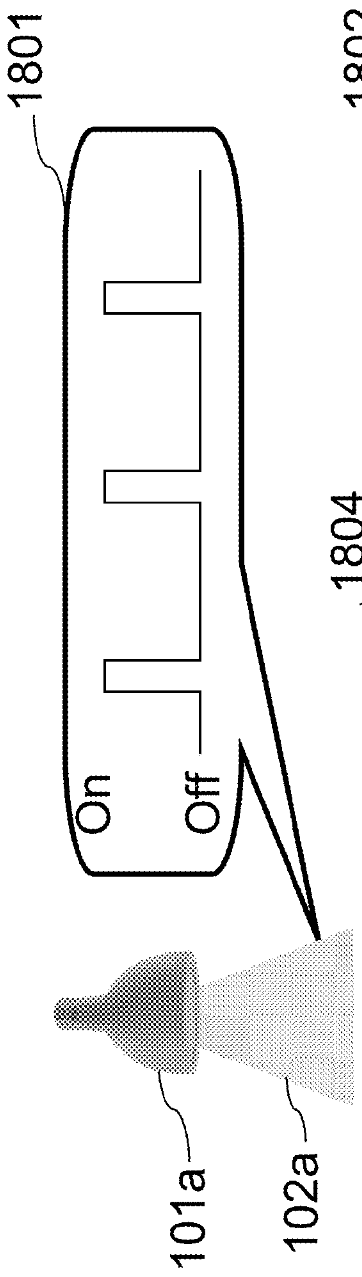
FIGS. 18A-C are representations of a light source undergoing pulse-width-modulation at varying duty cycles, according to some embodiments of the present disclosure.
Figure 18B:
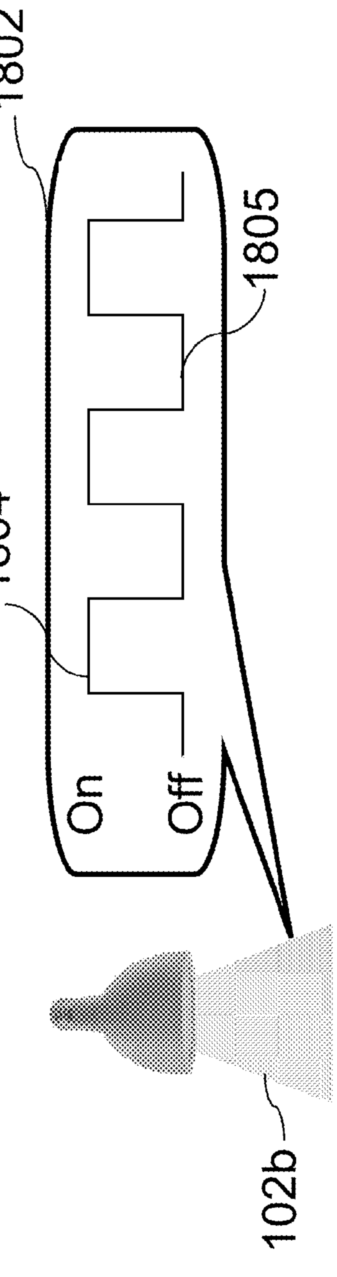
Figure 18C:
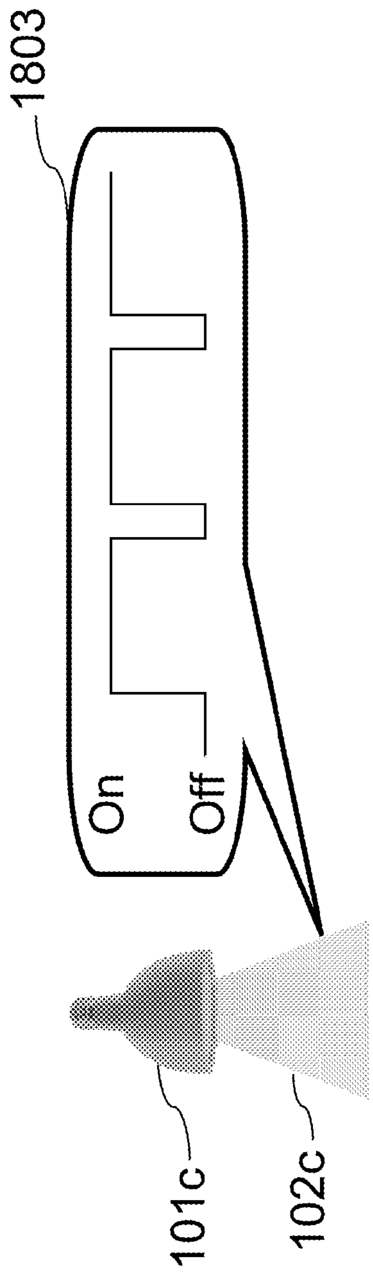

FIGS. 18A-C represent several digitally modulated light sources 101*a-c* with varying duty cycles; a low duty cycle 1801, a medium duty cycle 1802, and a high duty cycle 1803. A duty cycle is a property of a digital signal that represents the proportion of time the signal spends in an active, or "on," state as opposed to an inactive, or "off," state. A light source with a low duty cycle 1801 is inactive for a high proportion of time. A light source with a medium duty cycle 1802 is inactive for about the same proportion of time that it is active. A light source with a high duty cycle 1803 is active for a high proportion of time. The duty cycle of a light source affects the luminosity of the light source. A light source having a higher duty cycle generally provides more luminosity than that same light source with a lower duty cycle because it is on for a higher proportion of time. Duty cycle is one aspect of a modulation scheme. Other aspects include pulse shape, frequency of pulses, and an offset level (e.g., a DC bias).

Because DPR modulated light sources 101 rely on frequency modulation, they are able to circumvent the limitations of traditional AM based approaches. Note that frequency modulation in this context does not refer to modifying the frequency of the carrier (which is the light signal), but instead to modifying the frequency of a periodic waveform driving the light source. One popular technique for dimming LED light sources 101 is with pulse width modulation (PWM), which controls the average power delivered to the light source by varying the duty cycle of a pulse. In a DPR modulation system utilizing PWM, a DPR modulator would control the frequency of the pulses, with the duty cycle determined by the dimming requirements on the light source 101. As used herein, a DPR modulated light source, having a DPR modulation frequency, refers to a light source having an output modulated in such a manner that a receiver using DPR demodulation techniques can demodulate the signal to extract data from the signal. In some embodiments, the data can include information in the form of an identifier which distinguishes a light source from other nearby DPR modulated light sources. In some embodiments, this identifier may be a periodic tone that the light source randomly selects to identify itself. A periodic tone may be a signal that repeats with a given frequency. In other embodiments, a light source may receive such an identifier from an external source.

To determine the maximum duty cycle (D) supported by DPR demodulation, the modulation frequency (f) of the transmitter and the sampling time for the image sensor ($T_s$) of the receiver are first defined. Next the duty cycle parameters ($T_{off}$) and ($T_{on}$) are defined which correspond to the on and off times of the light source. $T_s$ is an important parameter because the image sensor sampling time defines a minimum amount of modulation time required to produce the banding effects which allow for the frequency detection required for DPR demodulation. The required modulation time can refer to either the $T_{on}$ portion 1804 or the $T_{off}$ portion 1805 of the signal, however to maximize the brightness of the light source $T_{off}$ is used as the limiting variable (if solving for the minimum duty cycle, $T_{on}$ can be used). If $T_s$ of the receiving device is less than twice $T_{off}$ of the light source, residual banding on the image sensor will not take place; therefore the signal cannot be extracted. In order for banding to occur, $T_s$ should be greater than twice the value of $T_{off}$ ($T_s>2*T_{off}$).

It is important to note that when designing for the maximum duty cycle, the modulation frequency can be defined from the transmitter side and can be completely independent of the sampling time $T_s$. This is because the sampling frequency $T_s$ is a property of the receiver which is defined by the image sensor manufacturer and is likely not designed for optimal DPR demodulation properties. $T_s$ varies depending on the specific image sensor, and can be expected to change as more advanced image sensors are developed. Therefore it is important to optimize such that a broad range of both modulation and sampling frequencies can be used. In the next sections the equations and variables for how to calculate the maximum duty cycle are described for a variety of test cases.

In order to solve for $T_{off}$ in terms of duty cycle and modulation frequency, one can first start with the fundamental definition of what the duty cycle is: 1 minus the ratio of signal on time divided by the combination of signal on and off time. In the case of a modulated light source, $D=1-T_{off}/(T_{on}+T_{off})$. Next the modulation frequency (f) can be defined as the inverse of the sum of signal on and off times: $f=1/(T_{on}+T_{off})$. Substituting f into the previous equation for D yields $D=1-f*T_{off}$. The variable $T_{off}$, which was previously defined as a value less than twice $T_s$, can then be used to define the maximum duty cycle for any given modulation used in DPR demodulation. After rearranging and substituting $T_s$ for $T_{off}$ ($T_{off}<0.5*T_s$), $D=1-f*(½)*(T_s)$. With this equation, we can now solve for the maximum duty cycle achievable given the modulation frequency of the transmitter, and the sampling time of the receiver.

Since the maximum duty cycle is dependent on both the modulation frequency of the transmitter and the sampling frequency ($F_s=1/T_s$) of the receiver, its exact percentage value can change depending on the present conditions. For testing purposes, the modulation frequency range was chosen to start at 300 Hz which is above the range which the human eye can see. The modulation frequency range may range from 60 Hz to 5000 Hz. Typical image sensor sampling frequencies ($F_s=1/T_s$) range between 20 kHz and 36 kHz for high quality image settings (640 by 480 pixel resolution), and 4 KHz to 7 KHz for low quality image settings (192 by 144 pixel resolution). In some embodiments, the image sensor sampling frequencies may range from as low as 1 KHz to as high as 1 MHz.

When analyzing specific use cases, the duty cycles corresponding to a modulation frequency of 300 Hz and sampling frequencies for high quality image settings in some embodiments result in D=1−(300 Hz)*(½)*(1/20 Khz)=99.25% and D=1−(300 Hz)*(½)(1/36 kHz)=99.58%. The duty cycles corresponding to a modulation frequency of 300 Hz and typical sampling frequencies low quality sampling frequencies in other embodiments result in D=1−(300 Hz)*(½)*(¼kHz)=96.25% and D=1−(300 Hz)*(½)*(1/7 kHz)=97.86%. In yet other embodiments, a 2000 Hz modulation frequency and high quality sampling frequencies of 20 kHz and 36 kHz results in D=95.00% and 97.22% respectively, and for low quality sampling frequencies of 4 kHz and 7 kHz results in D=75% and 85.71% respectively.

After the maximum duty cycle has been calculated, to compensate for the additional power requirements needed for data communication due to the off portion 1804 of the modulation signal, the input power can be increased such that the resulting average power of the communicating light source 101 is identical to the non-communicating light source 101. In effect the average power of the two light sources will be the same, yielding a perceivably identical luminous output. Take for instance LED source "A" which is powered by 6 Watts and modulated where 50% of the time it is "on", and the remaining 50% "off", effectively resulting in a 3 Watt average power. In order for this light source 101 to match the luminous output of the 6 Watt LED source "B" which is not modulating and is on 100% of the time, one can double the input power from 6

Watts to 12 Watts. While the input power of “A” was increased, the average power is halved to equal 6 Watts; therefore sources “A” and “B” appear to be identical to the human eye in terms of brightness.

However, there exists a point where increasing the input power can decrease the efficiency of a given light source 101. For LED lighting devices it is important to stay within the manufacturer specified voltage and more importantly current, otherwise efficiency drastically falls with increased supply current. This unwanted effect is known as LED “droop”, and generally refers to decreased luminous output for any given individual LED (assuming one or more LEDs per lighting source 101) due to the additional thermal heating resulting from the increased current. In the previous example, the input power to LED source “A” was doubled while the input power to “B” was left unchanged. Assuming that each source was supplied by a constant 12 Volts, this means that the input current to source “A” had to have doubled in order to achieve the required 12 Watts of power consumption. This equates to a 50% increase in current, when moving from 0.5 Amps to 1 Amp, and can only be performed if within the manufacturers' tolerable input current range for the LEDs.

Given inputs of drive current (Id) and operating voltage (V), we can define the power (P) of a non-modulated light source 101 as P=Id*V, and compare it with the additional required power ($P_{mod}$) of a modulated light source 101. To define the additional power needed due to modulation, you can then define the relationship as $P_{mod}$=P2–(D*Id*V). While the input variables used in this example vary from source to source, this method can be used to accommodate for power loss due to modulation.

We can now solve for the power required to support the maximum duty cycles that were previously solved for. In this example, the power consumed by the non-modulated light source equals P=Id*V=700 mA*12V=8.4 W. $P_{mod}$ can then be calculated to describe how much extra power is required to support a modulated light source 101 with regard to the duty cycle. Recall that for a modulation frequency of 2000 Hz and sampling frequencies of 20 kHz and 4 kHz, the maximum duty cycle equaled 99.25% and 96.25%. Therefore the additional power needed to detect a 2000 Hz signal at a sampling frequency of 20 kHz is defined as Pmod=8.4 W–(0.9925*700 mA*12V)=63 mW, a 0.75% increase in required power on top of the baseline 8.4 W. For 2000 Hz at a sampling rate of 4 kHz, $P_{mod}$=8.4–(0.9625*700 mA*12V)=315 mW, a 3.75% increase in required power.

While finding the maximum duty cycle supported by DPR demodulation is important for maintaining the brightest luminous output levels, it is also important to support the lowest duty cycle possible in order to support the dimmest luminous output levels. This is because the minimum duty cycle corresponds to the dimmest level that a modulated light source 101 can operate at while still supporting DPR demodulation from a receiving device. In order to account for this, we now consider the $T_{on}$ portion of the signal rather than $T_{off}$. The limiting sampling factor now changes to require that $T_s$ is greater than twice $T_{on}$ ($T_s>2T_{on}$). Substituting this condition into the previous max duty cycle equation (replacing {1-D} with D), the resulting equation yields D=(½)*f*$T_s$.

Repeating the above examples for a modulation frequency of 300 Hz and high quality sampling frequencies ($1/T_s$) of 20 kHz and 36 kHz, D=0.75% and 0.42%, respectively. For a modulation frequency of 2000 Hz with high quality sampling frequencies, D=5.00% and 2.78%. Considering lower quality sampling frequencies at 300 Hz and 2000 Hz, D=3.75% and 2.14% for a 300 Hz modulation frequency, and D=25.00% and 14.29% for a 2000 Hz modulation frequency.

Figure 19A:
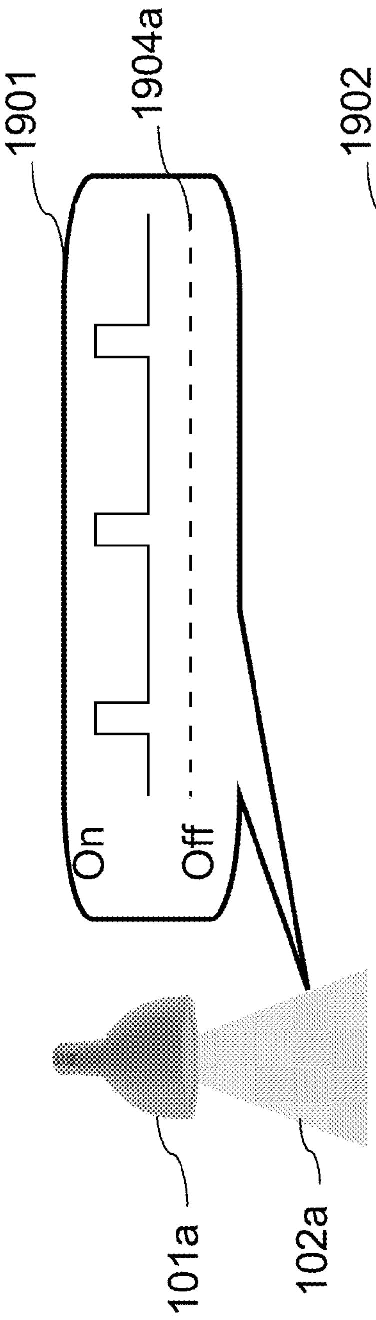
FIGS. 19A-C are representations of a light source undergoing pulse-width-modulation at varying duty cycles with a DC offset, according to some embodiments of the present disclosure.
Figure 19B:
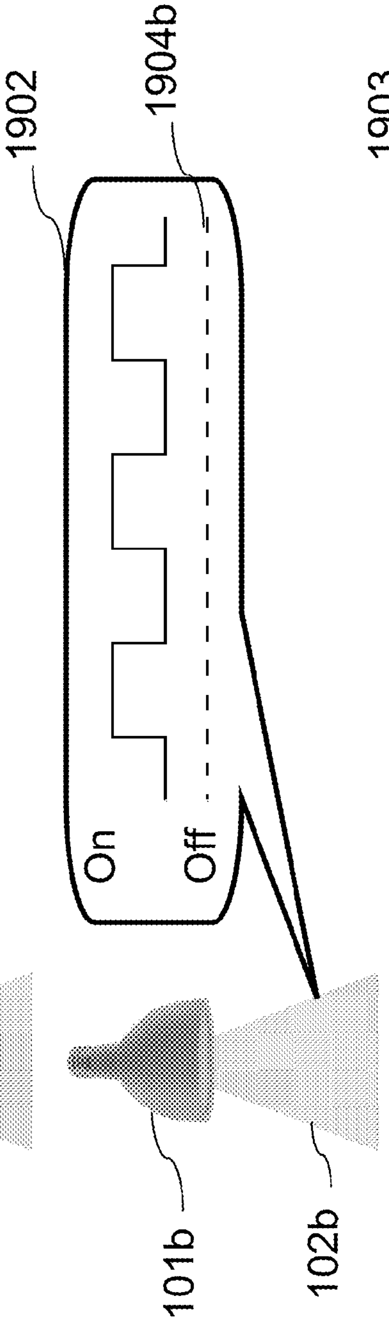
Figure 19C:
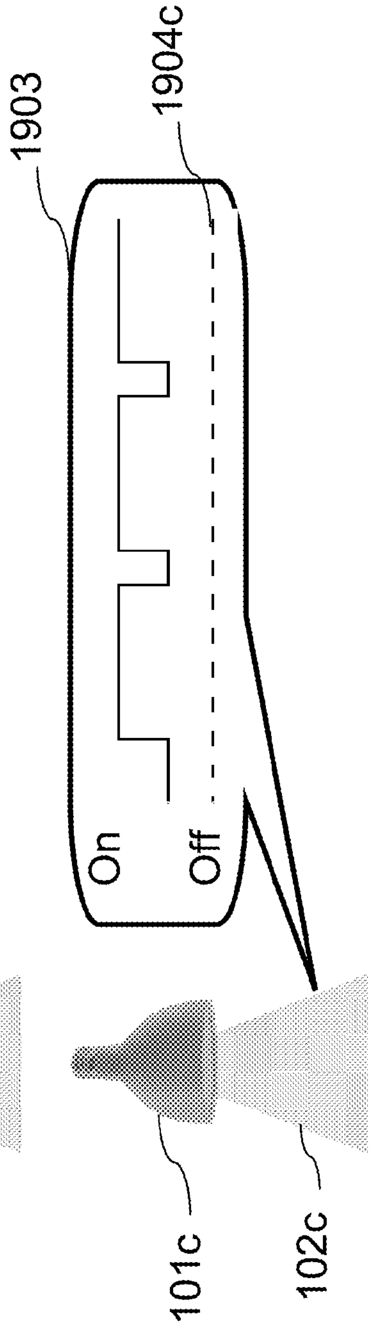

In addition to modifying the overall duty cycle, there also exists the opportunity to tune the modulation scheme such that during the “off” portion 1805 of operation the light source 101 does not turn completely off As described in FIGS. 19A-C, modulation schemes 1901, 1902, and 1903 depict varying duty cycles where a DC bias 1904 has been added which correspond to the modulated light sources 101*a*-101*c*. Modulation schemes where the light source 101 does not turn all the way “off” are important when considering light source 101 brightness, efficiency, lifetime, and the signal to noise ratio (SNR) of the communications channel. The DC bias 1904 during modulation reduces the peak power required to drive the light source for a given brightness. A reduction in peak power will reduce the negative impact of overdriving the lighting source, which is known to cause efficiency losses known as “droop” for LEDs, in addition to decreasing light source 101 lifetimes.

As an example, consider that the average power delivered to the light source is defined as: $P_{av}$D*$P_{on}$+(1–D)*$P_{off}$, where D is the duty cycle and $P_{on}$, $P_{off}$ off are the respective on/off powers. The impact on light source 101 brightness is that increasing the “off” power will increase the total power. This reduces the required peak power delivered to the lighting source, because the power transferred during the “off” period can make up the difference. In a system operating at a duty cycle of 50%, for a fixed brightness B, a 10% increase in the “off” period power translates to a 10% decrease in the “on” period power.

When approaching the above power equation from a constant voltage (V), average current ($I_{av}$), and on/off current ($I_{on}/I_{off}$) standpoint (P=IV), $I_{av}$*V=D*$I_{on}$*V+(1-–D)*$I_{off}$*V. After removing the constant V, $I_{av}$=D*$I_{on}$+(1–D)$I_{off}$. For example, in the case of a light source 101 requiring an average drive current ($I_{ave}$) of 700 mA and off current of ($I_{off}$) of 0 A undergoing modulation with a duty cycle (D) of 96.25%, the peak current ($I_{on}$) requirement is $I_{on}$=700 mA/0.9625=727 mA. If instead the current delivered during the “off” time is 100 mA the average current reduces to $I_{av}$=0.9625*700 mA+(1–0.9625)*100 mA=678 mA, a 6.7% decrease in overall required power given constant voltage. In other embodiments, a constant current may be applied with differing voltages to achieve a similar effect.

The impact of non-zero $I_{off}$ values for the previous example is two-fold. First, a reduction in required power is achieved, and second increasing the “off” time power lowers the required duty cycle to achieve a fixed brightness level. For the previous example when solving for D, D=($I_{av}$–$I_{off}$)/($I_{on}$–$I_{off}$). The difference in duty cycle can now be determined for the reduction in peak current from 727 mA to 678 mA, as D=(700 mA–100 mA)/(727 mA–100 mA)=95.69%, which is a 0.56% difference from 96.25%. This essentially allows for a brighter light source 101 with a decreased duty cycle, and lower power requirements.

Another major requirement for DPR modulation is to interface with existing light dimmers. There are a variety of light source 101 dimmers employed on the commercial market. One popular dimming technique is triac dimming. In a triac dimmer, a variable resistor switch is used to control the amount of power delivered to the light source 101 over the AC line. For traditional incandescent and fluorescent sources this is a cost effective and efficient way to control the power, and thus the brightness, delivered to the light source 101. For LED light sources 101, it is necessary to put a special driver between the triac dimming circuit and the LED source. This is because LEDs are current driven devices, and thus require an AC/DC converter to transform AC from the power lines to a DC current for driving the LEDs.

Figure 20:
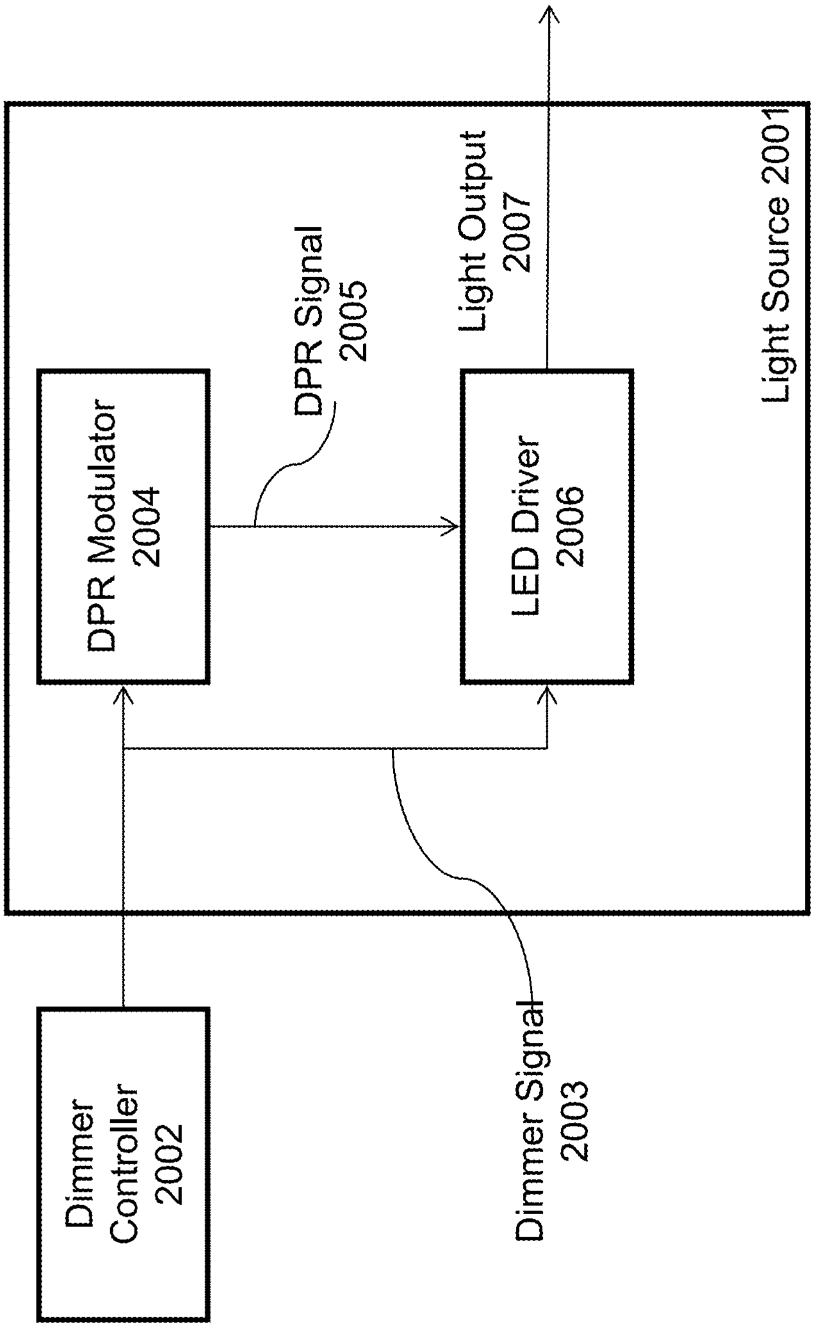
FIG. 20 is a block diagram of a DPR modulator with a dimming control system for a light source, according to some embodiments of the present disclosure.

FIG. 20 demonstrates a system by which a DPR modulator can interface with existing lighting control circuits. A dimmer controller 2002 sends a dimmer signal 2003 to a dimmable LED driver 2006. In the case of an LED light source controlled by a triac dimmer, the dimmer signal would be transmitted across the AC power line. The dimmable LED driver 2006 then converts the dimmer signal to a pulse width modulated signal used for driving the light output 2007 of the source 2001. The configuration of the system diagram shows the dimmer signal 2003 going to both the DPR modulator 2004 and the LED driver 2006, however this does not always need to happen. In some instances the LED driver 2006 can contain a "master override" input which is designed to supersede any dimmer signal 2003 input. In this case the dimmer signal 2003 still goes to the LED driver 2006, but is ignored. In other cases where there is not an override input, the dimming signal only goes to the DPR modulator.

DPR modulator 2004 is responsible for sending DPR signals 2005 to the LED driver 2006 which controls the light output 2007. In the case of the light source 2001 being driven by pulse width modulation as the dimmer signal 2003 from the dimmer controller 2002, DPR modulator 2004 controls the frequency of the PWM signal and selects the desired value. The width of pulses in signals 1801-1803 are determined based on dimmer signal 2003, which indicates the desired light source 2001 brightness level. Note that the dimmer controller 2002 is not contained within the light source 2001, and can output a variety of dimmer signals 2003 (triac, or a proprietary method). Because of this, the DPR modulator 2004 is responsible for interpreting these different signals and appropriately outputting a DPR signal 2005 which corresponds to the desired brightness level of the inputted dimmer signal 2003. In cases where dimming is not required and the dimmer signal 2003 is not present, the DPR modulator 2004 interfaces directly with the LED driver. In some implementations, the DPR modulator 2004 can also be contained inside the LED driver 2006 as part of an integrated solution instead of as a separate component.

Figure 21:
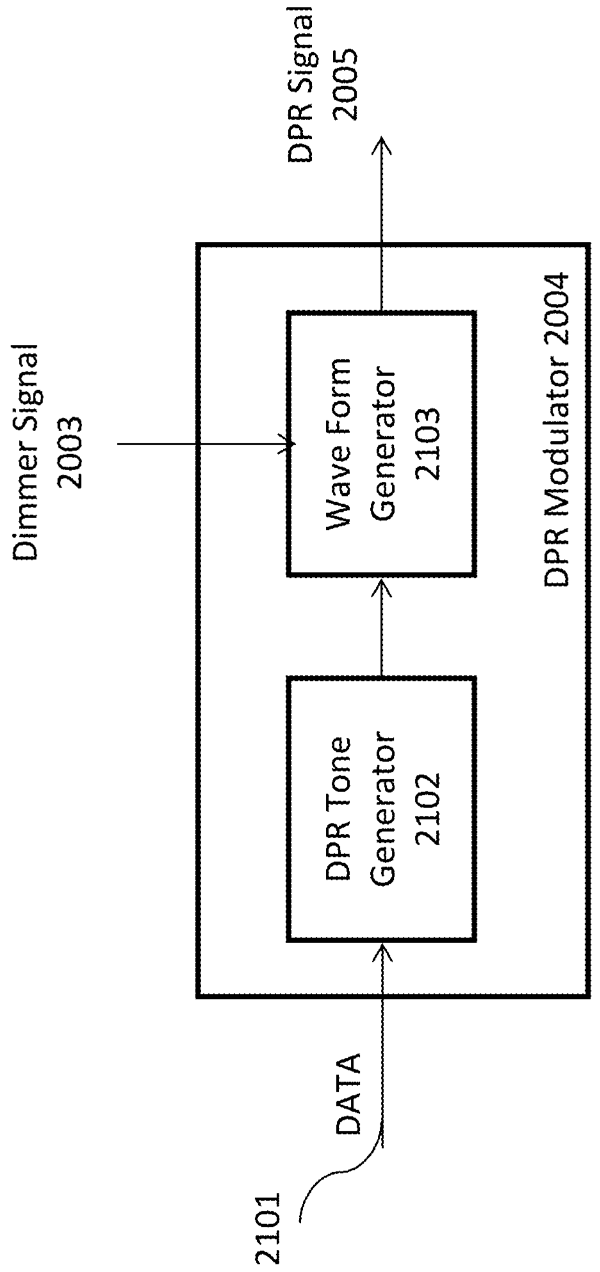
FIG. 21 is a representation of a block diagram of a DPR modulator, according to some embodiments of the present disclosure.

FIG. 21 contains a high level overview of a DPR modulator 2004. Data 2101 is first sent to DPR tone generator 2102. Data 2101 could contain information from any source. In the context of a beacon based light positioning system, data can include the identifier for the light. DPR tone generator 2102 converts the data 2101 into a sequence of DPR tones. A DPR tone is a periodic digital signal that oscillates between active and inactive states with a particular frequency. This process is described further in FIG. 22. Depending on the requirements of the data transmission channel, this could either be a single tone (suitable for a beacon based positioning system using light identifiers), or a sequence of tones (if higher data rates are desired by the end user). The DPR Tone(s) 2203 are then sent to the waveform generator 2103, which is responsible for generating the DPR signal 2005 for driving the LEDs. Waveform generator 2103 receives a dimmer signal 2003 input from a dimmer controller 2002, which controls the brightness of the light source. In the case of a DPR tone as a pulse-width-modulated signal, dimmer controller 2002 would control the duty cycle of square wave 1802, while DPR Tone(s) 2203 would control the frequency of the square wave. The result is an output DPR signal 2005, which is then sent to the LED driver 2006.

Figure 22:
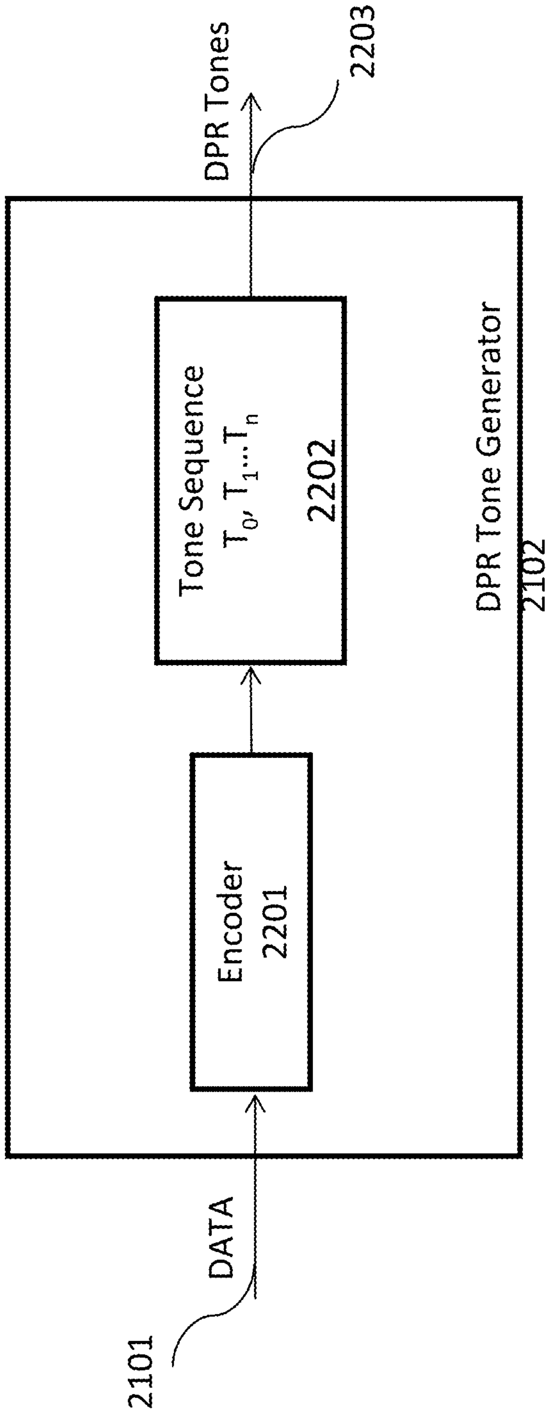
FIG. 22 is a block diagram of an encoder for DPR modulation, according to some embodiments of the present disclosure.

FIG. 22 contains a breakdown of DPR Tone Generator 2102. This module is responsible for taking a piece of data and converting it to a sequence of DPR tones. A DPR tone determines the frequency at which a waveform, such as the square waves from FIG. 18, is sent. The range of possible tones, defined here in as $T_o$ through $T_n$, is determined by both the sampling time, $T_s$, of the image sensor (as discussed in paragraph 0006), and the frequency response of the light source 101. Encoder 2201 is a standard base converter—it takes a piece of data in binary and converts it into a corresponding DPR tone. A typical range for tones created by DPR Tone Generator 2102 is 300 Hz-2000 Hz, in steps of 10 Hz, allowing for 170 distinct DPR tones. The step size between tones is selected to reduce noise, and depending on the requirements could be much higher or lower than 10 Hz. As an example, that data 2101 may contain an identifier of value 10 for light source 101. This identifier is passed to Tone(s) Generator 2102, which generates (or selects from memory) a sequence of tones. Note that the length of a DPR tone sequence could be as low as 1 (in the case of a single tone used in a beacon based positioning system). In this example, an identifier of 10 would map to a DPR tone of 400 Hz. DPR Tone Generator 2102 could either store the identifier in memory beforehand, using pre-computed mappings of data to tone sequences, or alternatively it could compute this on the fly. The exact method of generating the sequence of tones would be driven by the resources available on the light source 101. Once one of the possible tones sequences 2202 is created, it is sent to Waveform Generator 2103.

Figure 23:
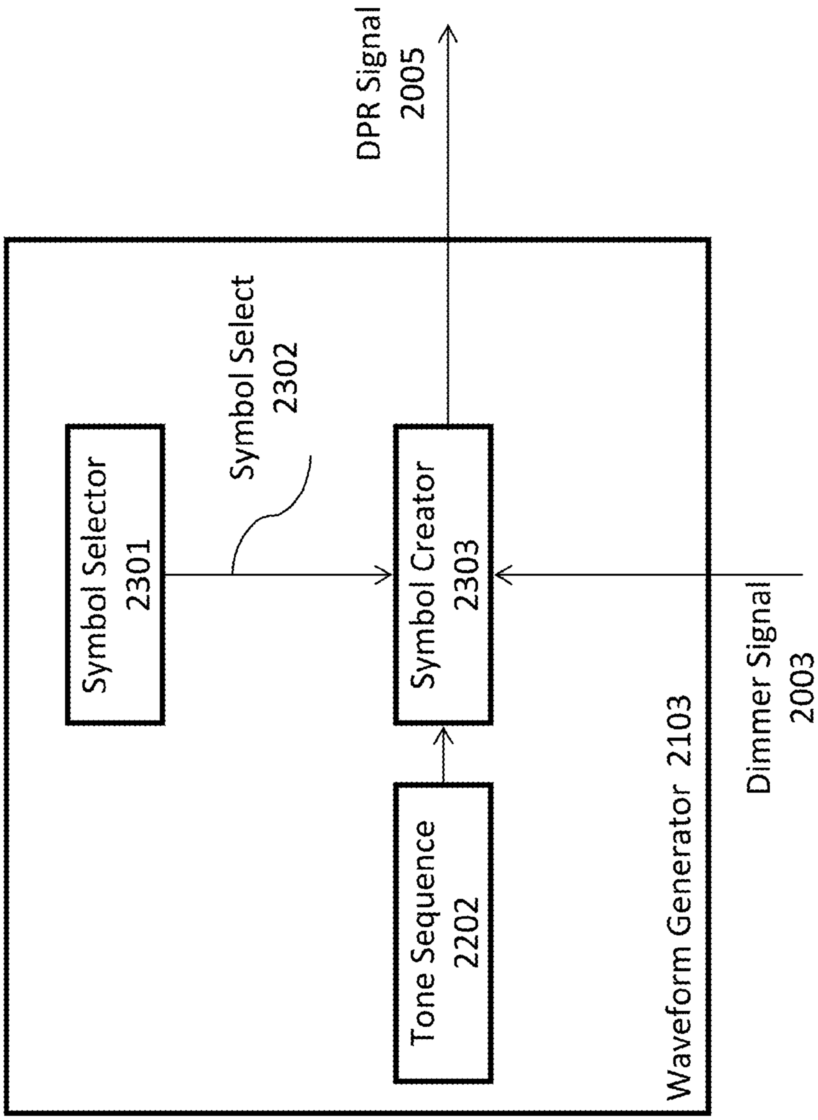
FIG. 23 is a block diagram for a waveform generator for DPR modulation, according to some embodiments of the present disclosure.

FIG. 23 contains the breakdown of Waveform Generator system 2103, which combines a tone sequence 2202 with a waveform from symbol creator 2303 and dimmer signal 2003 to create a DPR signal 2005 for driving light source 101. The resulting waveform will be periodic, with a frequency defined by the sequence of tones, a symbol created based on the list of possible symbols in symbol creator 2303, and an average output (brightness) determined by the dimmer signal 2003. This desired brightness could either be hard-coded on the module, or provided as an external input through a dimming control module. The choice of a symbol is determined within Symbol Selector 2301, which generates a control line 2302 for selecting a symbol from symbol mux 2402.

Figure 24:
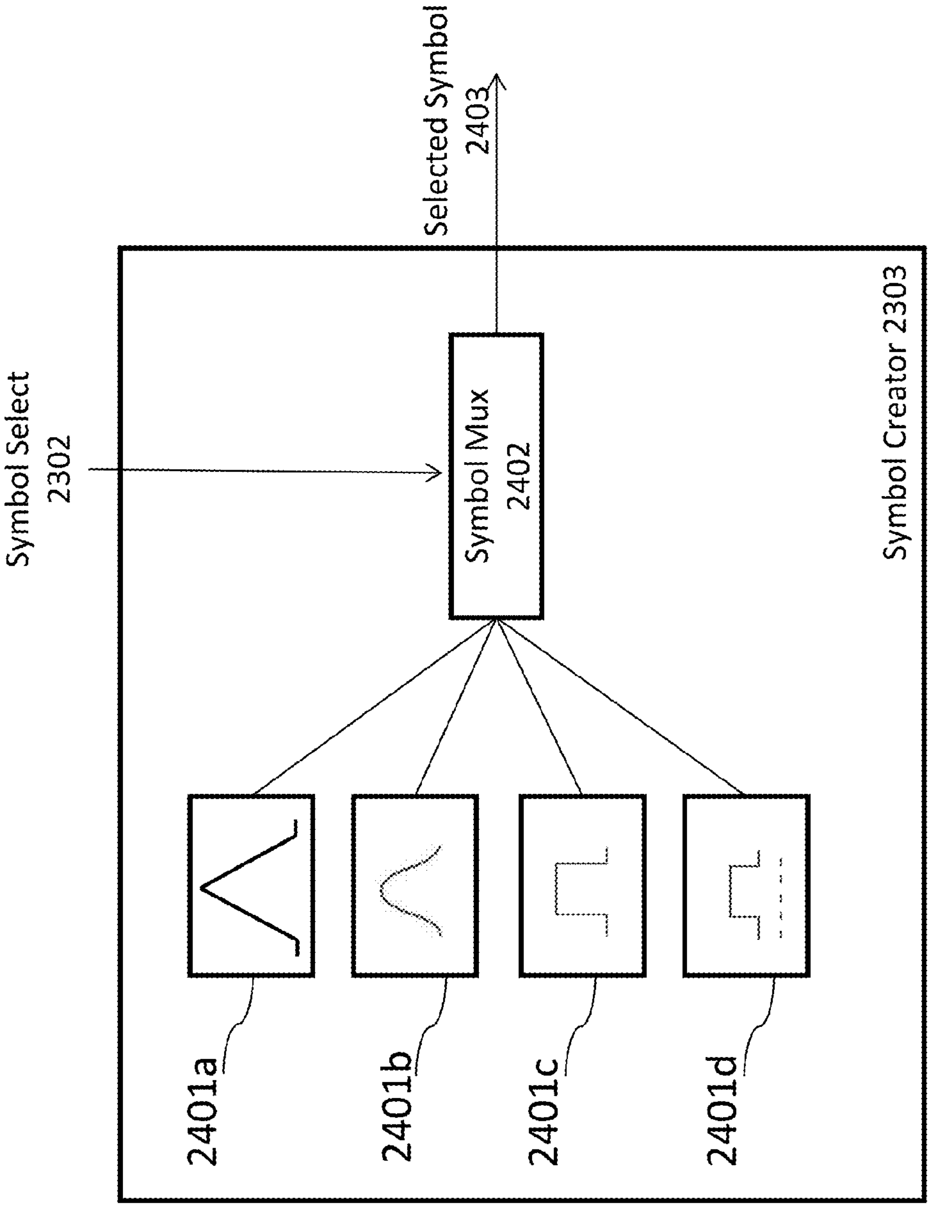
FIG. 24 is a block diagram of a symbol selector system module, which is used to select an appropriate symbol for use in DPR modulation, according to some embodiments of the present disclosure.

FIG. 24 contains the breakdown of Symbol Creator 2303, which holds possible symbols 2401*a*-2401*d*. These could include a saw tooth wave 2401*a*, sine wave 2401*b*, square wave 2401*c*, and square wave with a DC offset 2401*d*, or any other periodic symbol. Symbol creator then takes in a selected symbol 2402, and modifies it such that a desired brightness 2106 is achieved. In the case of a square wave symbol 2401*c*, dimmer signal 2003 would modify the duty cycle of the square wave. The resulting waveform is then sent to output signal 2005 for driving the light source.

The goal of the output waveform 2105, which drives light source 101, is to illuminate a scene in such a way that the DPR modulated signal can be picked up on any standard mobile device 103. Reducing flicker on video which is under illumination from fluorescent lamps is a well-known problem. The flicker is caused by periodic voltage fluctuations on the AC line powering the lamp. For a lamp powered by a 50 Hz AC line, the luminance level changes at 100 Hz. This causes alternating white/dark bands to appear in video recorded with CMOS imagers. The bands are a result of the rolling shutter mechanism on CMOS imagers, which partially expose different areas of the image at different points in time. The lines on the image can occur on both, one, or on multiple frames, and may appear to move in time. See, for example, U.S. Pat. No. 6,710,818, the entire contents of which is hereby incorporated in its entirety, which describes methods for detecting and removing this unwanted effect. Possible algorithms for mitigating flicker include automatic exposure control, automatic gain control, and anti-banding. These techniques are common in many mobile devices as a means to remove flicker caused by fluorescent lamps.

Advanced DPR Demodulation Techniques

DPR demodulation, instead of removing flicker, exploits the rolling shutter effects of CMOS cameras as a means of transmitting data. A CMOS device with a rolling shutter captures an image frame by sequentially capturing portions of the frame on a rolling, or time-separated, basis. These portions may be vertical or horizontal lines or "stripes" of the image that are captured at successive time intervals. Because not every stripe is captured in the same time interval, the light sources illuminating the image may be in different states at each of these time intervals. Accordingly, a light source may produce stripes in a captured frame if it is illuminated in some time intervals and not illuminated in other time intervals. Light sources that broadcast digital pulse recognition signals may produce patterns of stripes. Since the pattern of stripes is dependent on the frequency of the digital pulse recognition signal, and the speed of the rolling shutter can be determined a-priori, image processing techniques can be used to deduce the illumination frequency based on the width of the stripes. For example, consider a room containing five light sources 101, each broadcasting at 500 Hz, 600 Hz, 700 Hz, 800 Hz, and 900 Hz, respectively. Each distinct frequency, otherwise known as a DPR tone, can be used to identify the light source 101. In a beacon based light positioning system, a mobile device receiver within view of the transmitting lights can detect the DPR tones, correlate an identifier associated with the tone, and then use a lookup table to determine the location of the device based on the location associated with the identifier(s).

Figure 25:
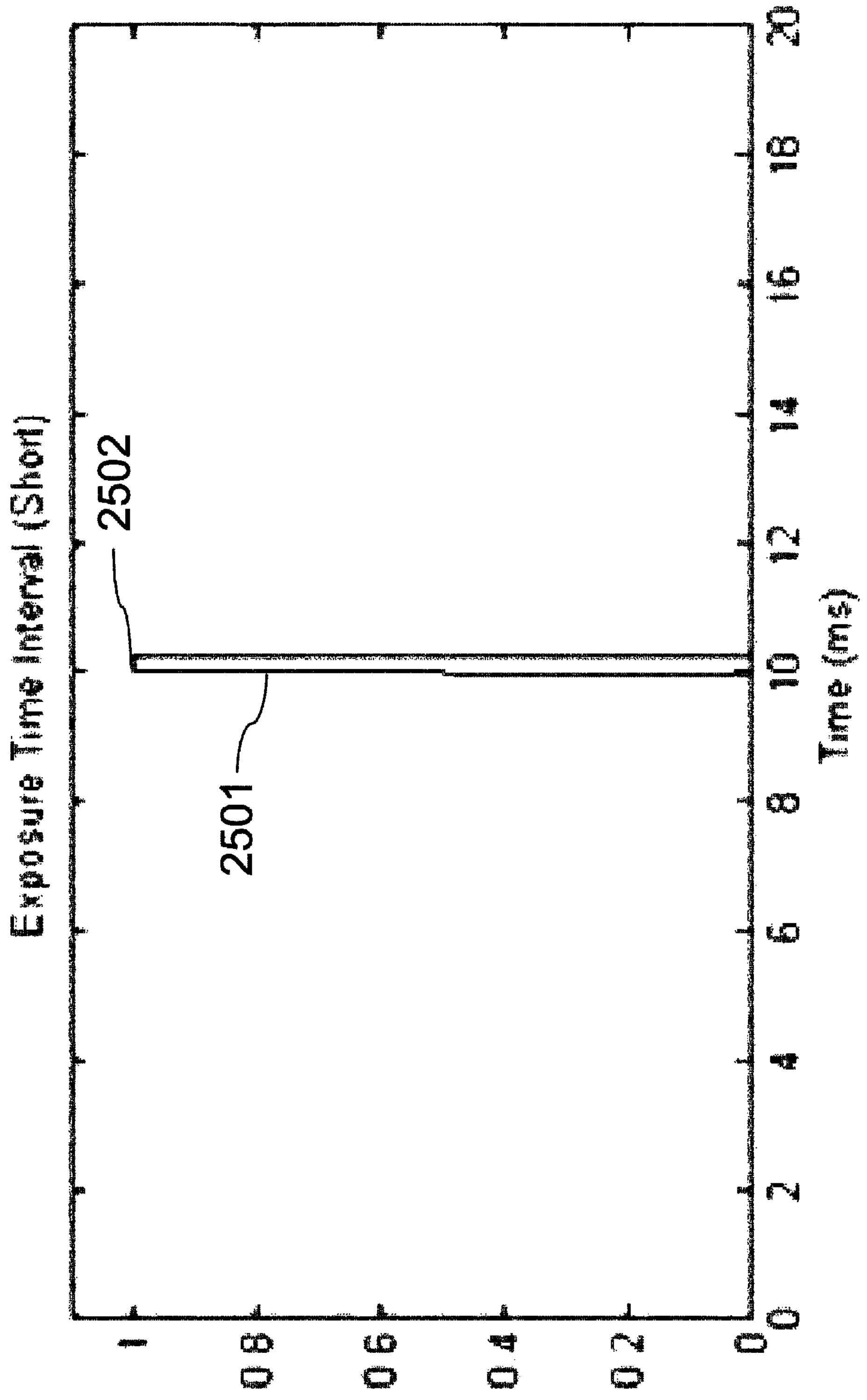
FIG. 25 is a plot of a camera sampling function, according to some embodiments of the present disclosure.

Modeling the camera sampling function is essential to understanding how DPR demodulation works on modern image sensors, and how the impacts of various hardware-dependent parameters affect the DPR signal 2105. To represent this, FIG. 25 is a continuous time representation 2501 of how an individual row on a rolling shutter image sensor is sampled. The exposure time interval 2502 represents the period over which light accumulates on the photo sensor. If the exposure time is much lower than the period of the DPR modulated signal, the light and dark bands will be clearly defined. If the exposure time is longer, the light and dark bands will lose their definition.

Figure 26:
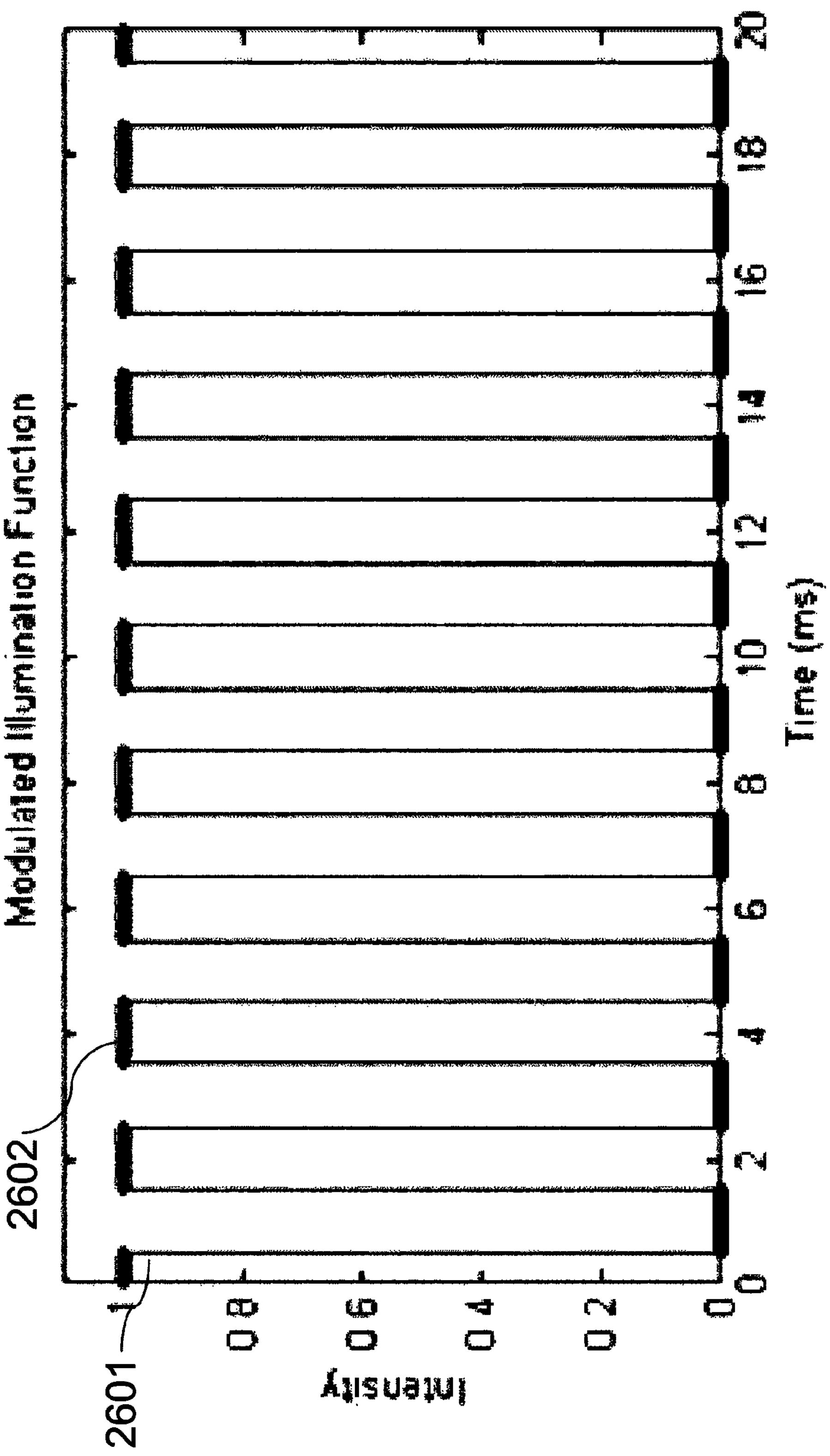
FIG. 26 is a plot of a modulated illumination function undergoing DPR modulation at a frequency of 300 Hz, according to some embodiments of the present disclosure.

FIG. 26 contains a continuous time example 2601 of a DPR modulated light signal. In this example, the signal is a square wave with a 50% duty cycle being driven at a DPR tone of 300 Hz. The relationship between the DPR illumination period 2602 and the exposure time 2502 determines how well defined the bands are on the received image.

Figure 27:
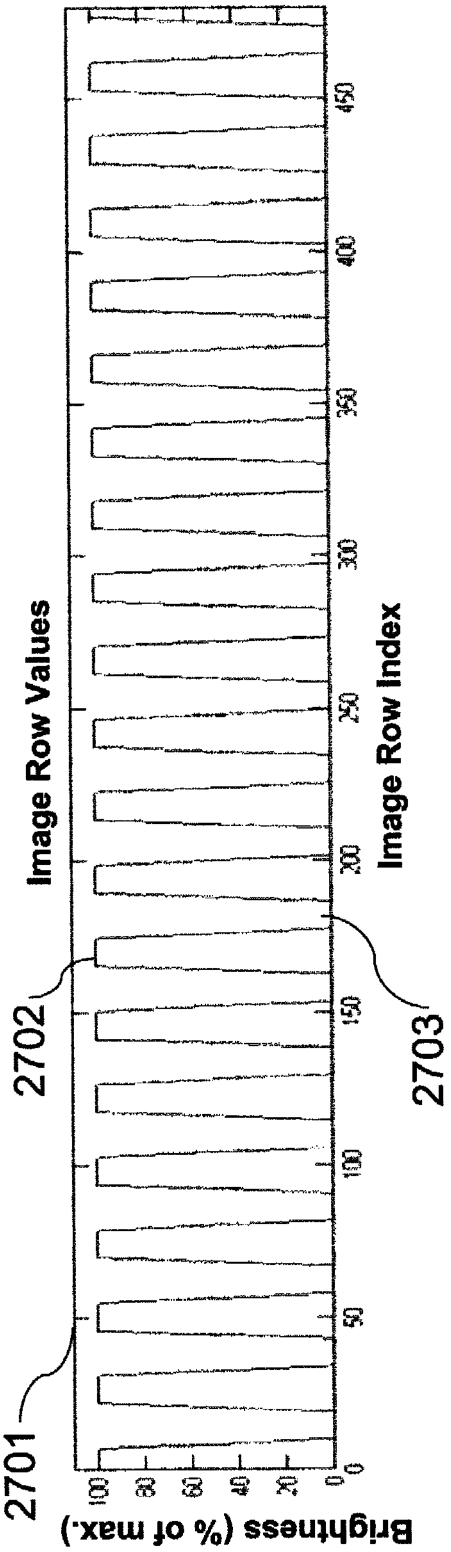
FIG. 27 is a plot of a convolution of a camera sampling function and a DPR modulated light signal, according to some embodiments of the present disclosure.

FIG. 27 is the continuous time sampled image 2701, created by convolving an individual row sampling function 2501 with a DPR modulated signal 2601. The alternating periods of high brightness 2702 and low brightness 2803 are caused by the DPR modulation frequency, and appear as alternating white/dark bands on the received image.

Figure 28:
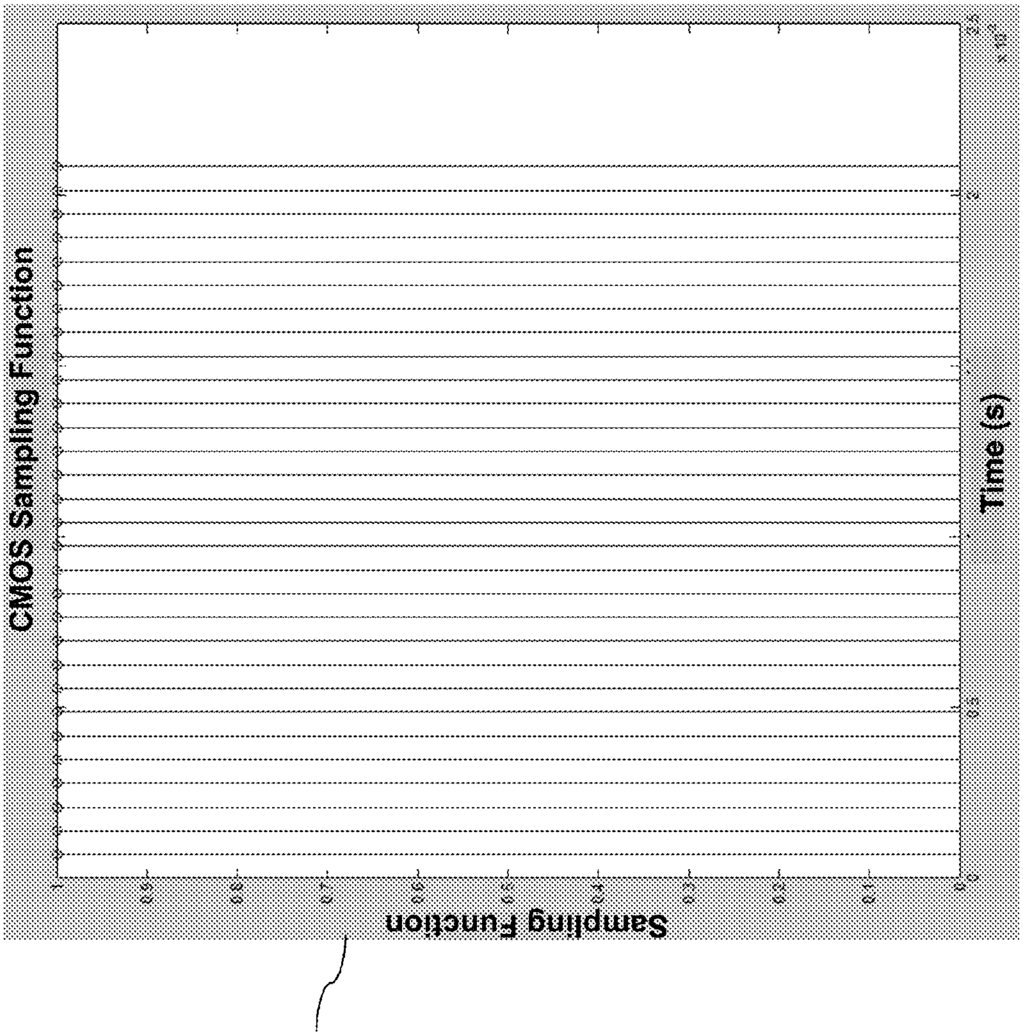
FIG. 28 is a model of the CMOS sampling function for a rolling shutter, according to some embodiments of the present disclosure.
Figure 29:
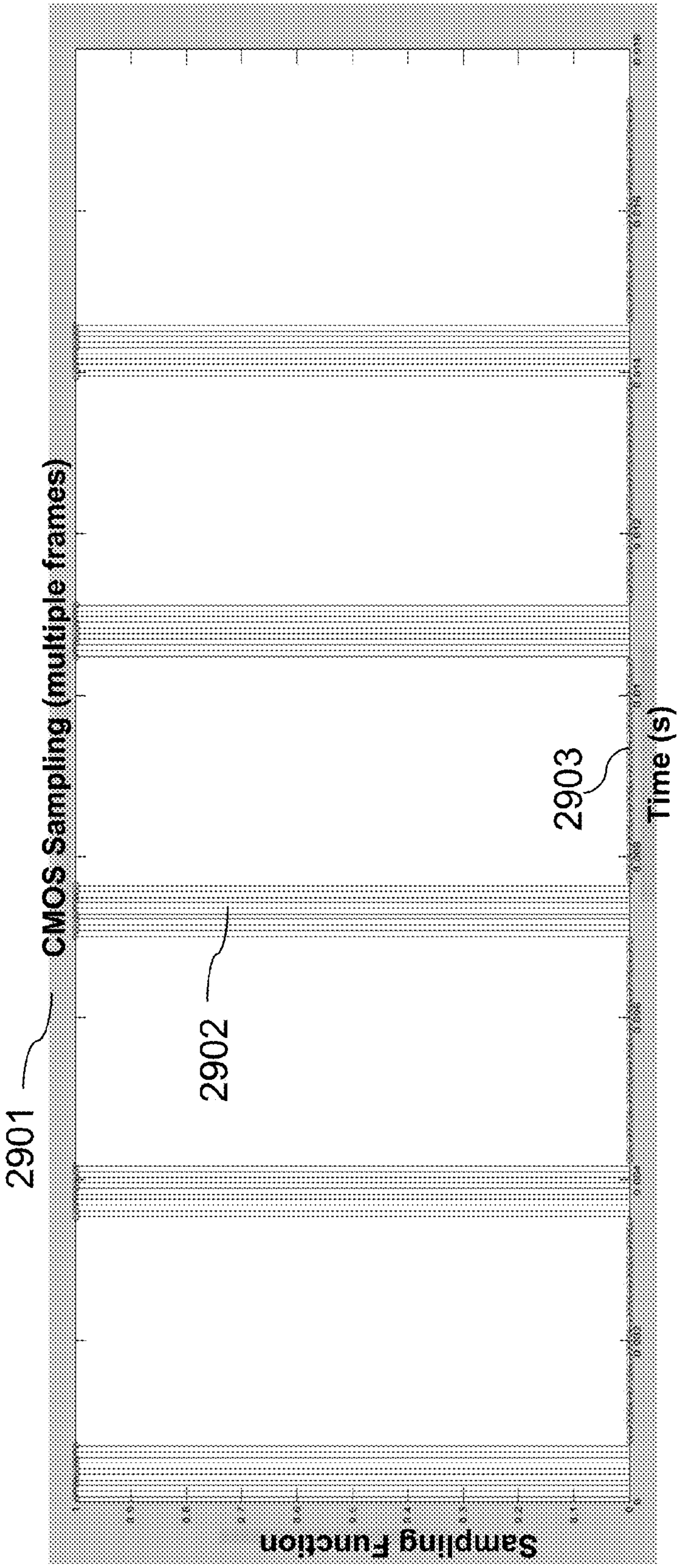
FIG. 29 is a plot of a sampling function for a CMOS rolling shutter over multiple frames, according to some embodiments of the present disclosure.

FIG. 28 is a representation of a discrete time domain signal model 2801 for representing how a rolling shutter on an image sensor samples the incoming light pulses 2601. The rolling shutter is modeled as an impulse train, containing a sequence of the Dirac Delta functions (otherwise known as a Dirac comb). Each impulse is separated by an interval, T, which corresponds to the speed of the rolling shutter commonly found in most CMOS image sensors. The interval T varies from device to device which causes the bands on scenes illuminated by DPR modulated signals to vary in size. The mobile device 103 needs to account for hardware dependent factors (rolling shutter speed) to properly determine the DPR tone. FIG. 29 contains a discrete time representation 2901 of the rolling shutter sampling functionality over multiple frames.

Because rolling shutter speeds are typically faster than frame rates, DPR demodulation on current imaging technology is capable of much higher data rates than modulation schemes that sample on a per frame basis. In a DPR modulated system using a 640×480 pixel image sensor, the sensor would capture 480 samples per frame (represented as 480 consecutive delta functions in sensor model 2801). A demodulation scheme using a global shutter would only be capable of taking one sample per frame. This is a key advantage for indoor positioning using beacon based broadcasting schemes because the time-to-first-fix is orders of magnitude faster than competing technology, which can take several seconds to receive a signal. For example, consider a typical mobile device 103 camera which samples at 30 frames per second (FPS). Using DPR demodulation, time-to-first-fix can be achieved with as little as a single frame, or 1/30 of a second, versus 1 second for a demodulation scheme that samples on a per frame basis. This compares to a time-to-first-fix of up to 65 seconds for GPS, 30 seconds for assisted GPS, and 5-10 seconds for WiFi positioning.

This order of magnitude improvement opens the door for applications in which latency for time-to-first-fix must be minimized. Furthermore, computation for DPR demodulation can be performed on the mobile device itself, versus the server side processing required for WiFi fingerprinting algorithms. In a mobile environment, where connection to a network is not guaranteed, client side processing provides a major advantage. In the future, it is expected that image sensors will have much higher frame rates. In this scenario, DPR demodulation can be adjusted to sample on a per-frame basis, instead of a rolling shutter basis. The key principle is that the demodulator can be adjusted in software, allowing future mobile devices to tune their receiving characteristics to receive DPR signals. The software adjustments that need to be applied are the subject of the following sections.

Configuring a Device for DPR Demodulation

Figure 30:
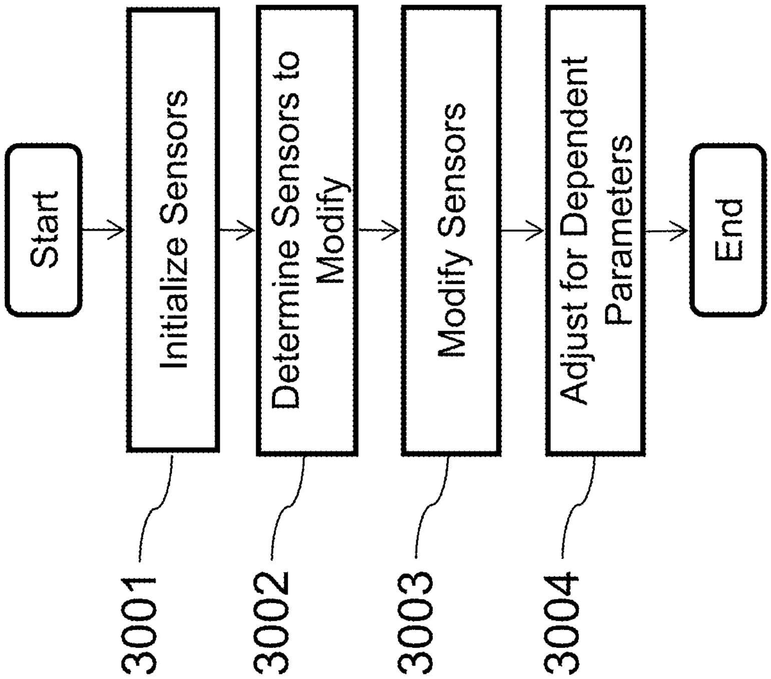
FIG. 30 is a high level flow chart of an algorithm for configuring a mobile device to receive DPR modulated signals, according to some embodiments of the present disclosure.

In order to prepare a mobile device 103 to receive the modulated DPR signals 2105, the device must first be configured. This is to counteract the flicker mitigation algorithms typically applied in mobile device image sensors. FIG. 30 describes the method by which mobile device 103 is configured to receive DPR modulated signals. First, the initialize sensors 3001 function initializes and activates the available sensors capable of receiving data. For typical modern mobile devices these would include both the front and rear facing cameras. Determine sensors to modify 3002 then decides which sensors need to be modified. A number of possible factors determine whether or not a particular sensor should be initialized then modified, including power consumption, accuracy, time since last reading, environmental conditions, required location accuracy, and battery state.

Modify sensors 3003 then passes a list of the appropriate sensors which need to be modified to a function which has additional information about the mobile device 103 and adjusts the demodulation scheme for device specific limitations 3004. In the case of using an embedded mobile device 103 camera to demodulate DPR signals, possible sensor parameters to modify include exposure, focus, saturation, white balance, zoom, contrast, brightness, gain, sharpness, ISO, resolution, image quality, scene selection, and metering mode. As part of the modification step 3003, sensor parameters such as exposure, white-balance, and focus are locked to prevent further adjustments.

After the sensors are modified 3003, specific hardware limitations are adjusted for in the demodulation scheme by using a device profile. The most important of these is the rolling shutter speed. Because different models of mobile device 103 will, in general, have different camera sensors, the line width of the DPR tone measure on an image sensor will vary across hardware platforms for a fixed frequency. For this reason, it is necessary to adjust the stripe width one is looking for depending on the specific characteristics of the device. In the Fourier Techniques discussed later on in the application, modifying the stripe width corresponds to modifying the sampling frequency of Dirac Comb 2801.

There are a number of challenges associated with controlling the camera parameters to optimize for DPR demodulation. One challenge is overriding the automatic parameter adjustments that mobile operating systems typically provide as part of their camera application programming interfaces (APIs). In the case of an embedded image sensor, the sensor settings are adjusted automatically depending on factors such as but not limited to ambient light conditions, areas of focus, distance from objects, and predetermined scene selection modes. For instance, when taking a picture with an image sensor, if the scene is dark then the exposure time is automatically increased. When taking picture of a scene mode with fast moving objects, the exposure time is usually decreased.

When using an image sensor for DPR demodulation, these automatic adjustments can introduce noise into the signal, causing higher error rates. Specifically in the case of exposure, longer exposure times correspond to lower data rates, which correspond to a decreased amount of available light IDs 901. At the edge case, if the exposure time is sufficiently long, then the sampling rate will drop so low that DPR demodulation becomes extremely challenging as the signal is severely under sampled. Furthermore, if the camera is constantly adjusting, then the performance of background subtraction (discussed later), which isolates the moving stripes from the rest of the picture, will be significantly impaired. This is because the automatic adjustments are constantly changing the pixel values. In order to successfully transmit DPR signals, these automatic adjustments need to be accounted for.

Practically speaking, many mobile device 103 APIs do not allow for the modification of sensor parameters in the top level software. The proposed method in FIG. 31 describes a method for working around the provided APIs to control the exposure. Current API's do not allow for manual exposure control, so instead of manually setting the exposure, we present an algorithm that exploits the metering functionality to minimize the exposure time.

Figure 31:
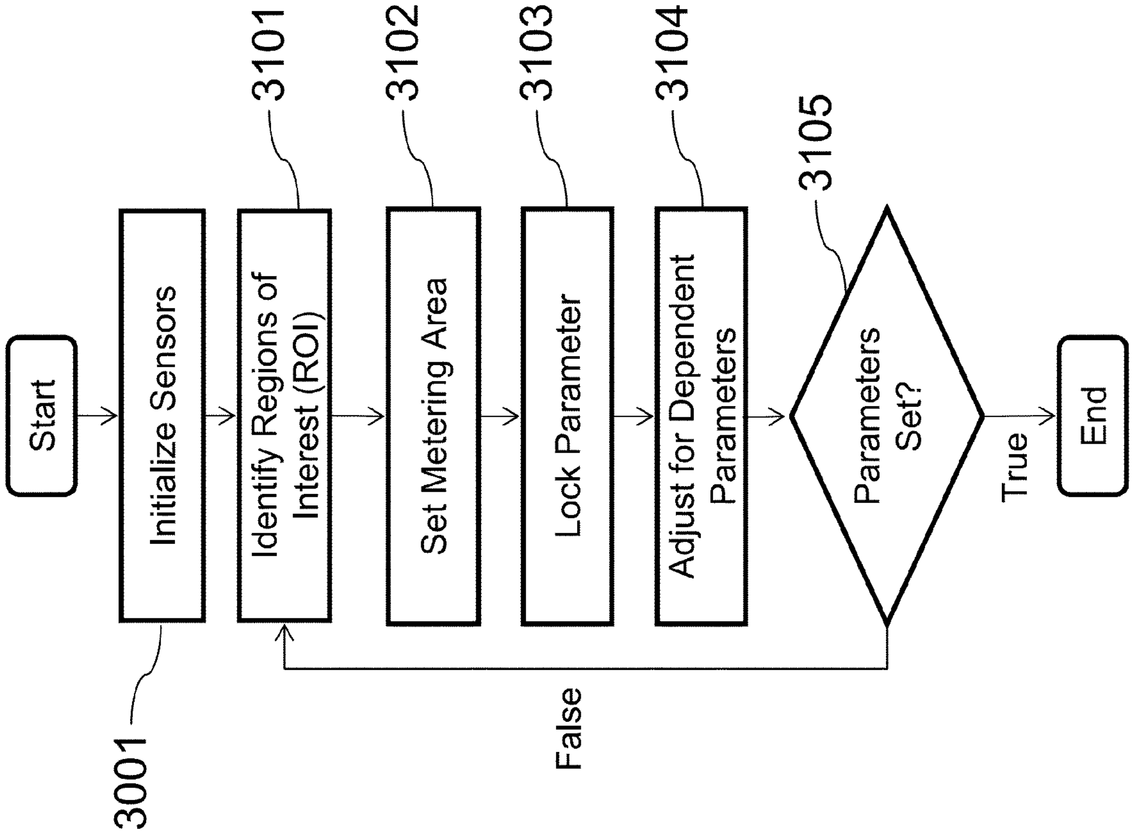
FIG. 31 is a high level flow chart of an algorithm for minimizing and locking camera settings using existing mobile device application programming interfaces (APIs), according to some embodiments of the present disclosure.

FIG. 31 contains a process for modifying the various sensor parameters contained in a mobile device 103 in a way that overcomes the limitations imposed by current camera APIs. In the algorithm, the first step is to initialize the required sensors 3001. For the case of an image sensor, this involves setting the frame rate, data format, encoding scheme, and color space for the required sensors. After the image sensors have been initialized 3001, the algorithm searches for regions of interest 3101. In the case of setting the exposure using metering, these regions of interest 3101 would be the brightest regions of the image. Set metering area 3102 then sets the metering area to the brightest portion, effectively "tricking" the mobile device 103 into lowering the exposure time. Lock parameter 3103 then locks this exposure time to prevent the auto adjustment feature of the camera from overriding the manual setting. Next, adjust for hardware dependent parameters 3104 accesses a lookup table and adjusts the demodulation algorithm based on hardware and software differences. For the case of an image sensor, one example of this is changing the sampling time based on the rolling shutter speed of the device. This rolling shutter speed can either be loaded from a lookup table beforehand (using predetermined values) or measured on the fly. Each device only needs to measure its rolling shutter speed once per image sensor. Once parameters set? 3105 is satisfied the algorithm ends; otherwise, it returns to identify regions of interest 3101.

The method of exploiting the metering area on a mobile device 103 can be used to optimize many of the required parameters in addition to the exposure, including white balance, contrast, saturation, ISO, gain, zoom, contrast, brightness, sharpness, resolution, image quality, and scene selection. Furthermore, these parameters could already be known beforehand, as each mobile device 103 will have its own "device profile" containing the optimal camera settings. This profile could be loaded client side on the device, or sent over a server. Note that although the method of using the metering area to control the exposure can improve the performance of DPR demodulation, it is not strictly necessary. Simply locking the exposure 3103 is often sufficient to prevent the automatic camera adjustments from filtering out the DPR signals.

Advanced Techniques for Decoding Information in DPR Modulated Signals

Figure 32:
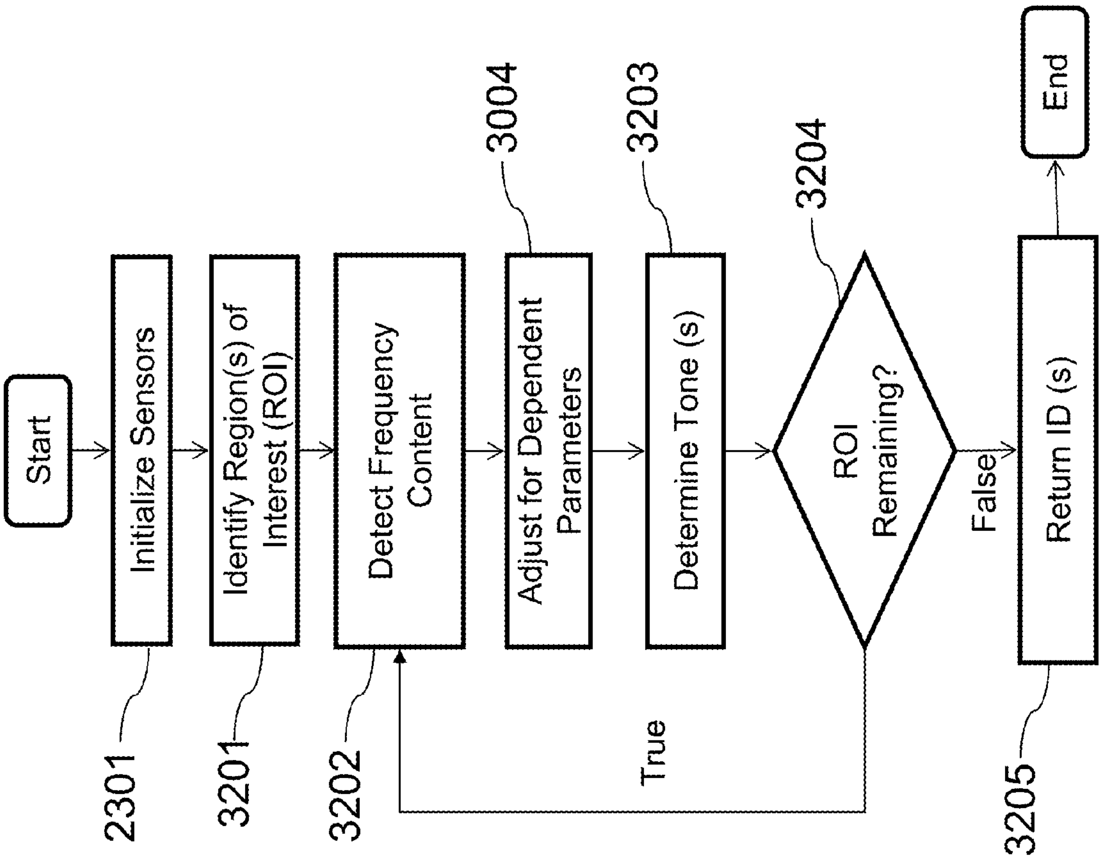
FIG. 32 is a high level flow chart of an algorithm for receiving DPR signals on an image sensor, according to some embodiments of the present disclosure.

Once the sensors have been initialized 3001 and parameters have been set 3104, FIG. 32 describes a process for decoding the information contained inside a DPR modulated signal. Identify regions 3201 is used to separate different regions on the image illuminated by DPR signals. At the base level, the region of interest is the entire image. However, when one or more light sources 101 are present, there exists an opportunity to receive multiple DPR signals simultaneously. In this scenario, the sensor effectively acts as a multiple antenna receiver. Such multiple antenna systems, more generally referred to as multiple-input multiple-output (MIMO), are widely used in the wireless networking space. This is an example of spatial multiplexing, where wireless channels are allocated in space as opposed to time or frequency. The implications of MIMO for DPR demodulation in a beacon based light positioning system is that frequencies can be re-used in a space without worry of interference. When a mobile phone user receives DPR modulated signals on a photodiode array (such as an image sensor, or any imaging technology that contains multiple spatially separated sensors), the DPR signals will each appear at different locations on the sensor. Each region 3201 of the image can then be processed independently, in the same way that each mobile phone user in a cell network only connects to the cell they are closest to.

This works in a way analogous to cellular phone networks. With cellular networks, mobile phone users only communicate with cellular towers that are close to them. This allows multiple mobile phone users to share the same frequency, provided they are all on different cells. In DPR modulation, each light acts as its own cell transmitting unique frequencies. However, different lights can also use the same frequency provided that they are far enough apart. Re-using the same frequencies in different space allows for greater system scalability, since lighting sources 101 can be installed at random without requiring the installer to worry about frequency allocation.

After sensors have been initialized 3001, and regions of interest 3201 have been identified, detect frequency content 3202 identifies the presence of DPR tones from the sensor data. We describe here multiple methods for extracting the frequency content from a DPR signal. One possibility is to use line detection algorithms to identify the pixel width of the stripes, which directly corresponds to the transmitted frequency. This stripe width is then used to access a lookup table that associates width and transmitted frequency and determines the transmitted tones. Possible methods for detecting lines include Canny edge detection, Hough Transforms, Sobel operators, differentials, Prewitt operators, and Roberts Cross detectors, all of which are well developed algorithms, known to those of skill in the art. Adjust for dependent parameters 3004 then modifies the appropriate camera sensors for optimal DPR demodulation. In the case of line detection, this corresponds to a linear adjustment for the line width lookup table. Determine tones 3203 uses the adjusted line width to determine the DPR tone sent. This process is performed for each region on the image, until there are no more regions 3204 remaining A data structure containing all the regions, with their associated identifiers, is then returned 3205.

Figure 33:
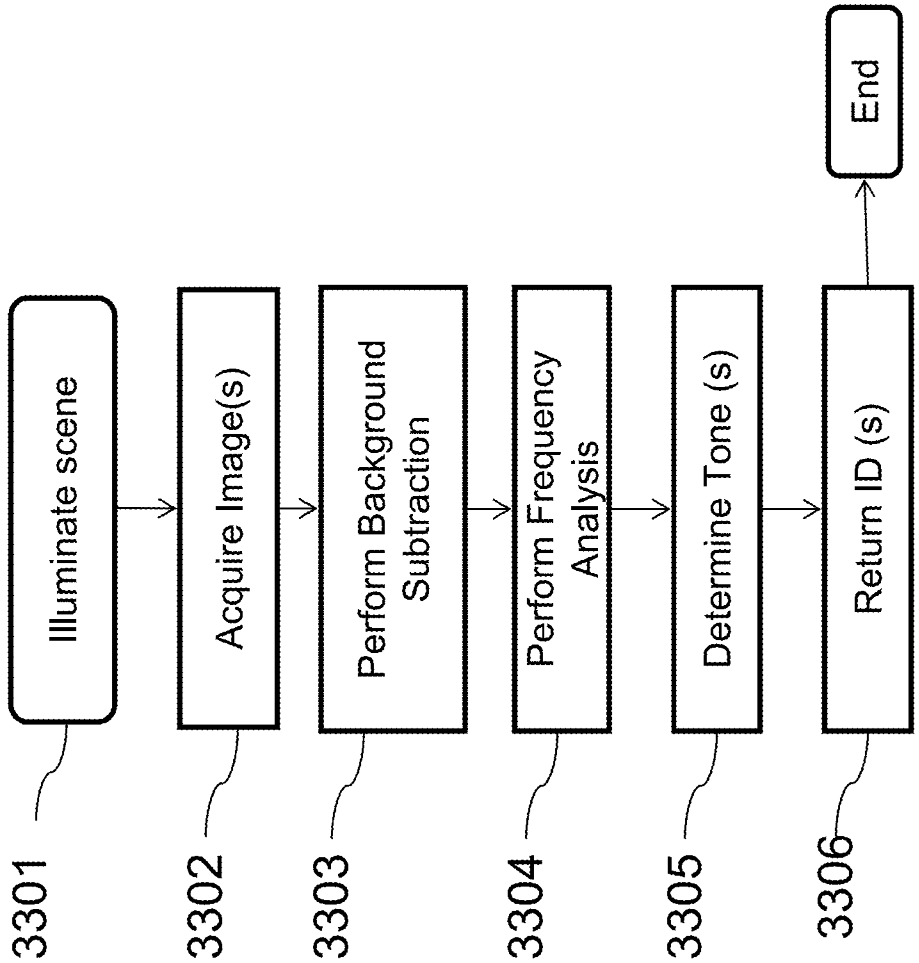
FIG. 33 is a high level flow chart of an algorithm for determining tones embedded within a DPR illuminated area, according to some embodiments of the present disclosure.

An additional method for performing DPR demodulation is described in FIG. 33. One or more light sources 101 illuminates a scene 3301. When the image sensor on mobile device 103 acquires a sequence of images 3302, the brightness of any given pixel depends on both the details of the scene as well as the illumination. In this context, "scene" refers to the area within view of the camera. The scene dependence means that pixels in the same row of the image will not all have the same brightness, and the relative brightness of different image rows is not solely dependent on the modulated illumination 3301. If one were to take the Fourier transform of such an image, both the frequency content of the illumination, as well as the frequency content of the underlying scene, will be present.

In order to recover the frequency content of the modulated illumination independently of the scene, the contribution of the scene may be removed using a background subtraction algorithm 3303. The 'background' is the image that would result from un-modulated illumination as opposed to the effects of modulated illumination 3301. Subtracting the background from an image leaves only the effects of illumination modulation. One possible implementation of a background subtraction method uses a video sequence. If a video of a scene illuminated with modulated light is recorded, the light and dark bands may appear at different locations in each frame. For any modulation frequency that is not an exact multiple of the video frame rate, there will be a resulting beat frequency between the video frame frequency and the illumination modulation frequency. The illumination signal will be in a different part of its period at the beginning of each frame, and the light and dark bands will appear to be shifted between video frames (i.e. the bands will appear to move up or down across the scene while the video is played). Although this algorithm is described with the use of a video sequence, other embodiments may perform background subtraction using still images.

Because the bands move between video frames, the average effect of the bands on any individual pixel value will be the same (assuming that in a long enough video each pixel is equally likely to be in a light or dark band in any given frame). If all the video frames are averaged, the effects of the bands (due to the illumination modulation) will be reduced to a constant value applied to each pixel location. If the video is of a motionless scene, this means that averaging the video frames will remove the effect of the bands and reveal only the underlying scene (plus a constant value due to the averaged bands). This underlying scene (the background) may be subtracted from each frame of the video to remove the effects of the scene and leave only the effects of illumination modulation 3301.

Figure 34:
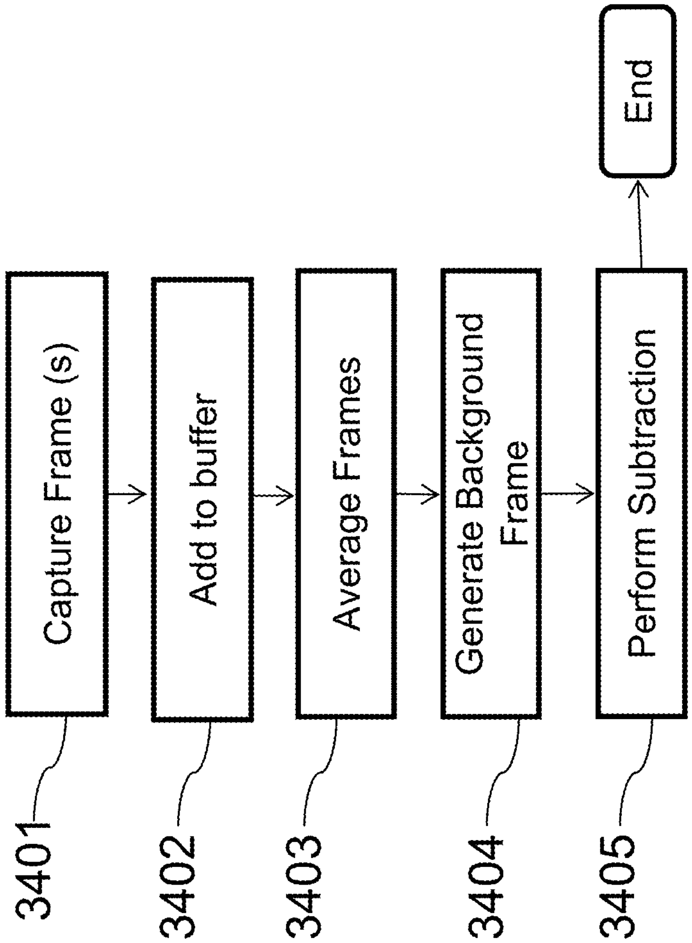
FIG. 34 is a high level flow chart of an algorithm for performing background subtraction on images gathered from a DPR illuminated scene, according to some embodiments of the present disclosure.

FIG. 34 contains an implementation of a possible background subtraction algorithm 3304. A frame buffer 3402 accumulates video frames 3401. The size of this buffer can vary, depending on the memory capacity of mobile device 103 and the required time to first fix. Frame averaging 3403 computes the average based on the frames in the buffer 3402. The average of these frames is used to generate background frame 2704. The background frame can be acquired using a number of different averaging techniques 3403, including a simple numerical average, a normalized average (where each frame is divided by the sum of all the frames), Gaussian averaging, or by doing a frame difference between subsequent frames. A frame difference simply subtracts subsequent frames from one another on a pixel-by-pixel basis.

Figure 35:
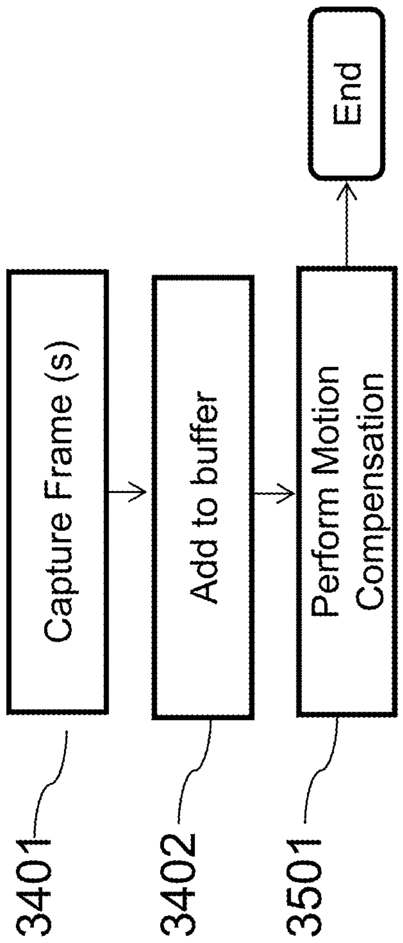
FIG. 35 is a high level flow chart of an algorithm for performing motion compensation on video frames when performing DPR demodulation, according to some embodiments of the present disclosure.

For video of a scene with motion, simple averaging of video frames will not yield the underlying scene background. FIG. 35 describes a technique for dealing with motion between frames, which is a likely scenario when demodulating DPR signals on mobile device 103. Motion compensation 3501 is necessary to best determine the underlying scene. By determining the motion between video frames (for example, shifting or rotation of the whole scene due to camera movement), each video frame may be shifted or transformed such that it overlies the previous frame as much as possible. After performing these compensatory transforms on each frame in motion compensation 3501, the video frames are averaged 3403 to get the scene background 3404. Phase correlation is one possible method of estimating global (i.e. the whole scene moves in the same way, as in the case of camera motion while recording video) translational motion between frames. The 2D Fourier transform of a shifted image will be the same as that of the original image, except that a phase shift will be introduced at each point. Normalizing the magnitude of the 2D Fourier transform and taking the inverse transform yields a 2D image with a peak offset from the center of the image. The offset of this peak is the same as the shift of the shifted image. Those skilled in the art will recognize that additional methods for motion compensation 3501 include Kernel Density Estimators, Mean-shift based estimation, and Eigenbackgrounds.

Figure 36:
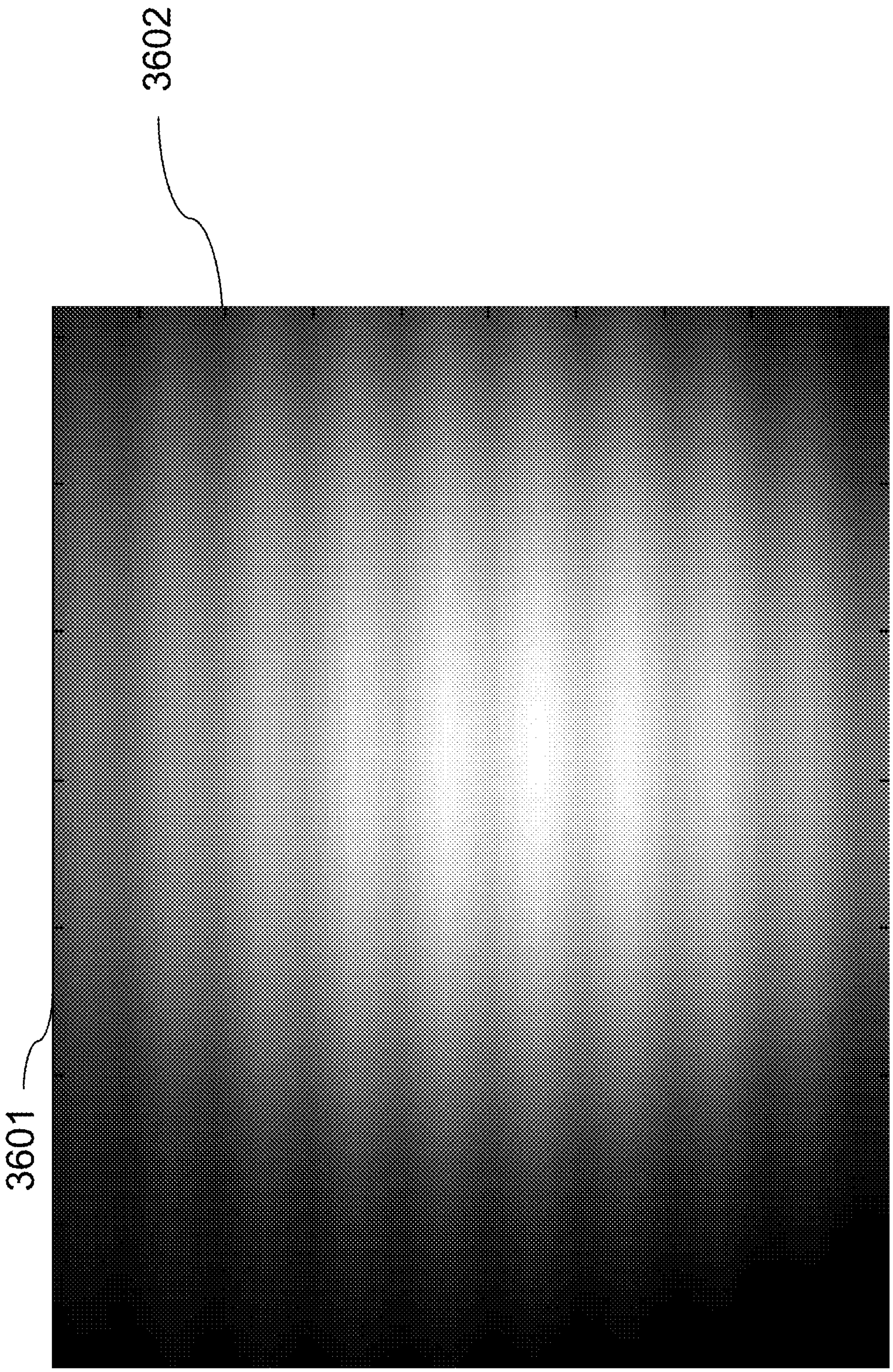
FIG. 36 is a photograph of a surface under illumination from DPR modulated signals, according to some embodiments of the present disclosure.

After removing the background scene, Fourier Analysis can be used to recover the DPR tone based on signals received from modulated light source 103. Specifics of this method are further described in FIG. 36-43. FIG. 36 contains a sample image 3601 of a surface illuminated by a light source undergoing DPR modulation. The image is being recorded from a mobile device using a rolling shutter CMOS camera. The stripes 3602 on the image are caused by the rolling shutter sampling function, which is modeled in by the sequence of Dirac Combs 2801 in FIG. 28.

Figure 37:
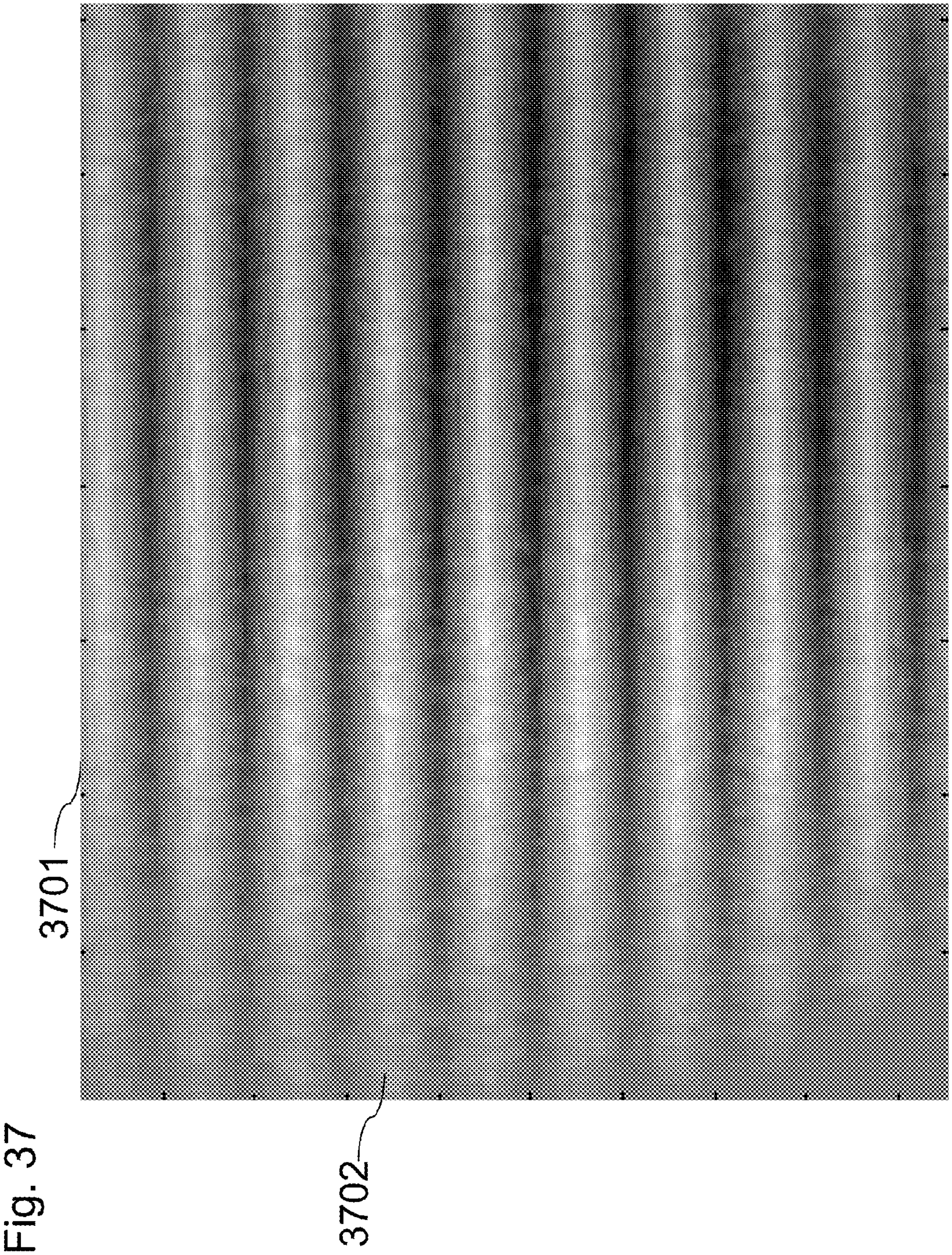
FIG. 37 is a post-processed image of a DPR modulated scene after performing background subtraction, according to some embodiments of the present disclosure.

FIG. 37 shows the result 3701 of performing background subtraction on the raw image data from FIG. 36. Background subtraction is used to extract the stripes from the raw image data. The result is an image of alternating black/white stripes that represents the discrete time-domain representation of the transmitted DPR signal. The stripes 3702 are much more pronounced than in the raw image data from FIG. 36 due to the improvement from background subtraction.

Figure 38:
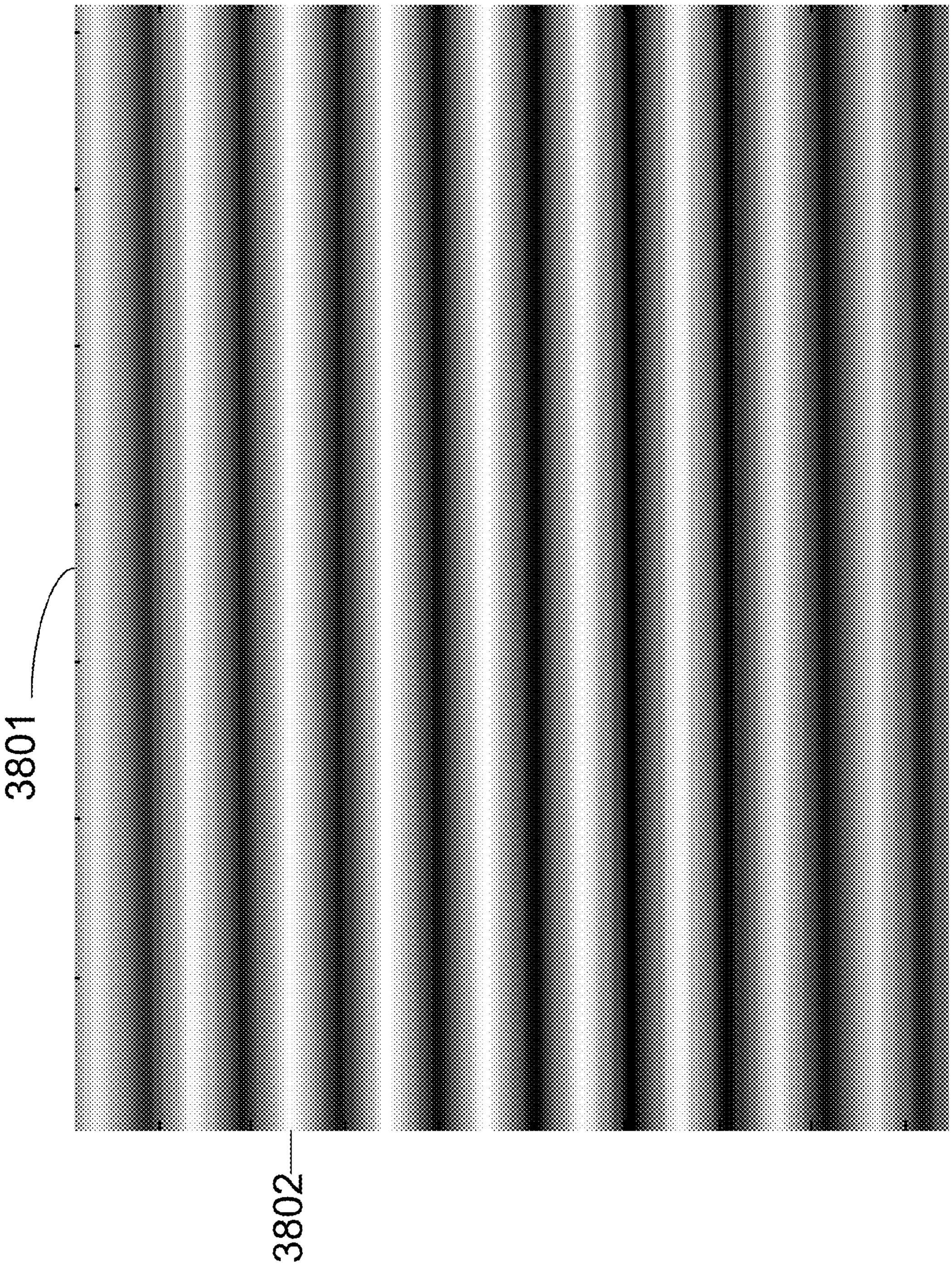
FIG. 38 is a post-processed image of a DPR modulated scene after row averaging, according to some embodiments of the present disclosure.

Illumination modulation affects each row of a video frame identically, but imperfect background subtraction may lead to non-identical pixel values across image rows. Taking the Fourier transform of row values along different image columns, then, may produce different illumination signal frequency content results. Because the true illumination signal frequency content is the same for the entire image, a technique to reconcile these different results may be employed. One possible method is to assign the average pixel value for any given row to each pixel in that row. This method takes into account the information from each pixel in the row, but by yielding uniform row values gives a single illumination signal frequency content result when taking the Fourier transform of row values along an image column. FIG. 38 displays the results of applying row averaging 3801 to the background subtracted image 3701. The stripes 3802 are much more visible as a result of the row averaging, and they are also more consistent across TOWS.

Figure 39:
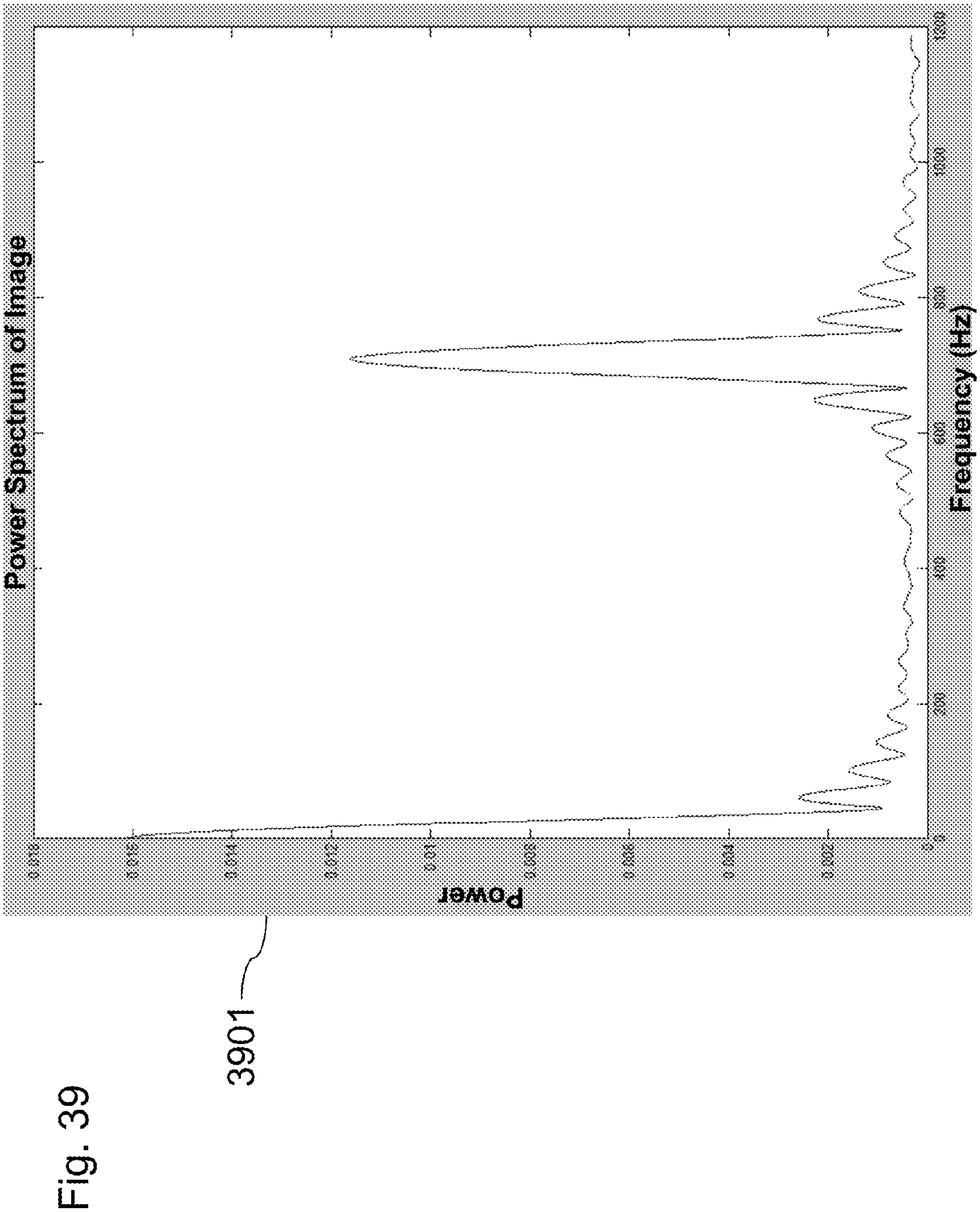
FIG. 39 is a plot of the 1-D spectral content of a DPR modulated surface, according to some embodiments of the present disclosure.

FIG. 39 shows the Fourier transform 3901 of the row averaged image 3801 from FIG. 38. There is a peak frequency at the DPR tone of 700 Hz, as well as a DC component at 0 Hz. The peak frequency is used to identify the sequence of tones, and thus the transmitted identifier.

Figure 40:
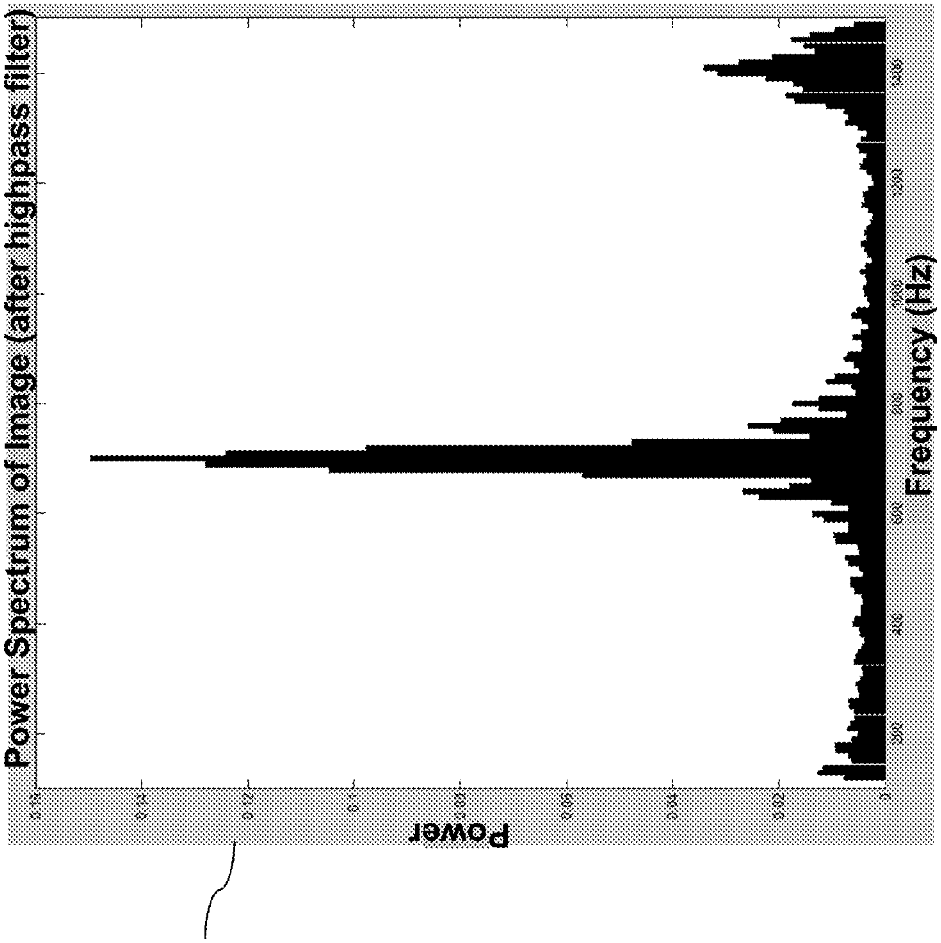
FIG. 40 is a plot of the 1-D spectral content of a DPR modulated surface after removing DC bias, according to some embodiments of the present disclosure.

FIG. 40 shows the Fourier transform 4001 from FIG. 39 after applying a high-pass filter. The DC component of the signal is removed, which allows a peak frequency detector to move to detection at the DPR tone frequency.

Figure 41:
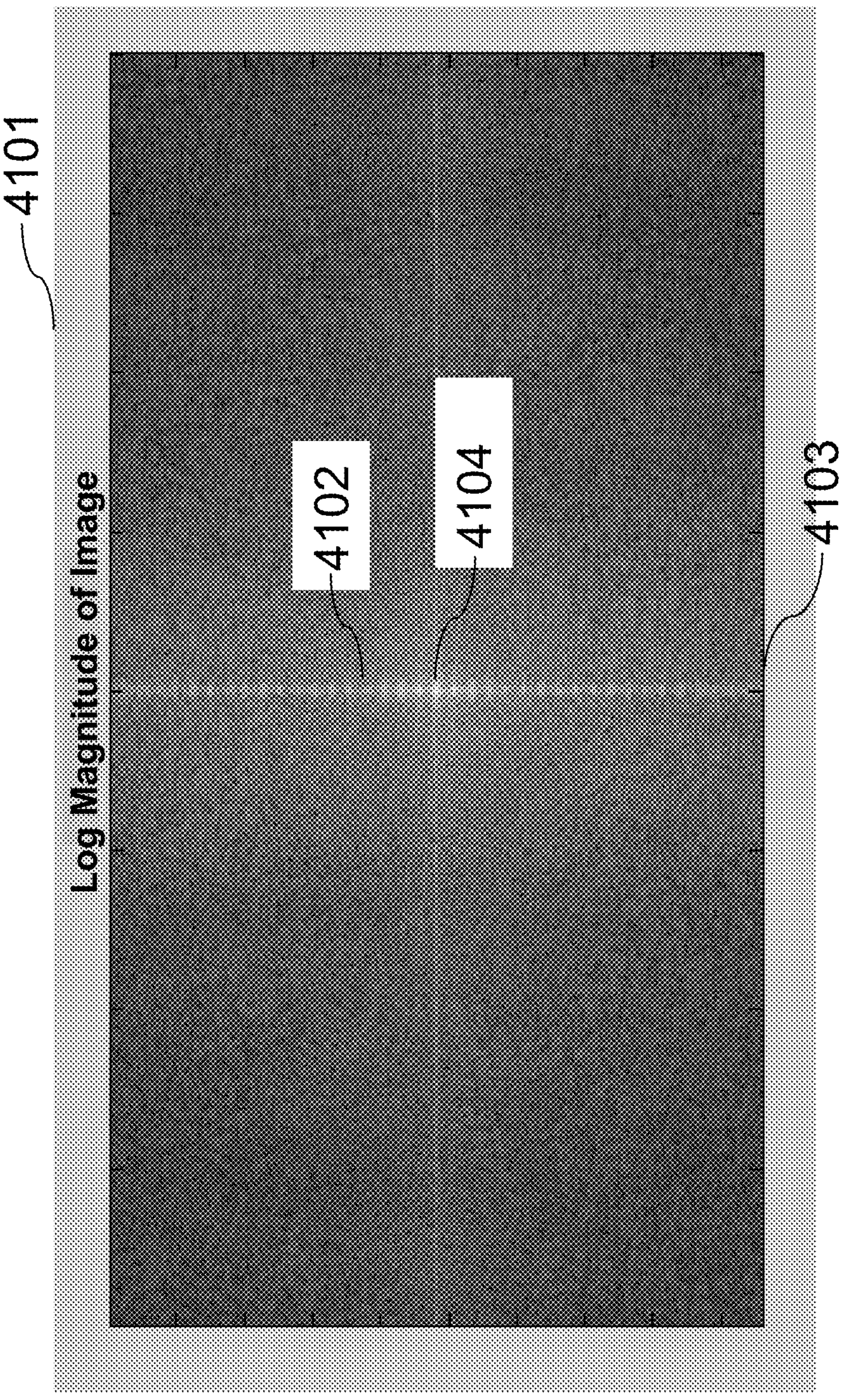
FIG. 41 is a 2-D FFT of a DPR modulated surface, according to some embodiments of the present disclosure.

FIG. 41 shows a 2-D Fast Fourier Transform 4101 of the post processed DPR modulated signal data 3701. In comparison to the 1-D Fourier analysis performed in FIGS. 38-40, 2-D Fourier analysis of the DPR modulated signal 3601 could also be performed. 2-D Fourier Analysis is a popular and widely used technique for image analysis. Because there are a number of software libraries that are highly optimized for performing multidimensional FFTs, including OpenCV, multidimensional Fourier analysis is a viable alternative to the 1-D analysis. The DPR tones 4102 can be easily seen across the vertical axis 4103 of the 2-D FFT. Brighter areas on the FFT image 4101 correspond to areas on the image with higher spectral content. A peak can be seen at the origin 4104, which corresponds to the DC component of the DPR signal.

Figure 42:
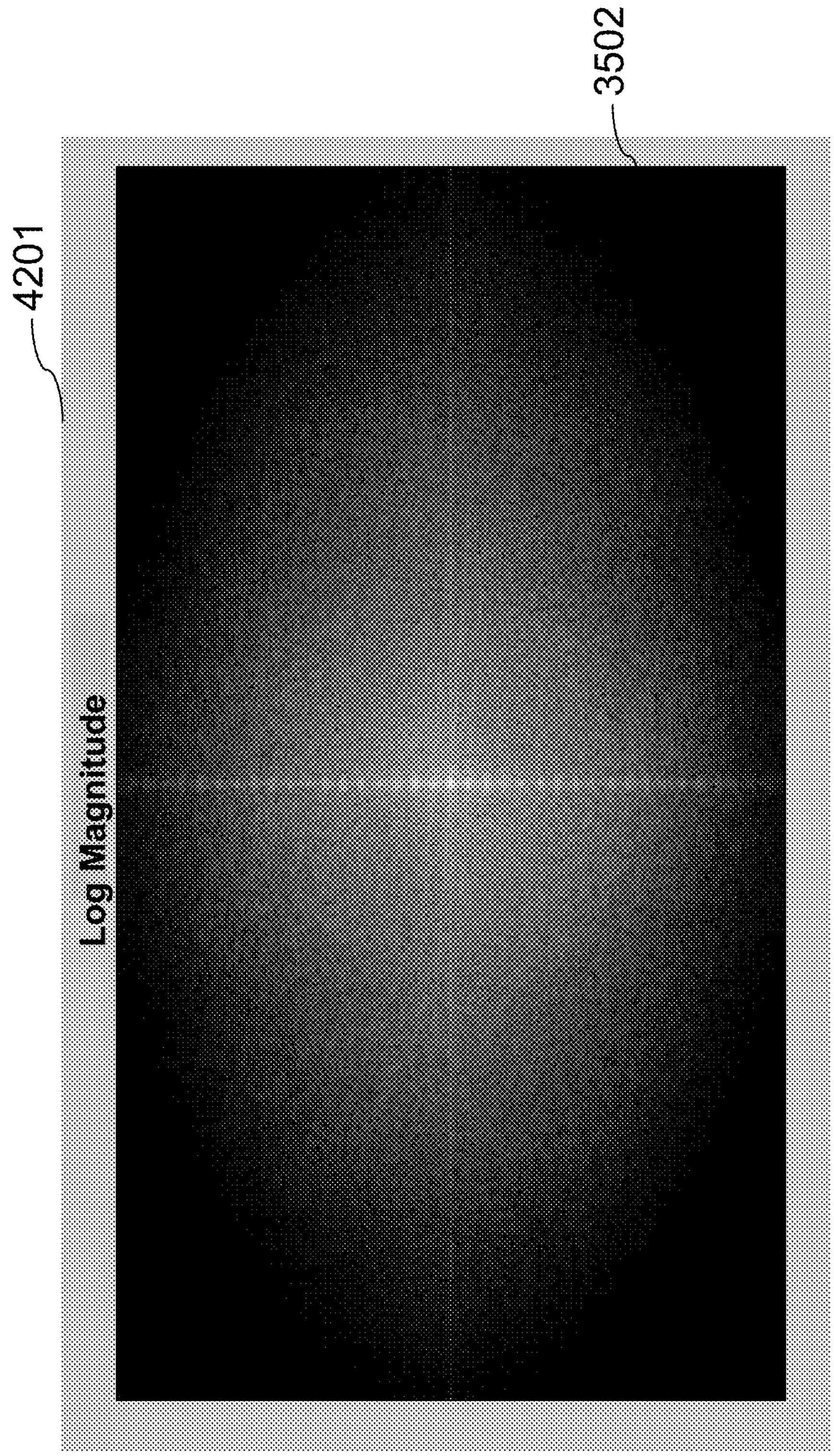
FIG. 42 is a 2-D FFT of a DPR modulated surface after applying a low pass filter, according to some embodiments of the present disclosure.

FIG. 42 shows a low-pass filtered version 4201 of the 2-D FFT 4101. The filtered image 4201 contains dark areas 3502 at the higher frequencies on the image. The low pass filter rejects the higher frequencies. This is a key component of successful DPR demodulation. As discussed previously, DPR modulation relies on transmitting digital signals at different frequencies. When using Fourier analysis on these signals, higher frequency harmonics appear, in particular at higher duty cycles. These higher frequency components act as noise in the signal, so removing them with filtered image 4201 is one technique for recovering the transmitted tones.

Figure 43:
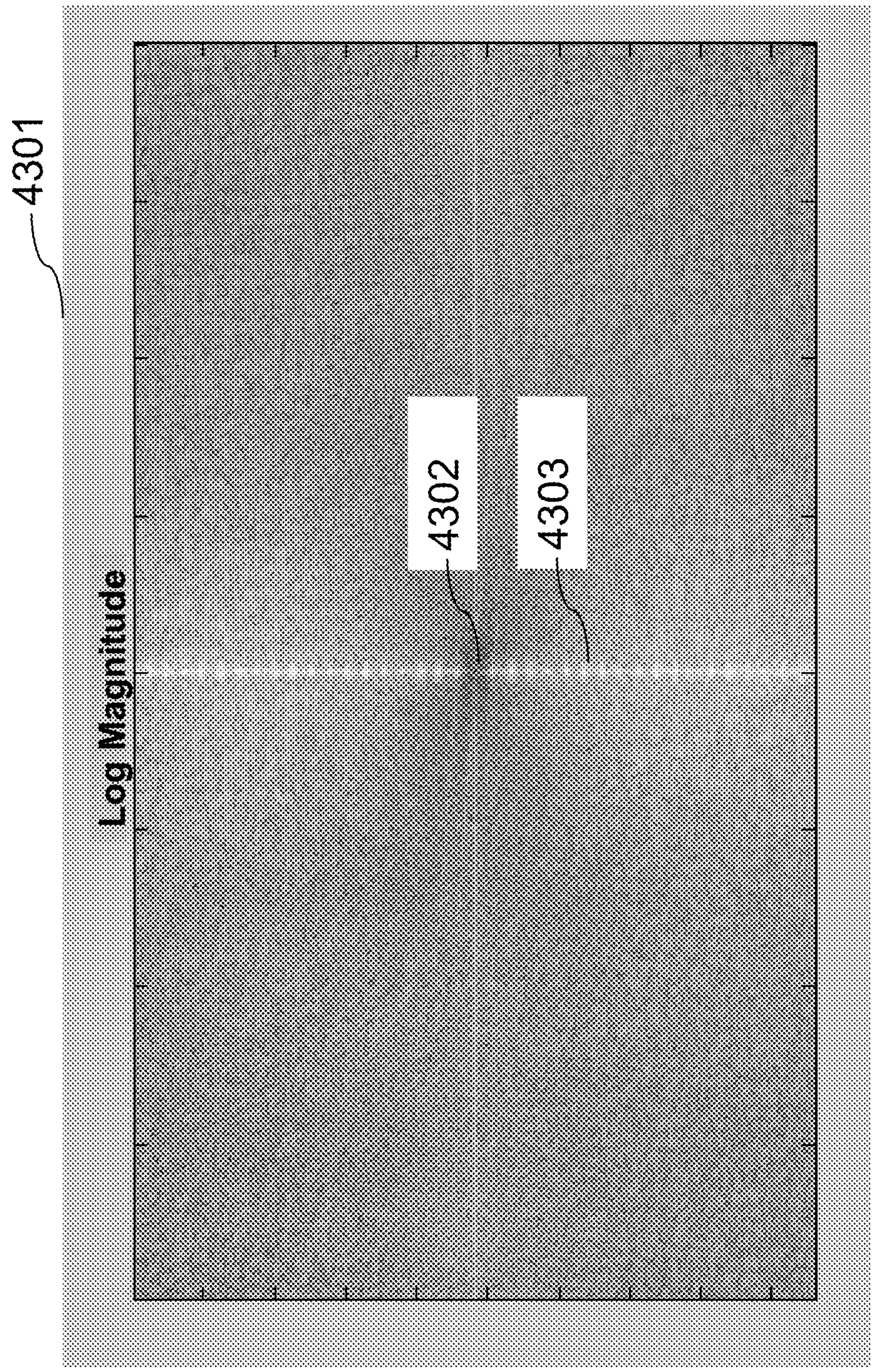
FIG. 43 is a 2-D FFT of a DPR modulated surface after applying a high pass filter, according to some embodiments of the present disclosure.

When performing spectral analysis in the case of a 1-D FFT 3901 in FIG. 39, it was necessary to remove the DC component of the DPR signal. PWM signals 1901-1903 will contain a significant DC component, which needs to be filtered before moving on to extract the transmitted DPR tone. FIG. 43 shows a high-pass filtered version 4301 of the 2-D FFT 4101. The dark area 4302 at DC demonstrates the result of the high-pass filter, which rejects the DC noise component. The higher frequency bands 4303 are still contained in the signal, allowing the demodulator to determine the peak frequency.

The techniques and methods disclosed for use in light based positioning systems can be used with a variety of camera equipped mobile or stationary devices, such as: mobile phones, tablet computers, netbooks, laptops, desktops, or custom designed hardware. Further, the scope of the present invention is not limited to the above described embodiments, but rather is defined by the appended claims. These claims represent modifications and improvements to what has been described.

We claim:

1. A dimmable beacon light source for a light based positioning system comprising:

a dimmer control switch configured to generate a dimmer signal having a desired light output level;

a dimmable driver for controlling the light output of the light source; and a modulator for receiving the dimmer signal from the dimmer control switch, generating a digital pulse recognition signal by controlling the frequency of the dimmer signal to a desired frequency value, and transmitting the digital pulse recognition signal to the dimmable driver to drive the light output of the light source, wherein the modulator comprises:

a digital pulse recognition tone generator for receiving binary data from an information source and converting the binary data into one or more digital pulse recognition tones representing the desired frequency value; and a waveform generator for using the one or more digital pulse recognition tones and the dimmer signal to generate the digital pulse recognition signal.

2. The light source of claim 1, wherein the digital pulse recognition signal comprises a pulse width modulated signal.

3. The light source of claim 1, wherein the digital pulse recognition signal has a duty cycle based on the dimmer signal.

4. The light source of claim 1, wherein the frequency of the digital pulse recognition signal is based on the one or more digital pulse recognition tones.

5. The light source of claim 1, wherein the one or more digital pulse recognition tones are chosen from a set of possible digital pulse recognition tones and the set of possible digital pulse recognition tones comprises a minimum frequency, a maximum frequency, and are separated by a minimum frequency step interval.

6. The light source of claim 5 wherein the minimum frequency, the maximum frequency, and the minimum frequency step interval are chosen based on the frequency response of the light source and the sampling time of a target imaging sensor.

7. The light source of claim 1, wherein the digital pulse recognition tone generator comprises an encoder for mapping the binary data to one or more digital pulse recognition tones.

8. The light source of claim 1, wherein the one or more digital pulse recognition tones are chosen based on pre-computed mappings between the binary data and the digital pulse recognition tones.

9. The light source of claim 1, wherein the one or more digital pulse recognition tones are computed based on the binary data after receipt of the binary data from the information source.

10. The light source of claim 1 wherein the waveform generator combines the one or more digital pulse recognition tones with a periodic symbol created by a symbol creator to generate the digital pulse recognition signal.

11. The light source of claim 10, wherein the symbol created by the symbol creator is selected from a set of symbols by a symbol selector.

12. The light source of claim 11, wherein the set of symbols comprises a saw tooth wave, a sine wave, a square wave, and a square wave with a DC offset.

13. The light source of claim 1, wherein the digital pulse recognition signal has an average output determined by the dimmer signal.

14. The light source of claim 1, wherein the digital pulse recognition signal comprises a hard-coded average output.

15. The light source of claim 1, wherein the dimmable driver comprises the modulator.

16. The light source of claim 1, wherein the dimmable driver converts the digital pulse recognition signal to a pulse width modulated signal to control the output of the light source.

17. The light source of claim 1, wherein the digital pulse recognition signal has a pulse width causing the light output to be substantially the same as the desired light output of the dimmer signal.

18. The light source of claim 1, wherein the dimmer signal is generated by a triac dimmer.

19. The light source of claim 1, wherein the binary data comprises an arbitrary identifier for the light source.

20. The light source of claim 1, wherein the modulator sends the digital pulse recognition signal to the dimmable driver using an override input of the dimmable driver.

21. The light source of claim 20, wherein the dimmable driver receives and ignores the dimmer signal based on receiving the digital pulse recognition signal using the override input of the dimmable driver.

22. The light source of claim 1, wherein the light output of the light source is emitted by a light-emitting diode (LED).

* * * * *